US012575212B2

(12) United States Patent
Kamakura et al.

(10) Patent No.: US 12,575,212 B2
(45) Date of Patent: Mar. 10, 2026

(54) RADIATION DETECTOR AND RADIATION DETECTOR ARRAY

(71) Applicant: HAMAMATSU PHOTONICS K.K., Hamamatsu (JP)

(72) Inventors: Shogo Kamakura, Hamamatsu (JP); Hayato Nishimiya, Hamamatsu (JP); Shintaro Kamada, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 151 days.

(21) Appl. No.: 18/693,211

(22) PCT Filed: Aug. 30, 2022

(86) PCT No.: PCT/JP2022/032645
§ 371 (c)(1),
(2) Date: Mar. 19, 2024

(87) PCT Pub. No.: WO2023/047899
PCT Pub. Date: Mar. 30, 2023

(65) Prior Publication Data
US 2024/0405052 A1 Dec. 5, 2024

(30) Foreign Application Priority Data
Sep. 22, 2021 (JP) ................................. 2021-154551

(51) Int. Cl.
| | |
|---|---|
| *G01T 1/20* | (2006.01) |
| *H10F 39/00* | (2025.01) |
| *H10F 39/18* | (2025.01) |

(52) U.S. Cl.
CPC ........ *H10F 39/811* (2025.01); *G01T 1/20188* (2020.05); *H10F 39/1898* (2025.01); *H10F 39/8067* (2025.01)

(58) Field of Classification Search
CPC ............... H10F 39/811; H10F 39/1898; H10F 39/8067; H10F 30/225; H10F 77/40; G01T 1/20188; G01T 1/2002; G01T 1/20187
See application file for complete search history.

(56) References Cited

U.S. PATENT DOCUMENTS

| | | | |
|---|---|---|---|
| 2004/0227091 A1 | 11/2004 | LeBlanc et al. | |
| 2008/0156993 A1* | 7/2008 | Weinberg | .............. G01T 1/1615 |
| | | | 250/370.06 |

(Continued)

FOREIGN PATENT DOCUMENTS

| | | |
|---|---|---|
| CN | 103592671 A | 2/2014 |
| DE | 102008063309 A1 | 7/2010 |

(Continued)

OTHER PUBLICATIONS

International Preliminary Report on Patentability mailed Apr. 4, 2024 for PCT/JP2022/032645.

(Continued)

*Primary Examiner* — Kiho Kim
(74) *Attorney, Agent, or Firm* — Faegre Drinker Biddle & Reath LLP

(57) ABSTRACT

A radiation detector includes: a scintillator including a pair of end surfaces opposing each other in a first direction and one side surface coupling the pair of end surfaces; and a semiconductor photodetector including a semiconductor substrate. A length of the scintillator in the first direction is longer than a length of the scintillator in a second direction orthogonal to the one side surface. A length of the one side surface in the first direction is longer than a width of the one side surface in a third direction orthogonal to the first direction and the second direction. The semiconductor substrate includes a photodetection region disposed in a first portion and a first electrode and a second electrode disposed (Continued)

in a second portion. The photodetection region includes a plurality of avalanche photodiodes arranged to operate in Geiger mode and a plurality of quenching resistors.

36 Claims, 28 Drawing Sheets

(56)                 References Cited

U.S. PATENT DOCUMENTS

| | | | | |
|---|---|---|---|---|
| 2009/0065704 A1* | 3/2009 | Heringa | ................ | H10F 30/225 |
| | | | | 257/438 |
| 2010/0282973 A1 | 11/2010 | Schulz | | |
| 2011/0116595 A1 | 5/2011 | Carmi et al. | | |
| 2013/0009067 A1 | 1/2013 | Schmand et al. | | |
| 2013/0270666 A1* | 10/2013 | Sato | ...................... | H10F 39/107 |
| | | | | 257/438 |
| 2014/0263975 A1* | 9/2014 | Nagano | ............... | H10F 39/1898 |
| | | | | 250/208.2 |
| 2016/0011323 A1 | 1/2016 | Sasaki et al. | | |
| 2016/0093648 A1* | 3/2016 | Mirzoyan | ............. | H10F 77/206 |
| | | | | 257/438 |
| 2016/0322417 A1* | 11/2016 | Nagano | ................. | H10F 39/803 |
| 2019/0172965 A1* | 6/2019 | Ishida | ................... | H10F 39/107 |
| 2021/0003721 A1 | 1/2021 | Loi et al. | | |

FOREIGN PATENT DOCUMENTS

| | | | |
|---|---|---|---|
| JP | 2004-340968 A | 12/2004 |
| JP | 2006-343247 A | 12/2006 |
| JP | 2011-510270 A | 3/2011 |
| JP | 2015-083956 A | 4/2015 |
| JP | 2018-528387 A | 9/2018 |
| RU | 2408110 C2 | 12/2010 |
| RU | 2567400 C2 | 11/2015 |
| WO | WO-2009/090570 A2 | 7/2009 |
| WO | WO-2017/097086 A1 | 6/2017 |

OTHER PUBLICATIONS

European Search Report issued on Oct. 2, 2025 in corresponding European patent application 22872655.0.
Office Action dated Oct. 7, 2025 from counterpart RU patent application No. 2024110608.

* cited by examiner

RADIATION DETECTOR AND RADIATION DETECTOR ARRAY

TECHNICAL FIELD

The present invention relates to a radiation detector and a radiation detector array.

BACKGROUND ART

Known radiation detectors include a scintillator having a hexahedron shape and a semiconductor photodetector including a semiconductor substrate disposed on the scintillator (for example, refer to Patent Literature 1). The scintillator generates a scintillation light in response to entry of radiation, and the semiconductor photodetector detects the generated scintillation light.

CITATION LIST

Patent Literature

Patent Literature 1: Japanese Unexamined Patent Publication No. 2015-83956

SUMMARY OF INVENTION

Technical Problem

Objects of first and second aspects of the present invention are to provide a radiation detector having high time resolution. Objects of third and fourth aspects of the present invention are to provide a radiation detector array including radiation detectors having high time resolution.

Solution to Problem

The present inventors have intensively studied radiation detectors having high time resolution. As a result, the present inventors have newly obtained the following knowledge and conceived the present invention. Patent Literature 1 does not disclose a radiation detector having high time resolution.

When radiation enters a scintillator that includes a pair of end surfaces opposing each other in a first direction and is longer in the first direction, from one of the pair of end surfaces, the scintillator reliably absorbs the radiation in a high energy range and generates a scintillation light. In a configuration in which a semiconductor photodetector is disposed on another end surface of the pair of end surfaces, the scintillator tends to absorb the radiation in the high energy range. However, this configuration tends not to obtain high time resolution.

The semiconductor photodetector detects the scintillation light emitted from another end surface. Scintillation lights generated at a position in the scintillator include, for example, the scintillation light directly incident on the other end surface and the scintillation light directly incident on the one end surface. The scintillation light directly incident on the one end surface is, for example, reflected by the one end surface and then incident on the other end surface. These two scintillation lights are emitted from the other end surface and detected by the semiconductor photodetector. When the scintillation light directly incident on the other end surface and the scintillation light directly incident on the one end surface are simultaneously generated, timings when the scintillation lights are incident on the other end surface are different. Therefore, the semiconductor photodetector detects the two scintillation lights with a large time difference. The semiconductor photodetector tends not to detect the scintillation light with high time resolution.

Therefore, in a radiation detector, the semiconductor photodetector is desirably disposed at a position where the individual scintillation lights simultaneously generated at the same position can be detected without a large time difference. The semiconductor photodetector disposed at the above-described position detects radiation entry in the scintillator with high time resolution.

A radiation detector according to a first aspect includes: a scintillator including a pair of end surfaces opposing each other in a first direction and one side surface coupling the pair of end surfaces; a semiconductor photodetector including a semiconductor substrate disposed to oppose the one side surface; and a wiring member electrically connected to the semiconductor photodetector. A length of the scintillator in the first direction is longer than a length of the scintillator in a second direction orthogonal to the one side surface. A length of the one side surface in the first direction is longer than a width of the one side surface in a third direction orthogonal to the first direction and the second direction. The semiconductor substrate includes a first portion covered with the one side surface and a second portion exposed from the one side surface. The first portion and the second portion are disposed in the first direction. The semiconductor photodetector includes a photodetection region disposed in a first portion and a first electrode and a second electrode disposed in a second portion. The photodetection region includes a plurality of avalanche photodiodes arranged to operate in Geiger mode and a plurality of quenching resistors electrically connected in series with one of an anode or a cathode of a corresponding avalanche photodiode of the plurality of avalanche photodiodes. The plurality of quenching resistors are connected in parallel with the first electrode. Another of the anode or the cathode of each of the plurality of avalanche photodiodes is electrically connected in parallel with the second electrode. The wiring member includes a conductor electrically connected to the first electrode and a conductor connected to the second electrode.

According to the first aspect, the radiation detector includes the scintillator that is longer in the first direction and the semiconductor photodetector disposed on the one side surface of the scintillator. The semiconductor photodetector detects a scintillation light directly incident on the one side surface on which the semiconductor photodetector is disposed. The semiconductor photodetector detects, for example, a scintillation light incident on the one side surface after being reflected by a surface opposing the one side surface on which the semiconductor photodetector is disposed. In the first aspect, the length of the scintillator in the second direction is smaller than the length of the scintillator in the first direction. Therefore, the semiconductor photodetector detects, with a small time difference, for example, a scintillation light directly incident on the one side surface and a scintillation light incident on the one side surface after being reflected by a surface opposing the one side surface. As a result, the first aspect achieves high time resolution. Hereinafter, the "surface opposing the one side surface" may be referred to as the "other surface".

In the first aspect, the scintillator may have a rectangular shape or a triangular shape when viewed in the first direction.

In a configuration in which the scintillator has a rectangular shape or a triangular shape, a scintillation light is reliably incident on the one side surface opposing the semiconductor substrate. Therefore, this configuration more reliably increases the amount of light detected by the semiconductor photodetector.

In the first aspect, the pair of end surfaces may include one end surface inclined relative to the second direction.

In a configuration in which the pair of end surfaces includes one end surface inclined relative to the second direction, a scintillation light is more reliably incident on the one side surface opposing the semiconductor substrate. The number of times of reflection of the scintillation light by the end surface or the side surface is reduced, and reflection attenuation of the scintillation light is reduced. Therefore, this configuration more reliably increases an amount of light detected by the semiconductor photodetector.

In the first aspect, the pair of end surfaces may include one end surface extending in the second direction, and one end surface may have a triangular wave shape in a cross section.

In a configuration in which the one end surface extending in the second direction has a triangular wave shape in the cross section, a scintillation light is still more reliably incident on the one side surface opposing the semiconductor substrate. The number of times of reflection of the scintillation light by the end surface or the side surface is reduced, and reflection attenuation of the scintillation light is reduced. Therefore, this configuration still more reliably increases the amount of light detected by the semiconductor photodetector.

In the first aspect, the pair of end surfaces may include one end surface extending in the second direction, and the one end surface may include a rough surface.

In a configuration in which the one end surface extending in the second direction includes a rough surface, a scintillation light is still more reliably incident on the one side surface opposing the semiconductor substrate. The number of times of reflection of the scintillation light by the end surface or the side surface is reduced, and reflection attenuation of the scintillation light is reduced. Therefore, this configuration still more reliably increases the amount of light detected by the semiconductor photodetector.

In the first aspect, the scintillator may include another side surface having a triangular wave shape in a cross section, and the other side surface may couple the pair of end surfaces and be adjacent to the one side surface.

In a configuration in which another side surface couples the pair of end surfaces and is adjacent to the one side surface, a scintillation light is more reliably incident on the one side surface opposing the semiconductor substrate. Therefore, this configuration still more reliably increases the amount of light detected by the semiconductor photodetector.

In the first aspect, the scintillator may include another side surface that includes a rough surface, and the other side surface may couple the pair of end surfaces and be adjacent to the one side surface.

In a configuration in which another side surface couples the pair of end surfaces and is adjacent to the one side surface, a scintillation light is more reliably incident on the one side surface opposing the semiconductor substrate. Therefore, this configuration still more reliably increases the amount of light detected by the semiconductor photodetector.

In the first aspect, when viewed in the second direction, the photodetection region may have an outline shape corresponding to an outline shape of the one side surface.

In a configuration in which the photodetection region has an outline shape corresponding to the outline shape of the one side surface, the photodetection region tends not to be disposed in a portion of the semiconductor substrate where no scintillation lights can be detected. Therefore, this configuration suppresses increase in dark count and capacitance in the photodetection region. As a result, this configuration reliably improves time resolution of the radiation detector.

The first aspect may further include: a base; and a first wire and a second wire. The base may be disposed such that the semiconductor substrate is positioned between the base and the scintillator and may include a third portion covered with the semiconductor substrate and a fourth portion exposed from the semiconductor substrate. The third portion and the fourth portion may be disposed in the first direction. The fourth portion may include a first terminal and a second terminal. The first terminal and the second terminal and the scintillator may be disposed in front of the same surface of the base. The first terminal may be electrically connected to the first electrode by the first wire, and the second terminal may be electrically connected to the second electrode by the second wire.

A configuration including a base increases mechanical strength of the radiation detector. Therefore, this configuration reliably achieves a radiation detector having high mechanical strength.

The first aspect may further include a resin that covers the first wire and the second wire.

In a configuration in which a resin is provided to cover the first wire and the second wire, the resin protects the first and second wires. Therefore, the first and second wires tend not to be damaged. As a result, this configuration decreases deterioration of electrical connection between the first and second terminals and the first and second electrodes.

The first aspect may further include a light reflector. The light reflector may be disposed such that the semiconductor substrate is positioned between the light reflector and the scintillator.

For example, in a configuration in which a plurality of radiation detectors according to the first aspect are provided, the following effects can be achieved when one radiation detector includes the light reflector. That is, the configuration in which the light reflector of the one radiation detector and the other surface of the other radiation detector oppose each other in the second direction improves reflectance of the scintillation lights on the other surface of another radiation detector even when the light reflector is not disposed on the other surface of the other radiation detector. Therefore, this configuration tends to achieve high time resolution when the plurality of radiation detectors are provided.

In the first aspect, the light reflector may be disposed such that the semiconductor substrate and base are positioned between the light reflector and the scintillator.

In the first aspect, the wiring member may be disposed on the same side as the scintillator relative to the semiconductor substrate.

In a configuration in which the wiring member is disposed on the same side as the scintillator relative to the semiconductor substrate, a substrate for connecting the wiring member to the first and second electrodes through, for example, die bonding does not need to be provided. Therefore, this configuration more reliably simplifies the configuration of the radiation detector.

In the first aspect, the light reflector may have a thickness of 0.05 to 100 μm.

A configuration in which the light reflector has the above-described thickness reliably improves reflectance of the scintillation lights on the other surface. Therefore, this configuration reliably simplifies the configuration of the radiation detector.

In the first aspect, the wiring member and the semiconductor substrate may have flexibility. The flexibility of the wiring member may be higher than the flexibility of the semiconductor substrate.

In a configuration in which the flexibility of the wiring member is higher than the flexibility of the semiconductor substrate, vibration of the wiring member tends not to be transmitted to the semiconductor substrate. A force from the wiring member tends not to be applied to the semiconductor substrate, and the semiconductor substrate tends not to be physically damaged. Therefore, this configuration reliably improves the mechanical strength of the radiation detector.

A radiation detector according to a second aspect includes: a scintillator including a pair of end surfaces opposing each other in a first direction, a first side surface coupling the pair of end surfaces, and a second side surface coupling the pair of end surfaces and being adjacent to the first side surface; a first semiconductor photodetector including a first semiconductor substrate disposed to oppose the first side surface; a second semiconductor photodetector including a second semiconductor substrate disposed to oppose the second side surface; a first wiring member electrically connected to the first semiconductor photodetector; and a second wiring member electrically connected to the second semiconductor photodetector. The scintillator has a rectangular shape when viewed in the first direction. A length of the scintillator in the first direction is longer than both of a length of the scintillator in a second direction orthogonal to the first side surface and a length of the scintillator in a third direction orthogonal to the second side surface. A length of the first side surface in the first direction is longer than a width of the first side surface in the third direction, and a length of the second side surface in the first direction is longer than a width of the second side surface in the second direction. Each of the first semiconductor substrate and the second semiconductor substrate includes a first portion covered with a corresponding side surface of the first side surface and the second side surface and a second portion exposed from the corresponding side surface. The first portion and the second portion are disposed in the first direction. Each of the first semiconductor photodetector and the second semiconductor photodetector includes the photodetection region disposed in the first portion, and a first electrode and a second electrode disposed in the second portion. The photodetection region includes a plurality of avalanche photodiodes arranged to operate in Geiger mode and a plurality of quenching resistors electrically connected in series with one of an anode or a cathode of a corresponding avalanche photodiode of the plurality of avalanche photodiodes. The plurality of quenching resistors are connected in parallel with the first electrode. The other of the anode or the cathode of each of the plurality of avalanche photodiodes is electrically connected in parallel with the second electrode. Each of the first wiring member and the second wiring member includes a conductor electrically connected to the first electrode and a conductor connected to the second electrode.

In the second aspect, a scintillator that is longer in a first direction is provided, and first and second semiconductor photodetectors disposed on first and second side surfaces of the scintillator, respectively, are provided. The first and second semiconductor photodetectors detect a scintillation light directly incident on the first and second side surfaces on which the first and second semiconductor photodetectors are disposed, respectively. The first and second semiconductor photodetectors detect, for example, scintillation lights incident on the first and second side surfaces after being reflected by surfaces opposing the first and second side surfaces. In the second aspect, a length of the scintillator in the second direction is smaller than a length of the scintillator in the first direction. Therefore, the first and second semiconductor photodetectors detect, with a small time difference, scintillation lights directly incident on the first and second side surfaces and scintillation lights incident on the first and second side surfaces after being reflected by the surfaces opposing the first and second side surfaces, respectively. As a result, the second aspect achieves high time resolution. Hereinafter, the "surface opposing the first side surface" may be referred to as a "first other surface". The "surface opposing the second side surface" may be referred to as a "second other surface".

When an incidence angle of a scintillation light on the first side surface exceeds a critical angle on the first side surface, the scintillation light may not be detected by the first semiconductor photodetector disposed on the first side surface. In the second aspect, the scintillation light can be detected by the second semiconductor photodetector disposed on the second side surface adjacent to the first side surface. Therefore, the second aspect achieves a radiation detector having high time resolution and reliably increases the amount of scintillation lights detected by the first and second semiconductor photodetectors.

In the second aspect, the pair of end surfaces may include one end surface inclined relative to the second direction.

In a configuration in which the pair of end surfaces includes the one end surface inclined relative to the second direction, scintillation lights are more reliably incident on the first and second side surfaces opposing the first and second semiconductor substrates. The number of times of reflection of the scintillation light by the end surface or the side surface is reduced, and reflection attenuation of the scintillation light is reduced. Therefore, this configuration more reliably increases the amount of light detected by the first and second semiconductor photodetectors.

In the second aspect, the pair of end surfaces may include one end surface extending in the second direction, and one end surface may have a triangular wave shape in a cross section.

In a configuration in which the one end surface extending in the second direction has a triangular wave shape in a cross section, scintillation lights are still more reliably incident on the first and second side surfaces opposing the first and second semiconductor substrates. The number of times of reflection of the scintillation light by the end surface or the side surface is reduced, and reflection attenuation of the scintillation light is reduced. Therefore, this configuration still more reliably increases the amount of light detected by the first and second semiconductor photodetectors.

In the second aspect, the pair of end surfaces may include one end surface extending in the second direction, and one end surface may include a rough surface.

In a configuration in which the one end surface extending in the second direction includes a rough surface, scintillation lights are still more reliably incident on the first and second side surfaces opposing the first and second semiconductor substrates. The number of times of reflection of the scintillation light by the end surface or the side surface is reduced, and reflection attenuation of the scintillation light is reduced. Therefore, this configuration still more reliably increases the amount of light detected by the first and second semiconductor photodetectors.

In the second aspect, when viewed in the second direction, the photodetection region of the first semiconductor substrate may have an outline shape corresponding to an outline shape of the first side surface. When viewed in the third direction, the photodetection region of the second semiconductor substrate may have an outline shape corresponding to an outline shape of the second side surface.

In a configuration in which the photodetection regions each have the outline shape corresponding to the outline shape of each of the first and second side surfaces, the photodetection regions tend not to be disposed at positions of the first and second semiconductor substrates where no scintillation lights can be detected. Therefore, increase in dark count and capacitance in the photodetection regions is reduced. As a result, this configuration reliably improves the time resolution of the first and second semiconductor photodetectors.

The second aspect may further include: a first base and a second base; and a first wire and a second wire. The first base may be disposed such that the first semiconductor substrate is positioned between the corresponding first base and the scintillator. The second base may be disposed such that the second semiconductor substrate is positioned between the corresponding second base and the scintillator. The first base may include a third portion covered with the first semiconductor substrate and a fourth portion exposed from the first semiconductor substrate, and the second base may include a third portion covered with the second semiconductor substrate and a fourth portion exposed from the second semiconductor substrate. The third portion and the fourth portion may be disposed in the first direction. Each of the fourth portions may include a first terminal and a second terminal. The first terminal and the scintillator may be disposed in front of the same surface of the first base, and the second terminal and the scintillator may be disposed in front of the same surface of the second base. The first terminal may be electrically connected to the first electrode by the first wire, and the second terminal may be electrically connected to the second electrode by the second wire.

A configuration in which the first and second bases are provided increases the mechanical strength of the radiation detector. Therefore, this configuration reliably achieves a radiation detector having high mechanical strength.

The second aspect may further include a resin that covers the first wire and the second wire.

In a configuration in which a resin is provided to cover the first wire and the second wire, the resin protects the first and second wires. Therefore, the first and second wires tend not to be damaged. As a result, this configuration decreases deterioration of electrical connection between the first and second terminals and the first and second electrodes.

The second aspect may include a first light reflector and a second light reflector. The first light reflector may be disposed such that the first semiconductor substrate is positioned between the first light reflector and the scintillator. The second light reflector may be disposed such that the second semiconductor substrate is positioned between the second light reflector and the scintillator.

For example, in a configuration in which a plurality of radiation detectors according to the second aspect are provided, the following effects can be achieved when one radiation detector includes the first light reflector. That is, a configuration in which the first light reflector of the one radiation detector and the first other surface of another radiation detector oppose each other in the second direction improves reflectance of the scintillation lights on the first other surface of the other radiation detector even when the first light reflector is not disposed on the first other surface of the other radiation detector.

For example, in a configuration in which the plurality of radiation detectors according to the second aspect are provided, the following effects can be achieved when one radiation detector includes the second light reflector. That is, a configuration in which the second light reflector of the one radiation detector and the second other surface of the other radiation detector oppose each other in the third direction improves reflectance of the scintillation lights on the second other surface of the other radiation detector even when the second light reflector is not disposed on the second other surface of the other radiation detector.

Therefore, this configuration tends to achieve high time resolution when the plurality of radiation detectors are provided.

In the second aspect, the first light reflector may be disposed such that the first semiconductor substrate and the first base are positioned between the first light reflector and the scintillator. The second light reflector may be disposed such that the second semiconductor substrate and the second base are positioned between the second light reflector and the scintillator.

In the second aspect, the first wiring member may be disposed on the same side as the scintillator relative to the first semiconductor substrate. The second wiring member may be disposed on the same side as the scintillator relative to the second semiconductor substrate.

In a configuration in which the first and second wiring members are disposed on the same side as the scintillator relative to the first and second semiconductor substrates, a substrate for connecting the first and second wiring members to the first and second electrodes, respectively, through die bonding, for example does not need to be provided. Therefore, this configuration more reliably simplifies the configuration of the radiation detector.

In the second aspect, the first light reflector and the second light reflector may have a thickness of 0.05 to 100 μm.

A configuration in which the first and second light reflectors have the above-described thickness reliably improves reflectance of the scintillation lights on the other surface. Therefore, this configuration reliably simplifies the configuration of the radiation detector.

In the second aspect, the first wiring member, the second wiring member, the first semiconductor substrate, and the second semiconductor substrate may have flexibility. The flexibility of the first wiring member may be higher than the flexibility of the first semiconductor substrate. The flexibility of the second wiring member may be higher than the flexibility of the second semiconductor substrate.

In a configuration in which the flexibility of the first and second wiring members is higher than the flexibility of the first and second semiconductor substrates, respectively, vibration of the first and second wiring members tends not to be transmitted to the first and second semiconductor substrates. Forces from the first and second wiring members tend not to be applied to the first and second semiconductor substrates, and the first and second semiconductor substrates tend not to be physically damaged. Therefore, this configuration reliably improves the mechanical strength of the radiation detector.

A radiation detector array according to a third aspect includes a plurality of radiation detectors two-dimensionally disposed in a matrix when viewed in a first direction. Each of the plurality of radiation detectors is the radiation detector according to the first aspect. The semiconductor photodetector of one of the radiation detectors is disposed with the semiconductor photodetector of another one of the radiation detectors adjacent to the one of the radiation detectors in a direction parallel to the side surface.

In the third aspect, the radiation detector array in which the radiation detectors having high time resolution are two-dimensionally disposed in a matrix is achieved.

In the third aspect, the semiconductor photodetectors adjacent to each other in the direction parallel to the one side surface may be integrally formed with each other.

In a configuration in which the individual semiconductor photodetectors are integrally formed with each other, when the radiation detector array in which the plurality of radiation detectors are two-dimensionally disposed in a matrix is produced, forming the semiconductor photodetectors is simplified.

A radiation detector array according to a fourth aspect includes a plurality of radiation detectors two-dimensionally disposed in a matrix when viewed in a first direction. Each of the plurality of radiation detectors is the radiation detector according to the second aspect. The first semiconductor photodetector of one of the radiation detectors is disposed with the first semiconductor photodetector of another one of the radiation detectors adjacent in the third direction. The second semiconductor photodetector of the one radiation detector is disposed with the second semiconductor photodetector of still another one of the radiation detectors adjacent in the second direction.

In the fourth aspect, the radiation detector array in which the radiation detector having high time resolution are two-dimensionally disposed in a matrix is achieved.

In the fourth aspect, the first semiconductor photodetectors adjacent to each other in the third direction may be integrally formed with each other.

In a configuration in which the individual first semiconductor photodetectors are integrally formed with each other, when the radiation detector array in which the plurality of radiation detectors are two-dimensionally disposed in a matrix is produced, forming the first semiconductor photodetectors is simplified.

In the fourth aspect, the second semiconductor photodetectors adjacent to each other in the second direction may be integrally formed with each other.

In a configuration in which the individual second semiconductor photodetectors are integrally formed with each other, when the radiation detector array in which the plurality of radiation detectors are two-dimensionally disposed in a matrix is produced, forming the second semiconductor photodetectors is simplified.

Advantageous Effects of Invention

The first and second aspects of the present invention provide a radiation detector having high time resolution. The third and fourth aspects of the present invention provide radiation detector arrays including a radiation detector having high time resolution.

DESCRIPTION OF EMBODIMENTS

Figure 1:
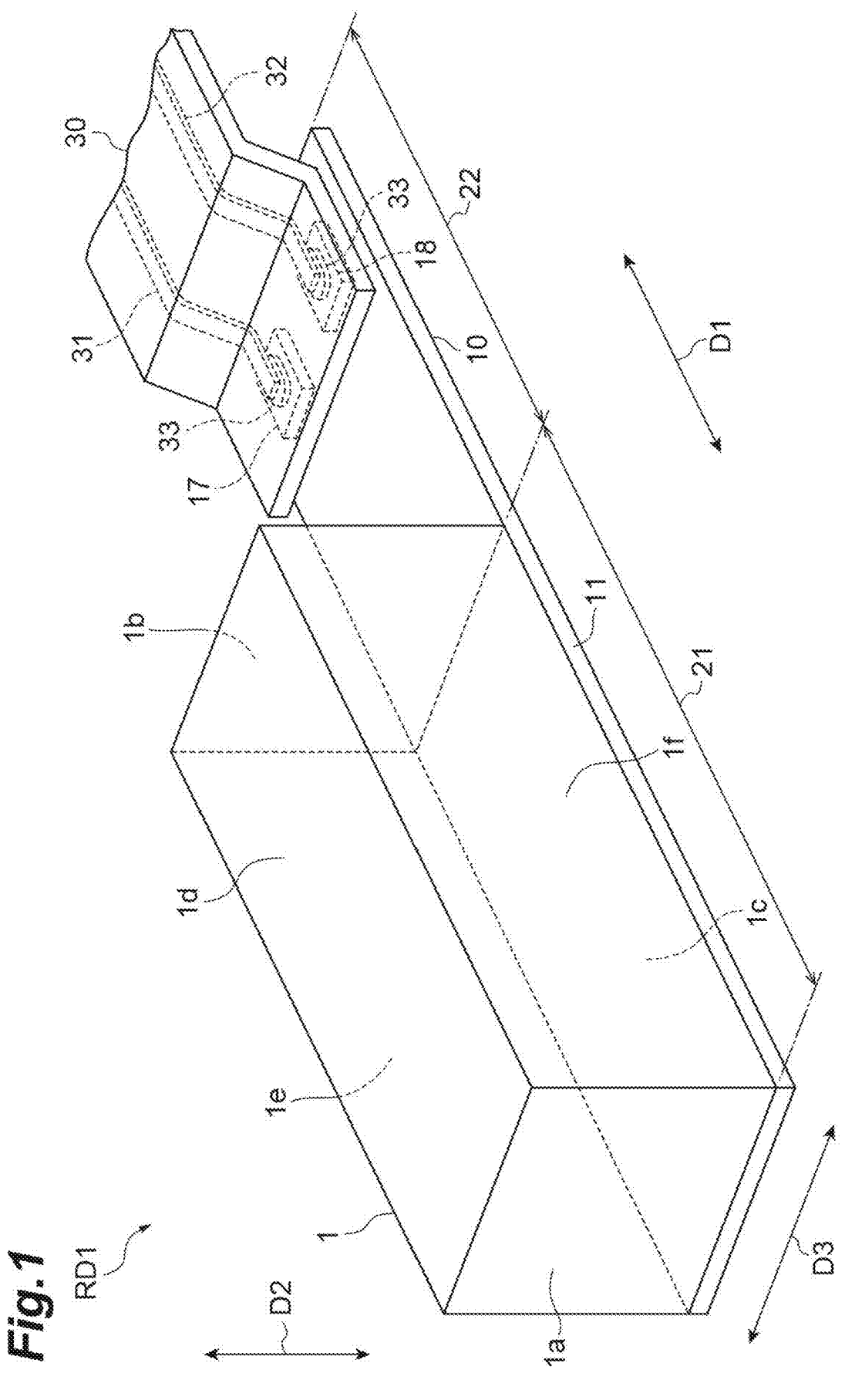
FIG. 1 is a perspective view illustrating a radiation detector according to a first embodiment.

Hereinafter, embodiments of the present invention will be described in detail with reference to the accompanying drawings. Note that, in the description, the same reference numerals will be used for the same elements or elements having the same functions, and redundant description will be omitted.

First Embodiment

Figure 2:
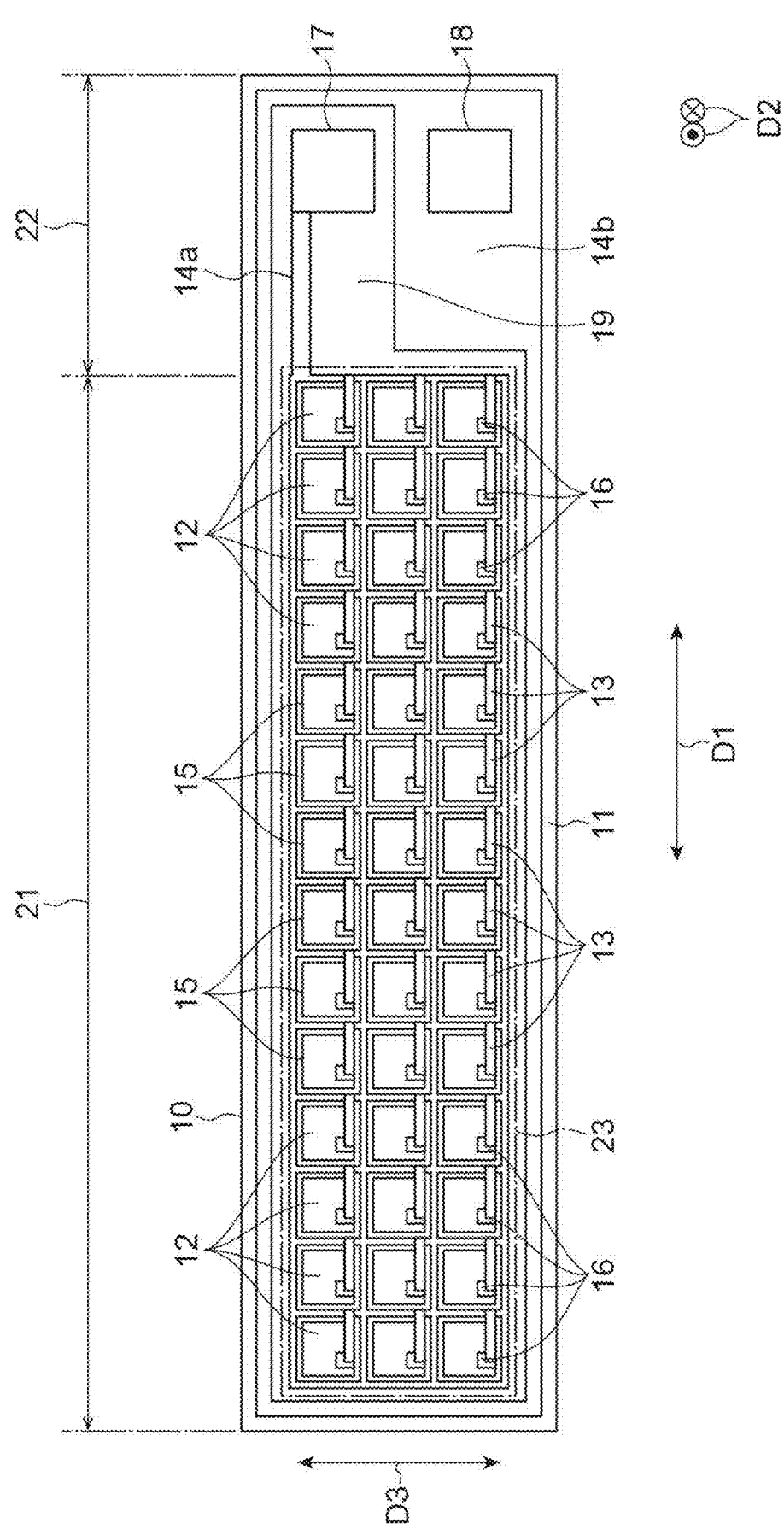
FIG. 2 is a plan view illustrating a semiconductor photodetector.
Figure 3:
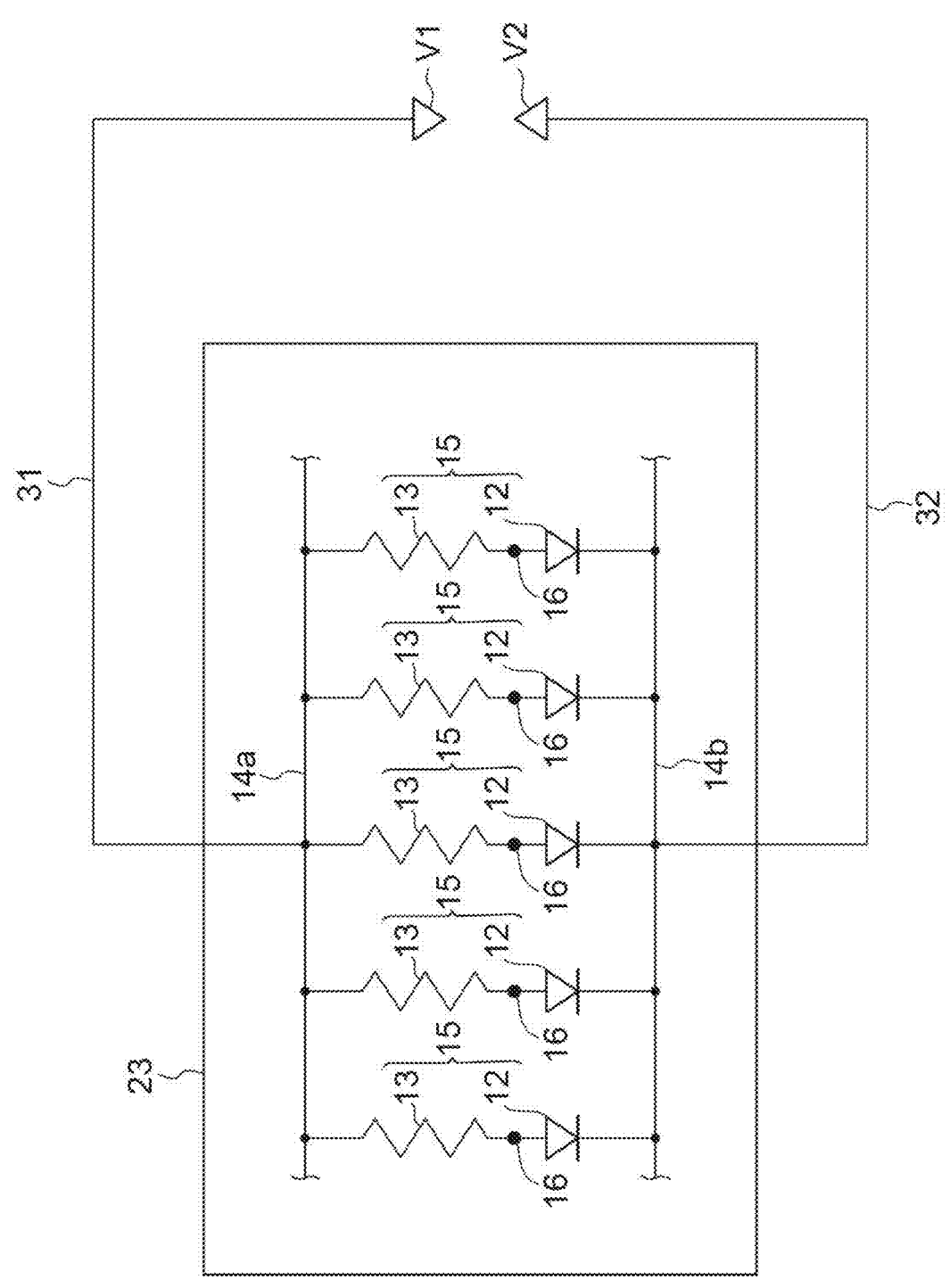
FIG. 3 is a diagram illustrating an equivalent circuit of a photodetection region.
Figure 4:
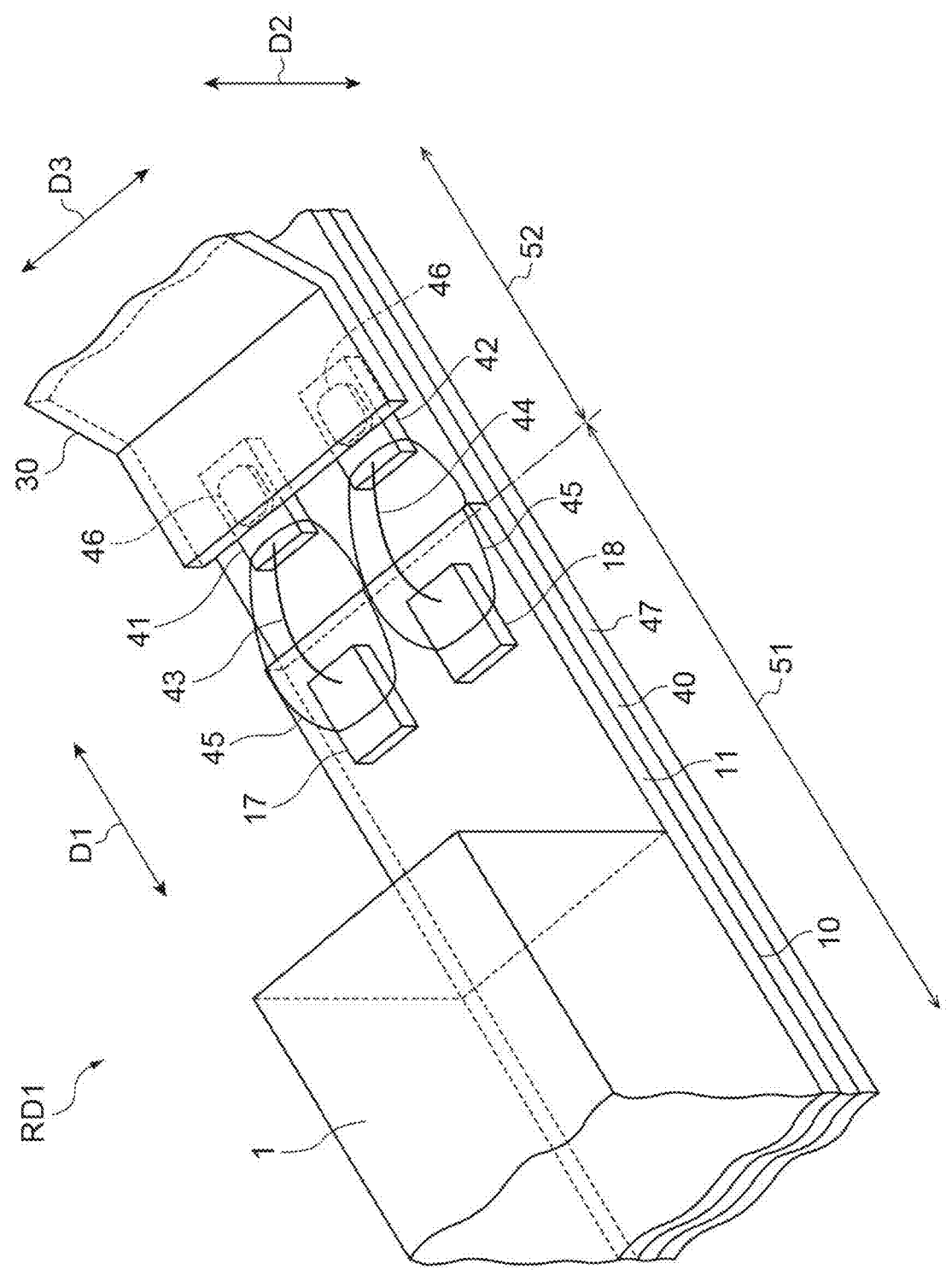
FIG. 4 is a perspective view illustrating the radiation detector according to the first embodiment.

A configuration of a radiation detector RD1 according to a first embodiment will be described with reference to FIGS. 1 to 4. FIG. 1 is a perspective view illustrating the radiation detector according to the first embodiment. FIG. 2 is a plan view illustrating a semiconductor photodetector. FIG. 3 is a diagram illustrating an equivalent circuit of a photodetection region. FIG. 4 is a perspective view illustrating the radiation detector according to the first embodiment.

As illustrated in FIG. 1, the radiation detector RD1 includes a scintillator 1, a semiconductor photodetector 10, and a wiring member 30. The scintillator 1 generates a scintillation light in response to radiation entry in the scintillator. The scintillation light includes, for example, fluorescence. The semiconductor photodetector 10 detects the scintillation light generated in the scintillator 1. The semiconductor photodetector 10 includes a semiconductor substrate 11 and is electrically connected to the wiring member 30.

The scintillator 1 includes a pair of end surfaces 1a and 1b opposing each other, a pair of side surfaces 1c and 1d opposing each other, and a pair of side surfaces 1e and 1f opposing each other. An outer surface of the scintillator 1 includes the end surfaces 1a and 1b, the side surfaces 1c and 1d, and the side surfaces 1e and 1f. The end surfaces 1a and 1b oppose each other in a first direction D1. The end surfaces 1a and 1b define both ends of the scintillator 1 in the first direction D1. The side surfaces 1c and 1d oppose each other in a second direction D2 intersecting the first direction D1. The side surface 1d is a surface opposing the side surface 1c. In the present embodiment, the second direction D2 coincides with a direction orthogonal to the side surface 1c. The side surfaces 1c and 1d define both ends of the scintillator 1 in the second direction D2. The side surfaces 1e and 1f oppose each other in a third direction D3 intersecting the first direction D1 and the second direction D2. In the present embodiment, the first direction D1, the second direction D2, and the third direction D3 are orthogonal to each other. The side surfaces 1e and 1f define both ends of the scintillator 1 in the third direction D3. A length of the scintillator 1 in the first direction D1 is longer than a length of the scintillator 1 in the second direction D2 orthogonal to the side surface 1c. The first direction D1 is a longitudinal direction of the scintillator 1.

The end surface 1a and the end surface 1b extend in the second direction D2 to couple the side surface 1c and the side surface 1d. The end surface 1a and the end surface 1b extend in the third direction D3 to couple the side surface 1e and the side surface 1f. The side surface 1c and the side surface 1d extend in the first direction D1 to couple the end surface 1a and the end surface 1b. The side surface 1c and the side surface 1d extend in the third direction D3 to couple the side surface 1e and the side surface 1f. The side surface 1e and the side surface 1f extend in the first direction D1 to couple the end surface 1a and the end surface 1b. The side surface 1e and the side surface 1f extend in the second direction D2 to couple the side surface 1c and the side surface 1d. The side surface 1e and the side surface 1f are adjacent to the side surface 1c. In the present embodiment, a length of the side surface 1c in the first direction D1 is longer than a width of the side surface 1c in the third direction D3. In the present embodiment and the modification examples according to the present embodiment, for example, when the side surface 1c includes one side surface, the side surfaces 1e and 1f include other side surfaces.

The length of the scintillator 1 in the first direction D1 is, for example, about 20 mm. The length of the scintillator 1 in the second direction D2 is, for example, about 4 mm. A length of the scintillator 1 in the third direction D3 is, for example, about 4 mm.

In the present embodiment, the end surfaces 1a and 1b each have a rectangular shape when viewed in a direction orthogonal to the end surfaces 1a and 1b. The side surfaces 1c and 1d each have a rectangular shape when viewed in a direction orthogonal to the side surfaces 1c and 1d. The side surfaces 1e and 1f each have a rectangular shape when viewed in a direction orthogonal to the side surfaces 1e and 1f. The scintillator 1 has a rectangular shape when viewed in the second direction D2 and the third direction D3. The scintillator 1 has a rectangular shape when viewed in the first direction D1. In the present embodiment, the scintillator 1 has a rectangular parallelepiped shape. The "rectangular shape" in this specification includes, for example, a shape in which each corner is chamfered and a shape in which each corner is rounded. The "rectangular parallelepiped shape" in this specification includes a rectangular parallelepiped shape in which corner portions and ridge portions are chamfered or a rectangular parallelepiped shape in which corner portions and ridge portions are rounded.

The scintillator 1 includes, for example, a crystalline scintillator, a ceramic scintillator, or a plastic scintillator. The crystalline scintillator includes, for example, CsI, NaI, LaBr$_3$, cerium-doped lutetium yttrium orthosilicate (LYSO (Ce)), gadolinium aluminum gallium garnet (GAGG), lutetium oxyorthosilicate (LSO), bismuth germanate (BGO), or ruthenium aluminum garnet (LuAG). The ceramic scintillator includes, for example, a sintered body of an inorganic phosphor. The plastic scintillator includes, for example, polyethylene terephthalate (PET).

As illustrated in FIGS. 1 and 2, the semiconductor substrate 11 is disposed to oppose the side surface 1c. The semiconductor substrate 11 is disposed on the side surface 1c with an adhesive, for example. The semiconductor substrate 11 includes, for example, Si and includes a portion 21 and a portion 22. In the present embodiment, the portion 21 is covered with the side surface 1c. The portion 22 is disposed with the portion 21 in the first direction D1 and is exposed from the side surface 1c. For example, when the portion 21 includes a first portion, the portion 22 includes a second portion.

As illustrated in FIGS. 2 and 3, the semiconductor photodetector 10 includes a photodetection region 23, and the photodetection region 23 is disposed in the portion 21. The photodetection region 23 includes a plurality of avalanche photodiodes 12 and a plurality of quenching resistors 13. The avalanche photodiode 12 receives a scintillation light and generates photoelectrons from the detected scintillation light through photoelectric conversion. Conductive wires 14a and 14b are disposed in the portion 21. The conductive wire 14a includes a wired pattern for signal readout. The conductive wire 14a is patterned in, for example, a grid shape when viewed in the second direction D2. The grid pattern of the conductive wire 14a surrounds one photodetection section 15. The one photodetection section 15 includes one avalanche photodiode 12 and one quenching resistor 13. The one quenching resistor 13 is electrically connected in series with the avalanche photodiode 12 corresponding to the one quenching resistor 13. A plurality of photodetection sections 15 are disposed in the portion 21.

The photodetection sections 15 are two-dimensionally disposed in a matrix, for example. One photodetection section 15 may be disposed in each photodetection region 23. Therefore, the photodetection region 23 may include one avalanche photodiode 12 and one quenching resistor 13.

Each of the plurality of quenching resistors 13 is electrically connected in series with one of an anode or a cathode of the corresponding avalanche photodiode 12 of the plurality of avalanche photodiodes 12. The avalanche photodiode 12 includes a contact electrode 16 electrically connected to one of the anode or the cathode. One end of the quenching resistor 13 is electrically connected in series with the contact electrode 16. Another end of each quenching resistor 13 is electrically connected in series with the conductive wire 14a including the wired pattern. The conductive wire 14b is electrically connected in parallel with the other of the anodes or the cathodes of the plurality of avalanche photodiodes 12.

An electrical resistivity of the quenching resistor 13 is higher than an electrical resistivity of the electrode 17 and the electrode 18. The quenching resistor 13 includes, for example, polysilicon. A material of the quenching resistor 13 may include, for example, SiCr, NiCr, or FeCr. The quenching resistor 13 is formed through, for example, a chemical vapor deposition (CVD) method or a sputtering method. For example, when the electrode 17 includes a first electrode, the electrode 18 includes a second electrode.

In the portion 22, the electrode 17 and the electrode 18 are disposed. That is, the semiconductor photodetector 10 includes the electrode 17 and the electrode 18. The plurality of quenching resistors 13 are connected in parallel with the electrode 17 through the conductive wire 14a. The other of the anodes or the cathodes of the plurality of avalanche photodiodes 12 are connected in parallel with the electrode 18 through the conductive wire 14b. The electrode 17 and the electrode 18 include, for example, aluminum or an aluminum composite. The aluminum composite includes, for example, AlSi, AlCu, or AlSiCu. The electrode 17 and the electrode 18 are formed through, for example, a plating method, a vapor deposition method, or a sputtering method.

In the present embodiment, each of the plurality of quenching resistors 13 is electrically connected in series with an anode of the corresponding avalanche photodiode 12 of the plurality of avalanche photodiodes 12. In this case, the cathodes of the plurality of avalanche photodiodes 12 are electrically connected in parallel with the electrode 18. Each of the plurality of quenching resistors 13 is electrically connected in series with the cathode of the corresponding avalanche photodiode 12 of the plurality of avalanche photodiodes 12. In this case, the anodes of the plurality of avalanche photodiodes 12 are electrically connected in parallel with the electrode 18.

Each avalanche photodiode 12 operates in Geiger mode. In Geiger mode, a reverse bias voltage is applied to the avalanche photodiode 12. The reverse bias voltage is, for example, a reverse voltage higher than a breakdown voltage of the avalanche photodiode 12. For example, an electrical potential V1 is applied to the anode of the avalanche photodiode 12, and an electrical potential V2 positive relative to the electrical potential V1 is applied to the cathode of the avalanche photodiode 12. These electrical potentials have relative polarities, and for example, one of the electrical potentials may be an electrical ground potential. The photodetection sections 15 are electrically connected in parallel.

Each of the avalanche photodiodes 12 may be a so-called reach-through avalanche photodiode or a so-called reverse avalanche photodiode. The reach-through avalanche photodiode 12 is included in, for example, the radiation detector RD1 including the scintillator 1 that generates a scintillation light having a long wavelength. For example, the reach-through avalanche photodiode is used when the scintillation light is a long-wavelength light. The reverse avalanche photodiode 12 is used, for example, when the scintillation light is a short-wavelength light. The reach-through or reverse avalanche photodiode 12 operates in Geiger mode. The radiation detector RD1 may include an avalanche photodiode 12 arranged to operate in a linear mode. The avalanche photodiode 12 arranged to operate in the linear mode may also be a so-called reach-through avalanche photodiode or a so-called reverse avalanche photodiode.

In the semiconductor substrate 11, for example, the conductive wire 14a and the conductive wire 14b, the electrode 17 connected to the conductive wire 14a, and the electrode 18 connected to the conductive wire 14b are disposed. In the semiconductor substrate 11, for example, an insulating layer 19 is disposed on the conductive wire 14a and the conductive wire 14b. The insulating layer 19 extends over the portion 21 and the portion 22. In the portion 22, the electrode 17 and the conductive wire 14a are insulated from the electrode 18 and the conductive wire 14b by the insulating layer 19. In the portion 21, the insulating layer 19 is formed on the plurality of photodetection sections 15. The insulating layer 19 includes, for example, $SiO_2$ or SiN. The insulating layer 19 is formed through, for example, a thermal oxidation method, a sputtering method, or a CVD method.

The wiring member 30 is disposed, for example, on the same side as the scintillator 1 relative to the semiconductor substrate 11. That is, at least a part of the wiring member 30 and the scintillator 1 are disposed in front of the same surface of the semiconductor substrate 11, for example. The wiring member 30 includes a conductor 31 and a conductor 32. The conductor 31 is electrically connected to the electrode 17, and the conductor 32 is electrically connected to the electrode 18. The conductor 31 is electrically connected to the electrode 17 through a conductive bump 33. The conductor 32 is connected to the electrode 18 through the conductive bump 33. The conductive bump 33 includes, for example, solder, an anisotropic conductive film (ACF), or an anisotropic conductive paste (ACP). The solder includes, for example, Sn-Ag-Cu solder. The conductive bump 33 may include, for example, an Au bump, an Ni bump, or a Cu bump.

In the present embodiment, when the radiation detector RD1 is driven, the electrical potential V1 is applied to the anodes of the avalanche photodiodes 12 through the conductor 31, and the electrical potential V2 is applied to the cathodes of the avalanche photodiodes 12 through the conductor 32. The electrical potential V1 may be applied to the cathodes of the avalanche photodiodes 12 through the conductor 32, and the electrical potential V2 may be applied to the anodes of the avalanche photodiodes 12 through the conductor 31. The conductor 31 and the conductor 32 include, for example, Al, Cu, Cu/Ni/Au, or Cu/Ni/Pd/Au. The conductor 31 and the conductor 32 are formed through, for example, a sputtering method or a plating method. The wiring member 30 and the photodetection region 23 have flexibility, and the flexibility of the wiring member 30 is higher than the flexibility of the photodetection region 23.

When viewed in the second direction D2, an outline of the photodetection region 23 is formed along an outline of the side surface 1c. That is, each of edges including the outline of the photodetection region 23 is formed along a corresponding edge of edges including the outline of the side surface 1c when viewed in the second direction D2. When viewed in the second direction D2, the photodetection region 23 has an outline shape corresponding to an outline shape of the side surface 1c. The photodetection sections 15 are all disposed such that the photodetection region 23 has the outline shape corresponding to the outline shape of the side surface 1c when viewed in the second direction D2. In the present embodiment, the outline shape of the side surface 1c is a rectangular shape when viewed in the second direction D2, and the photodetection region 23 has, for example, a rectangular outline shape corresponding to the outline shape of the side surface 1c. As will be described below, the side surface 1c has, for example, trapezoidal and parallelogrammatic outline shapes in addition to the rectangular shape. In a configuration in which the side surface 1c has the trapezoidal outline shape when viewed in the second direction D2, the photodetection region 23 has the trapezoidal outline shape corresponding to the outline shape of the side surface 1c. In a configuration in which the side surface 1c has a parallelogrammatic outline shape when viewed in the second direction D2, the photodetection region 23 has a parallelogrammatic outline shape corresponding to the outline shape of the side surface 1c.

The radiation detector RD1 includes, for example, a base 40. The base 40 is disposed such that the semiconductor 11 is positioned between the base 40 and the scintillator 1. In a configuration in which the radiation detector RD1 includes the base 40, at least a part of the wiring member 30 and the scintillator 1 are disposed in front of the same surface of the base 40, for example. The base 40 includes a portion 51 and a portion 52. The portion 51 is covered with the semiconductor substrate 11. The portion 52 is disposed with the portion 51 in the first direction D1 and is exposed from the semiconductor substrate 11. For example, when the portion 51 includes a third portion, the portion 52 includes a fourth portion.

The radiation detector RD1 includes, for example, a wire 43 and a wire 44, and the portion 52 includes a terminal 41 and a terminal 42. The terminal 41 and the terminal 42 are disposed, for example, on the same side as the scintillator 1 relative to the semiconductor substrate 11. Therefore, the terminal 41, the terminal 42, and the scintillator 1 are disposed in front of the same surface of the base 40, for example. The terminal 41 is electrically connected to the electrode 17 by the wire 43, and the terminal 42 is electrically connected to the electrode 18 by the wire 44. For example, when the terminal 41 includes a first terminal, the terminal 42 includes a second terminal. For example, when the wire 43 includes a first wire, the wire 44 includes a second wire.

The radiation detector RD1 includes, for example, a resin 45. The resin 45 covers, for example, the wire 43 and the wire 44. The resin 45 covers the wire 43 and the wire 44 individually or covers both the wire 43 and the wire 44. In a configuration in which the resins 45 covers the wire 43 and the wire 44 individually, the resin 45 covering the wire 43 and the resin 45 covering the wire 44 may be separated from each other or connected to each other. In this specification, that the "resin 45 covers the wire 43" also means that the resin covers a connection position between the terminal 41 and the wire 43 and a connection position between the electrode 17 and the wire 43. That the "resin 45 covers the wire 44" also means that the resin covers a connection position between the terminal 42 and the wire 44 and a connection position between the electrode 18 and the wire 44. The wiring member 30 is electrically connected to the electrode 17 and the electrode 18 by a conductive bump 46.

The radiation detector RD1 includes, for example, a light reflector 47. The light reflector 47 is disposed such that the semiconductor substrate 11 is positioned between the light reflector 47 and the scintillator 1. In a configuration in which the radiation detector RD1 includes the base 40, the light reflector 47 is disposed such that, for example, the semiconductor substrate 11 and the base 40 are positioned between the light reflector 47 and the scintillator 1. In this configuration, for example, the scintillator 1, the semiconductor substrate 11, the base 40, and the light reflector 47 are disposed in this order. In a configuration in which the radiation detector RD1 does not include the base 40, for example, the scintillator 1, the semiconductor substrate 11, and the light reflector 47 are disposed in this order.

The light reflector 47 includes, for example, metal. The metal of the light reflector 47 includes, for example, Al, Ag, or Au. The light reflector 47 may include a multilayer optical film or Teflon (registered trademark). The light reflector 47 is formed through, for example, a plating method, a vapor deposition method, or a sputtering method. A thickness of the light reflector 47 is, for example, 0.05 to 100 μm. The radiation detector RD1 may not include the light reflector 47.

Figure 5:
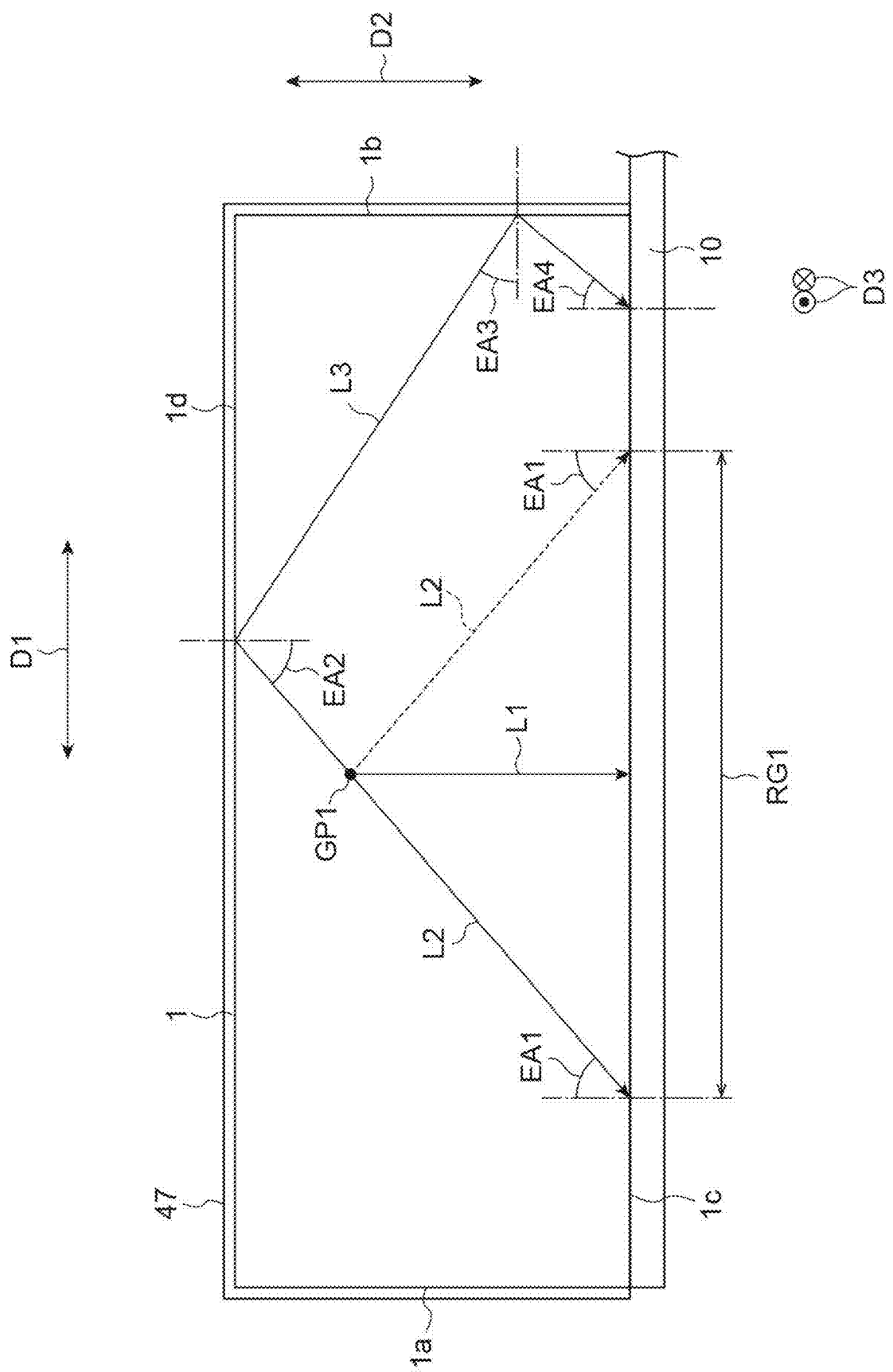
FIG. 5 is a view illustrating paths of some scintillation lights.

A scintillation light path and the scintillator 1 that generates the scintillation light path will be described with reference to FIGS. 5 to 8. FIG. 5 is a view illustrating paths of some scintillation lights. FIG. 5 illustrates paths of some scintillation lights when the scintillator 1 is viewed in the third direction D3. As described above, the scintillation light is generated by radiation entry in the scintillator 1. The radiation is incident on the scintillator 1 from the end surface 1a in the first direction D1, for example. The semiconductor photodetector 10 is disposed to oppose the side surface 1c. In the present embodiment, the scintillator 1 has a refractive index of, for example, 1.8, and an adhesive for bonding the semiconductor photodetector 10 and the scintillator 1 has a refractive index of, for example, 1.5. In this case, a critical angle of the scintillation light on the side surface 1c is about 56.4 degrees. The illustrated radiation detector RD1 includes the light reflectors 47 on the end surfaces 1a and 1b and the side surfaces 1d, 1e, and 1f. The scintillation light incident on the end surfaces 1a and 1b and the side surfaces 1d, 1e, and 1f is totally reflected by the light reflectors 47.

Scintillation lights generated in the scintillator 1 travel, for example, in the scintillator 1 as follows. The scintillation lights travel in all directions of 360 degrees from a scintillation light generation point GP1. The scintillation light includes, for example, lights L1 and L2 incident on the side surface 1c directly from the generation point GP1. A range of an incidence angle at which the lights L1 and L2 can be incident on the side surface 1c is 0 to about 56.4 degrees. In the example illustrated in FIG. 5, the light L1 is incident on the side surface 1c at an incidence angle of 0 degrees that is the lower limit of the incidence angle. The light L2 is incident on the side surface 1c at an incidence angle EA1, and the incidence angle EA1 is smaller than 56.4 degrees that is the upper limit of the incidence angle. The light L2 is not totally reflected by the side surface 1c and is emitted from the side surface 1c within a region RG1 illustrated in the side surface 1c. The region RG1 indicates a maximum region in which the light L2 can be emitted from the side surface 1c when viewed in the third direction D3. The light L2 is also incident on the side surface 1c by a path indicated by a broken line in FIG. 5. The light L2 emitted from the side surface 1c is detected by the semiconductor photodetector 10 disposed on the side surface 1c.

The scintillation lights include, for example, a light L3 first incident on the side surface 1d at an incidence angle EA2 in addition to the lights L1 and L2. The light L3 is totally reflected by the side surface 1d. The light L3 is totally reflected by the side surface 1d and then is incident on the end surface 1b at an incidence angle EA3. The light L3 is totally reflected by the end surface 1b and then is incident on the side surface 1c. In the example illustrated in FIG. 5, an incidence angle EA4 of the light L3 on the side surface 1c is smaller than the critical angle on the side surface 1c. The light L3 is not totally reflected by the side surface 1c and is emitted from the side surface 1c.

Figure 6:
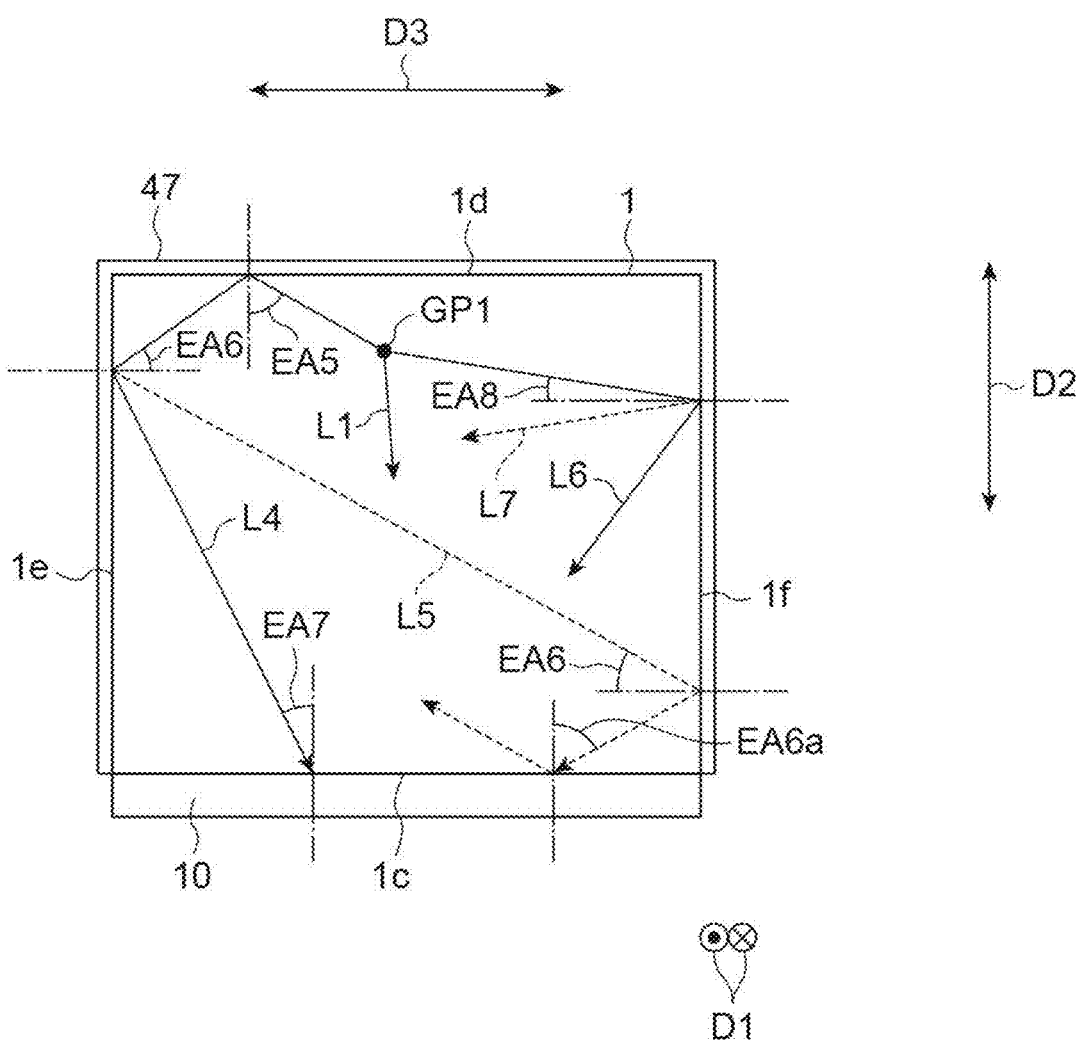
FIG. 6 is a view illustrating paths of some scintillation lights.

FIG. 6 is a view illustrating paths of some scintillation lights. FIG. 6 illustrates the paths of some scintillation lights when the scintillator 1 is viewed in the first direction D1. As illustrated in FIG. 6, a path of the scintillation light from the generation point GP1 to the side surface 1c varies with states of the side surfaces 1e and 1f. The semiconductor photodetector 10 is disposed to oppose the side surface 1c.

In the scintillator 1 used as an example in FIG. 6, two surfaces of the side surfaces 1e and 1f include rough surfaces. The two surfaces of the side surfaces 1c and 1d include mirror surfaces. The scintillation light includes, for example, a light L4 incident on the side surface 1d at an incidence angle EA5 from the generation point GP1, in addition to the light L1. The light L4 incident on the side surface 1d is totally reflected by the side surface 1d. The light L4 is totally reflected by the side surface 1d and then is incident on the side surface 1e at an incidence angle EA6. Since the side surface 1e includes a rough surface, the light L4 incident on the side surface 1e is reflected and diffused from the side surface 1e toward the side surface 1c. The reflected and diffused light L4 is incident on the side surface 1c. When an incidence angle EA7 of the light L4 on the side surface 1c is smaller than the critical angle on the side surface 1c, the light L4 incident on the side surface 1c is detected by the semiconductor photodetector 10 disposed on the side surface 1c. Even when the incidence angle EA7 is larger than the critical angle on the side surface 1c, the light L4 is reflected by the side surface 1c and then is incident on the side surface 1f. Since the side surface 1f includes a rough surface, the light L4 can be reflected toward the side surface 1c.

When the incidence angle EA7 is larger than the critical angle on the side surface 1c, the light L4 is reflected by the side surface 1c and then is incident on the side surface 1e again through the side surface 1d. The light L4 incident on the side surface 1e again can be reflected by the side surface 1e to be incident on the side surface 1c at an incidence angle smaller than the critical angle on the side surface 1c. Since the side surface 1e includes a rough surface, the light L4 incident on the side surface 1e is reflected at a different reflection angle for each reflection even if the incidence angles EA6 are substantially the same. The light L4 incident on the side surface 1c at an incidence angle smaller than the critical angle on the side surface 1c is detected by the semiconductor photodetector 10. In a configuration in which the side surface 1e includes a mirror surface, when the incidence angles EA6 are substantially the same, the light L4 reflected by the side surface 1e tends not to be reflected at a different reflection angle for each reflection.

Here, a path of a light in a configuration in which the side surfaces 1e and 1f include mirror surfaces is compared with a path of a light in a configuration in which the side surfaces 1e and 1f include rough surfaces. In FIG. 6, in the configuration in which the side surfaces 1e and 1f include mirror surfaces, a path of a light L5 that is totally reflected by the side surface 1d and then incident on the side surface 1e is indicated by a broken line. The light L5 incident on the side surface 1e at an incidence angle EA6 is totally reflected by the side surface 1e. The light L5 totally reflected by the side surface 1e is incident on the side surface 1f at the incidence angle EA6. The light L5 incident on the side surface 1f is totally reflected by the side surface 1f. The light L5 totally reflected by the side surface 1f is incident on the side surface 1c at an incidence angle EA6a. When the incidence angle EA6a is smaller than the critical angle on the side surface 1c, the light L5 is detected by the semiconductor photodetector 10. A path of the light L5 from the generation point GP1 to the side surface 1c is longer than a path of the light L4 from the generation point GP1 to the side surface 1c. Therefore, the light L4 is detected by the semiconductor photodetector 10 with a time difference smaller than that of the light L5 relative to the light L1. The number of times of reflection of the light L4 by the side surfaces is smaller than the number of times of reflection of the light L5 by the side surfaces.

In the example of FIG. 6, when the incidence angle EA6 is 30 degrees, the incidence angle EA6a is 60 degrees. The incidence angle EA6a is larger than the critical angle (about 56.4 degrees) on the side surface 1c. In this case, the light L5 is totally reflected by the side surface 1c and is incident on the side surface 1e again. The light L5 is totally reflected by the side surface 1e and is reflected again from each of the side surfaces 1d, 1e, and 1f. Therefore, the light L5 is attenuated by reflection on the side surfaces 1d, 1e, and 1f as compared with the light L4.

As illustrated in FIG. 6, the scintillation light includes, for example, a light L6 incident on the side surface 1f from the generation point GP1. The side surface 1f includes a rough surface. The light L6 incident on the side surface 1f is incident on the side surface 1f at an incidence angle EA8. The light L6 can travel toward the side surface 1c by diffuse reflection from the side surface 1f. The light L6 is emitted from the side surface 1c. Here, a path of a light in a configuration in which the side surface 1f includes a mirror surface is compared with a path of a light in a configuration in which the side surface 1f includes a rough surface. In FIG. 6, in the configuration in which the side surface 1f includes a mirror surface, a path of a light L7 incident on the side surface 1f is indicated by a broken line. The light L7 incident on the side surface 1f at the incidence angle EA8 is totally reflected by the side surface 1f and travels toward the side surface 1e. Thereafter, the light L7 is repeatedly reflected by the side surfaces 1f and 1e and then is incident on the side surface 1c to be detected by the semiconductor photodetector 10. Reflection attenuation of the light L7 is larger than reflection attenuation of the light L6.

Figure 7:
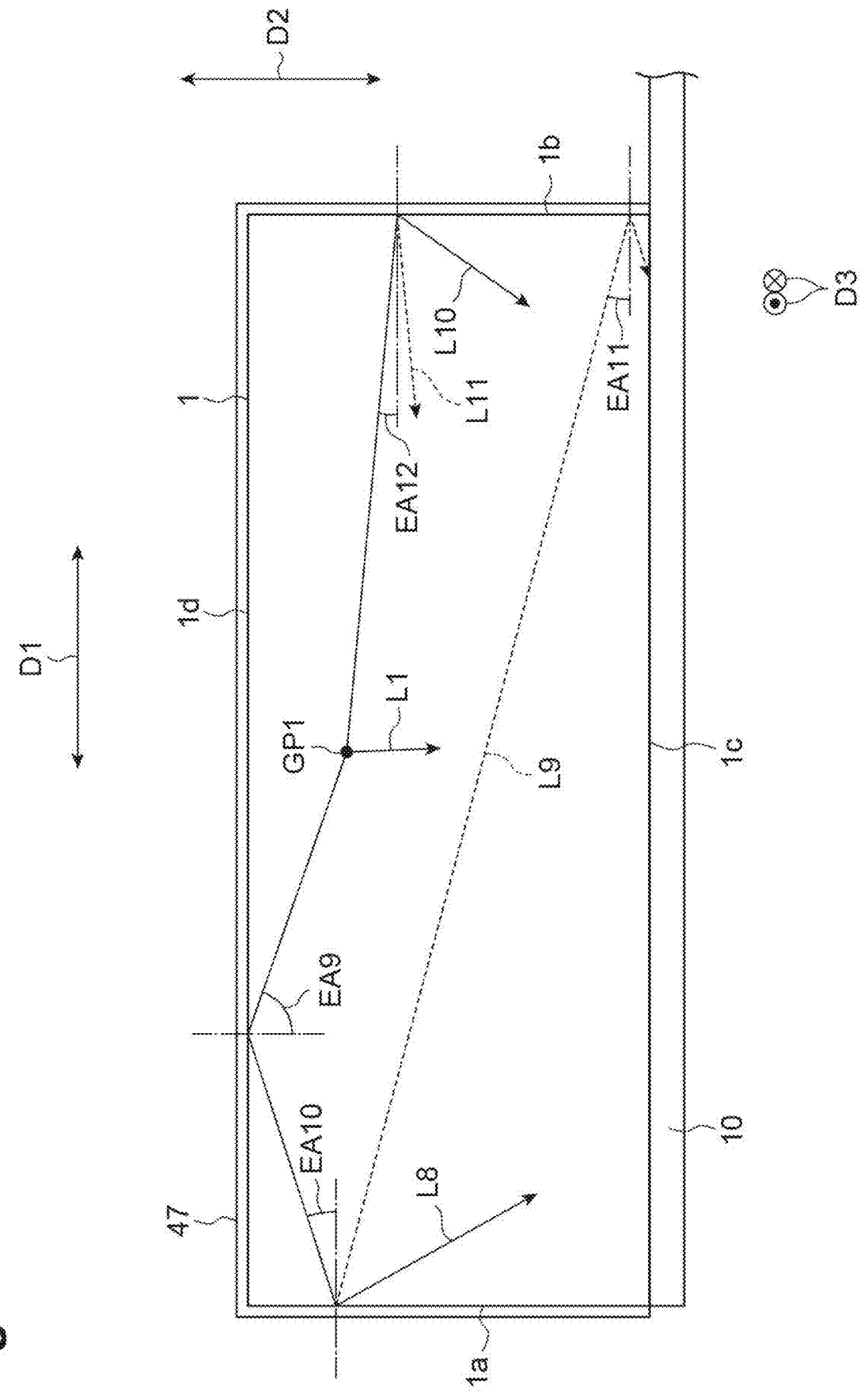
FIG. 7 is a view illustrating paths of some scintillation lights.

FIG. 7 is a diagram illustrating paths of some scintillation lights. FIG. 7 illustrates the paths of some scintillation lights when the scintillator 1 is viewed in the third direction D3. As illustrated in FIG. 7, a path of a scintillation light from the generation point GP1 to the side surface 1c varies with states of the end surfaces 1a and 1b. The semiconductor photodetector 10 is disposed to oppose the side surface 1c.

In the scintillator 1 used as an example in FIG. 7, two surfaces of the end surfaces 1a and 1b include rough surfaces. The two surfaces of the side surfaces 1c and 1d include mirror surfaces. As illustrated in FIG. 7, the scintillation light includes a light L8 incident on the side surface 1d from the generation point GP1, in addition to the light L1. The light L8 incident on the side surface 1d at an incidence angle EA9 is totally reflected by the side surface 1d. The light L8 is totally reflected by the side surface 1d and then is incident on the end surface 1a at an incidence angle EA10.

Since the end surface 1a includes a rough surface, the light L8 incident on the end surface 1a is reflected and diffused from the end surface 1a toward the side surface 1c. The reflected and diffused light L8 is incident on the side surface 1c. The light L8 is emitted from the side surface 1c and is incident on the semiconductor photodetector 10.

Here, a path of a light in a configuration in which the end surfaces 1a and 1b include mirror surfaces is compared with a path of a light in a configuration in which the end surfaces 1a and 1b include rough surfaces. In FIG. 7, in the configuration in which the end surfaces 1a and 1b include mirror surfaces, a path of a light L9 that is totally reflected by the side surface 1d and then incident on the end surface 1a is indicated by a broken line. The light L9 incident on the end surface 1a at an incidence angle EA10 is totally reflected by the end surface 1a. The light L9 totally reflected by the end surface 1a is incident on the end surface 1b at an incidence angle EA11. The light L9 incident on the end surface 1b is totally reflected by the end surface 1b. The light L9 totally reflected by the end surface 1b is incident on the side surface 1c. A path of the light L9 from the generation point GP1 to the side surface 1c is longer than a path of the light L8 from the generation point GP1 to the side surface 1c. The light L8 is detected by the semiconductor photodetector 10 with a time difference smaller than that of the light L9 relative to the light L1. Reflection attenuation of the light L8 is smaller than reflection attenuation of the light L9. The amount of the detected light L8 detected by the semiconductor photodetector 10 is larger than the amount of the detected light L9.

As illustrated in FIG. 7, the scintillation light includes, for example, a light L10 incident on the end surface 1b from the generation point GP1. The end surface 1b includes a rough surface. The light L10 incident on the end surface 1b at an incidence angle EA12 is reflected and diffused from the end surface 1b toward the side surface 1c. The light L10 is emitted from the side surface 1c. For comparison, FIG. 7 illustrates a path of a light L11 incident on the end surface 1b by a broken line in a configuration in which the end surface 1b is assumed to include a mirror surface. The light L11 incident on the end surface 1b at the incidence angle EA12 is totally reflected by the end surface 1b and travels toward the end surface 1a. Thereafter, the light L11 is repeatedly reflected by the end surfaces 1b and 1a and then is incident on the side surface 1c to be detected by the semiconductor photodetector 10.

Figure 8:
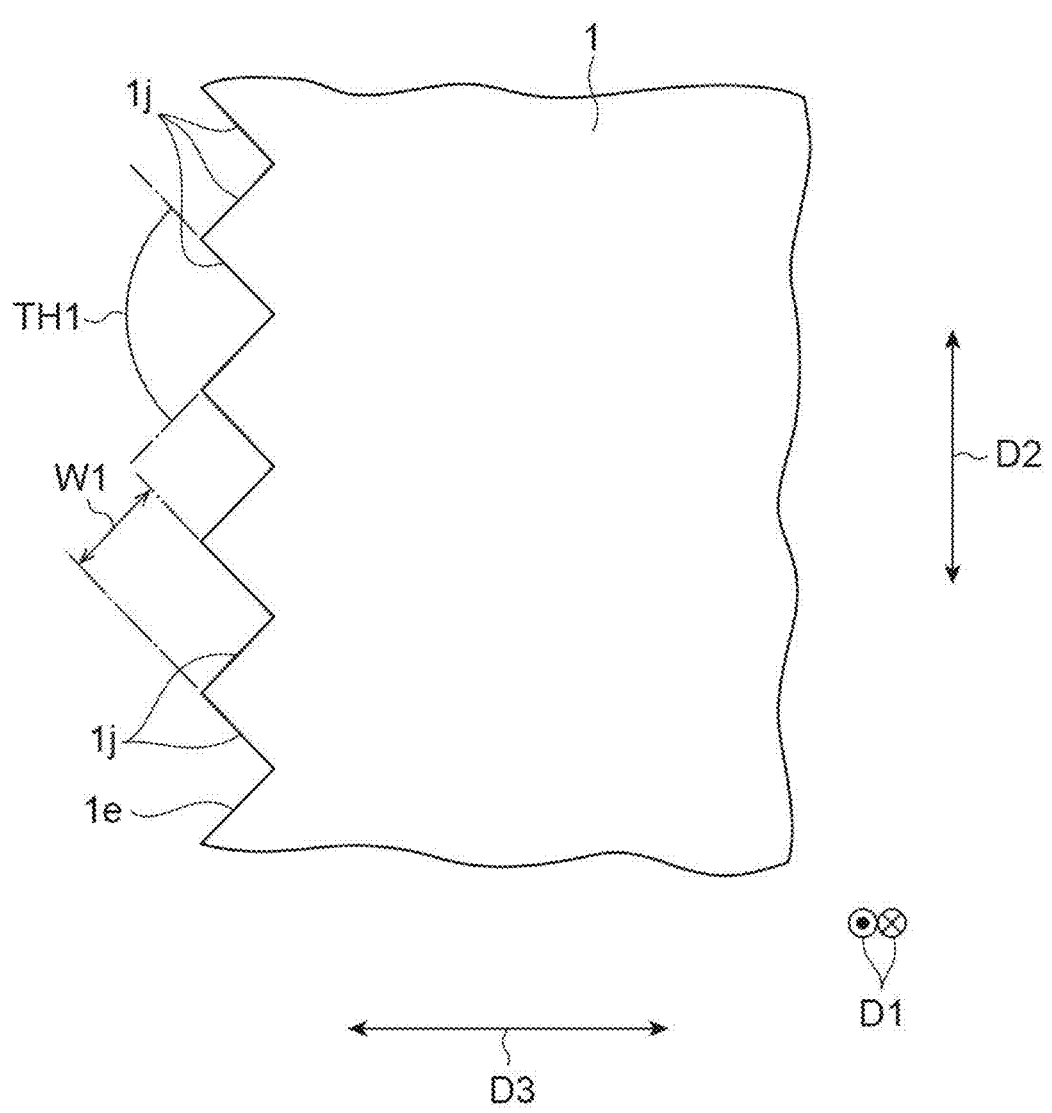
FIG. 8 is a view illustrating an example of an outline shape of a side surface.

As illustrated in FIG. 8, the side surface 1e adjacent to the side surface 1c may include a rough surface. FIG. 8 is a view illustrating an example of an outline shape of the side surface 1e. FIG. 8 illustrates an example of the outline shape of the side surface 1e when the scintillator 1 is viewed in the first direction D1. In the present embodiment, in a configuration in which at least one of the side surfaces 1e and 1f and the end surfaces 1a and 1b includes a rough surface, the side surfaces 1e and 1f and the end surfaces 1a and 1b that include rough surfaces have, for example, an outline shape as illustrated in FIG. 8.

In the configuration in which the side surface 1e includes a rough surface, the side surface 1e has, for example, a triangular wave shape in a cross section. The triangular wave shape in the cross section of the side surface 1e includes, for example, edges 1j. When viewed in the first direction D1, a length W1 of each edge 1j is, for example, about 1.0 to 400 μm. Directions parallel to the edges 1j intersect each other. An angle TH1 at which the edges 1j intersect each other is, for example, about 20 to 160 degrees.

In a configuration in which the side surface 1e includes a rough surface, the side surface 1e has, for example, a triangular wave shape in a cross section when viewed in the second direction D2. When viewed in the second direction D2, a length of each edge 1j is, for example, about 1.0 to 400 μm. The angle at which the edges 1j intersect each other when viewed in the second direction D2 is, for example, about 20 to 160 degrees. When the end surfaces 1a and 1b and the side surface 1f include rough surfaces, the end surfaces 1a and 1b and the side surface 1f have, for example, a triangular wave shape as illustrated in FIG. 8. The end surfaces 1a and 1b and the side surface 1f have a triangular wave shape in a cross section.

At least one of the side surfaces 1e and 1f and the end surfaces 1a and 1b includes, for example, a rough surface. Regarding the rough surface, the surface roughness is, for example, 0.5 to 200 μm. When the surface roughness of the side surfaces 1e and 1f and the end surfaces 1a and 1b, that include rough surfaces, has a value within the above-described range, the side surfaces 1e and 1f and the end surfaces 1a and 1b may not have the triangular wave shape in the cross section. In this specification, the maximum height (Rz) is used as the surface roughness of the surface. The maximum height (Rz) is defined in JIS B 0601:2001 (ISO 4287:1997).

In the present embodiment, at least one of the side surfaces 1e and 1f may include a rough surface, and at least one of the end surfaces 1a and 1b may include a rough surface. All of the side surfaces 1e and 1f and the end surfaces 1a and 1b may include rough surfaces. The side surfaces 1e and 1f may include mirror surfaces, and at least one of the end surfaces 1a and 1b may include a rough surface. At least one of the side surfaces 1e and 1f may include a rough surface, and at end surfaces 1a and 1b may include mirror surfaces. All of the side surfaces 1e and 1f and the end surfaces 1a and 1b may include mirror surfaces.

When at least one of the side surfaces 1c, 1d, 1e, and 1f and the end surfaces 1a and 1b includes, for example, a mirror surface, the surface roughness of the mirror surface is, for example, 0.001 to 0.1 μm. For example, the side surfaces 1c and 1d include mirror surfaces.

Figure 9:
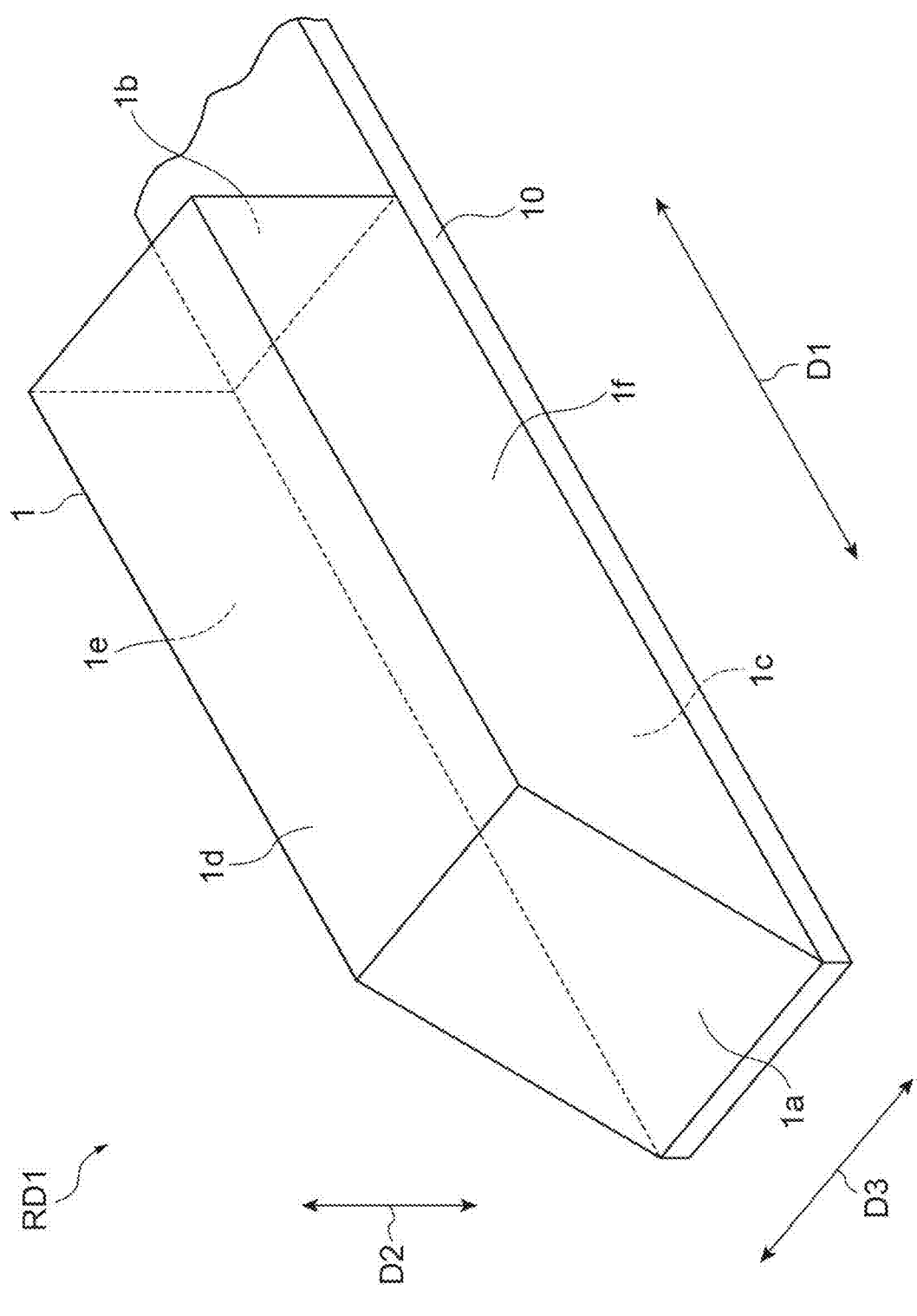
FIG. 9 is a perspective view illustrating a radiation detector according to a first modification example of the first embodiment.
Figure 10:
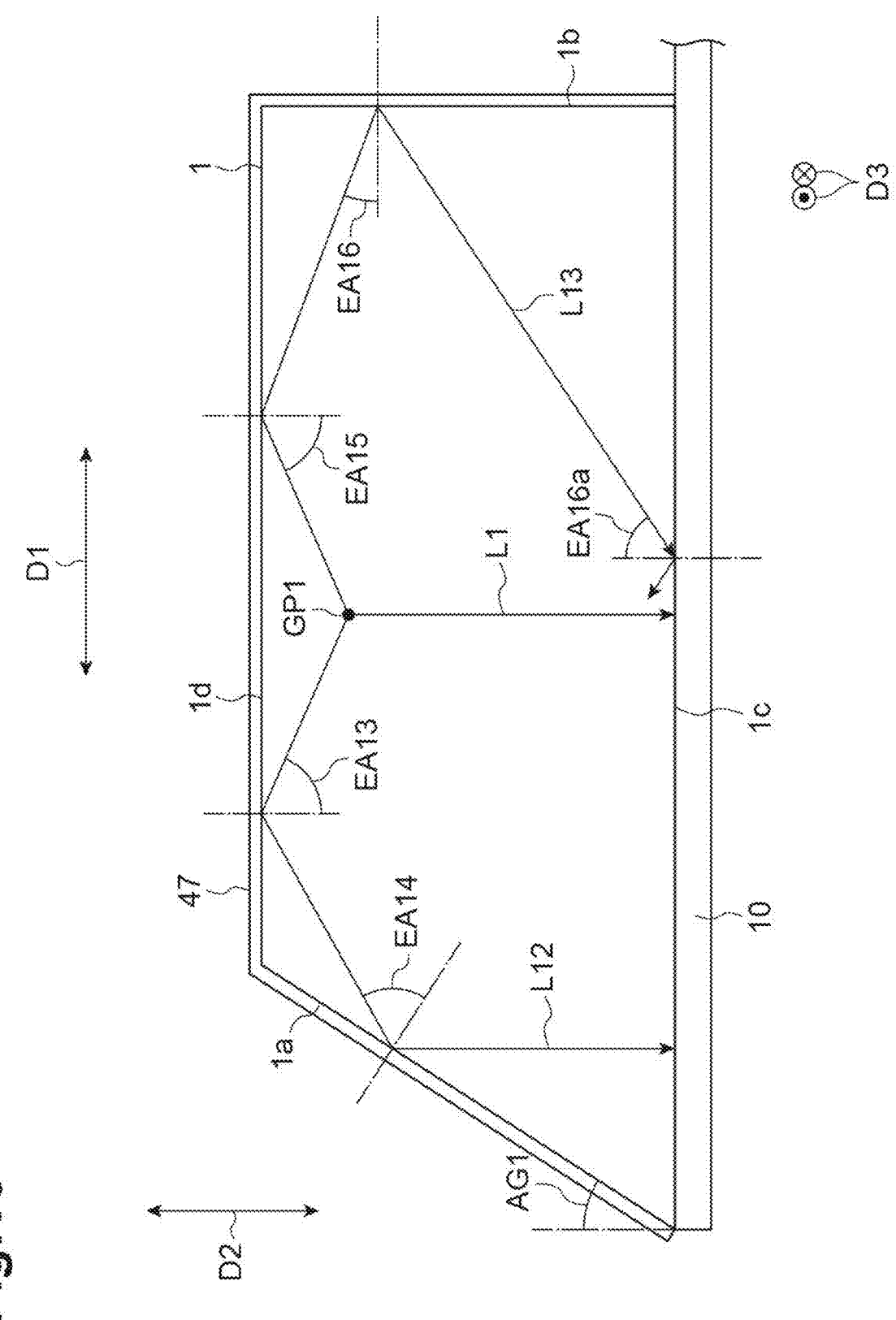
FIG. 10 is a view illustrating paths of some scintillation lights.

A first modification example of the radiation detector RD1 according to the first embodiment will be described with reference to FIGS. 9 and 10. FIG. 9 is a perspective view illustrating a radiation detector RD1 according to the first modification example of the first embodiment. FIG. 10 is a view illustrating paths of some scintillation lights. FIG. 10 illustrates the paths of some scintillation lights when the scintillator 1 is viewed in the third direction D3. The radiation detector RD1 according to the present modification example has the same configuration as the radiation detector RD1 according to the first embodiment except for a configuration of the scintillator 1.

The scintillator 1 according to the present modification example includes a pair of end surfaces 1a and 1b opposing each other in the first direction D1, a pair of side surfaces 1c and 1d opposing each other in the second direction D2, and a pair of side surfaces 1e and 1f opposing each other in the third direction D3. The end surfaces 1a and 1b, the side surfaces 1c and 1d, and the side surfaces 1e and 1f include outer surfaces of the scintillator 1. In the present modification example, unlike the first embodiment, the end surface 1a is inclined relative to the second direction D2. The end surface 1a is also inclined relative to the first direction D1. That is, the pair of end surfaces 1a and 1b includes one end surface 1a inclined relative to the second direction D2. The end surface 1b extends in the second direction D2. When the side surface 1f is viewed in the third direction D3, an angle AG1 formed by the end surface 1a relative to the second direction D2 is, for example, 10 to 80 degrees in a clockwise direction. A length of the side surface 1d in the first direction D1 is smaller than a length of the side surface 1c in the first direction D1. The end surfaces 1a and 1b each have, for example, a rectangular shape when viewed in the direction orthogonal to the end surfaces 1a and 1b. The side surfaces 1c and 1d each have, for example, a rectangular shape when viewed in the direction orthogonal to the side surfaces 1c and 1d. The scintillator 1 has a rectangular shape when viewed in the first direction D1 and the second direction D2. The first direction D1 is a longitudinal direction of the scintillator 1.

In the present modification example, at least one of the side surfaces 1e and 1f and the end surfaces 1a and 1b may include a rough surface. At least one of the side surfaces 1e and 1f and the end surface 1b may include a rough surface. The end surface 1a may not include a rough surface. The side surfaces 1c and 1d include, for example, mirror surfaces. When viewed in the second direction D2, the photodetection region 23 has an outline shape corresponding to an outline shape of the side surface 1c. In the present modification example, the outline shape of the side surface 1c is a rectangular shape when viewed in the second direction D2. The photodetection region 23 has a rectangular outline shape corresponding to the outline shape of the side surface 1c.

As illustrated in FIG. 10, the scintillation light includes, for example, the light L1 directly incident on the side surface 1c from the generation point GP1. The scintillation light includes a light L12 in addition to light L1. The light L12 is first incident on the side surface 1d, is totally reflected by the side surface 1d, and then is incident on the end surface 1a. An incidence angle EA13 of the light L12 on the side surface 1d is larger than the critical angle on the side surface 1d. In the present modification example, the end surface 1a is inclined relative to the second direction D2. Therefore, the light L12 reflected by the side surface 1d is totally reflected by the end surface 1a. The end surface 1a is inclined relative to the second direction D2 so that the light L12 tends not to be totally reflected toward the side surface 1c. The light L12 totally reflected by the end surface 1a is incident on the side surface 1c. The light L12 is emitted from the side surface 1c and is detected by the semiconductor photodetector 10. The light reflectors 47 are disposed on the end surfaces 1a and 1b and the side surface 1d.

The scintillation light includes, for example, a light L13. The light L13 is first incident on the side surface 1d, is totally reflected by the side surface 1d, and then is incident on the end surface 1b. The light L13 is illustrated for comparison with the light L12. A size of an incidence angle EA15 of the light L13 on the side surface 1d is the same as a size of the incidence angle EA13 of the light L12 on the side surface 1d. The light L13 is totally reflected by the side surface 1d and then is incident on the end surface 1b at an incidence angle EA16. Therefore, although the light L13 is incident on the side surface 1d at the same incidence angle as the light L12, the light L13 tends not to be emitted from the side surface 1c. The light L13 incident on the end surface 1b is totally reflected by the end surface 1b and is incident on the side surface 1c at an incidence angle EA16a. In the example illustrated in FIG. 10, the incidence angle EA16a is larger than the critical angle on the side surface 1c. The light L13 is totally reflected by the side surface 1c. In the example illustrated in FIG. 10, when the size of the incidence angle EA15 is changed, the light L13 is totally reflected by the end surface 1b and then is incident on the side surface 1c. The scintillation light totally reflected by the end surface 1b is detected by the semiconductor photodetector 10.

Figure 11:
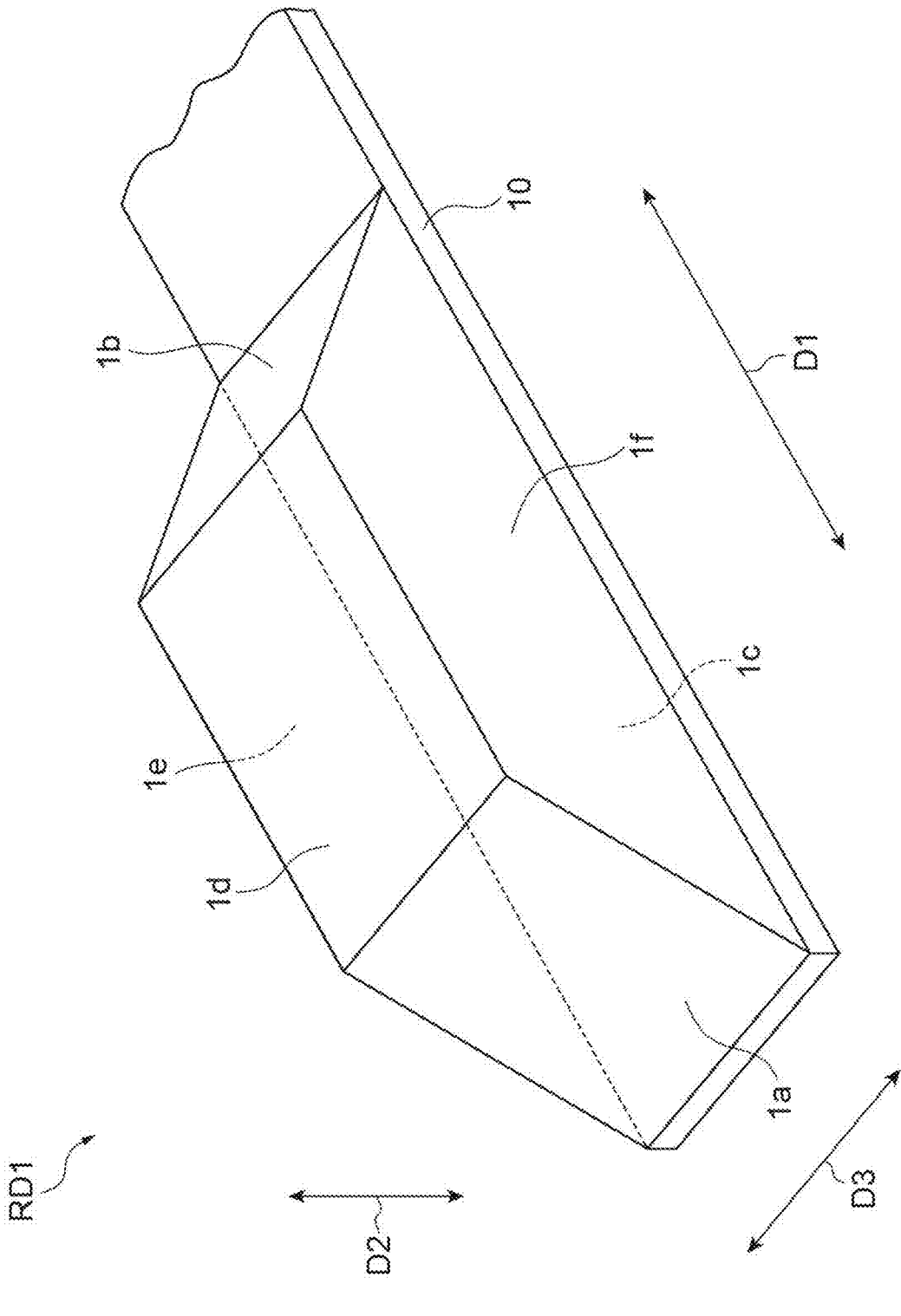
FIG. 11 is a perspective view illustrating a radiation detector according to a second modification example of the first embodiment.

A second modification example of the radiation detector RD1 according to the first embodiment will be described with reference to FIG. 11. FIG. 11 is a perspective view illustrating a radiation detector RD1 according to the second modification example of the first embodiment. The radiation detector RD1 according to the present modification example has the same configuration as the radiation detector RD1 according to the first embodiment except for a configuration of the scintillator 1.

The scintillator 1 according to the present modification example includes a pair of end surfaces 1a and 1b opposing each other in the first direction D1, a pair of side surfaces 1c and 1d opposing each other in the second direction D2, and a pair of side surfaces 1e and 1f opposing each other in the third direction D3. The end surfaces 1a and 1b, the side surfaces 1c and 1d, and the side surfaces 1e and 1f include outer surfaces of the scintillator 1. In the present modification example, unlike the first embodiment, the end surfaces 1a and 1b are inclined relative to the second direction D2. That is, the pair of end surfaces 1a and 1b includes one of the end surfaces 1a and 1b inclined relative to the second direction D2. The end surfaces 1a and 1b are also inclined relative to the first direction D1. When the side surface 1f is viewed in the third direction D3, an angle formed by the end surface 1a relative to the second direction D2 is, for example, 10 to 80 degrees in a clockwise direction. When the side surface 1f is viewed in the third direction D3, an angle formed by the end surface 1b relative to the second direction D2 is, for example, 10 to 80 degrees in a counterclockwise direction. The side surfaces 1e and 1f have, for example, a trapezoidal shape when viewed in the third direction D3. A length of the side surface 1d in the first direction D1 is smaller than a length of the side surface 1c in the first direction D1. The end surfaces 1a and 1b each have, for example, a rectangular shape when viewed in the direction orthogonal to the end surfaces 1a and 1b. The side surfaces 1c and 1d each have, for example, a rectangular shape when viewed in the direction orthogonal to the side surfaces 1c and 1d. The scintillator 1 has, for example, a trapezoidal shape when viewed in the third direction D3. The scintillator 1 has a rectangular shape when viewed in the first direction D1 and the second direction D2. The first direction D1 is a longitudinal direction of the scintillator 1.

In the present modification example, at least one of the side surfaces 1e and 1f and the end surfaces 1a and 1b may include a rough surface. The side surfaces 1c and 1d include, for example, mirror surfaces. When viewed in the second direction D2, the photodetection region 23 has an outline shape corresponding to an outline shape of the side surface 1c. In the present modification example, the outline shape of the side surface 1c is a rectangular shape when viewed in the second direction D2. The photodetection region 23 has a rectangular outline shape corresponding to the outline shape of the side surface 1c.

When viewed in the third direction D3, the end surfaces 1a and 1b are inclined relative to the second direction D2 so that a scintillation light tends not to be totally reflected toward the side surface 1c. Therefore, a scintillation light incident on the end surface 1a is reflected by the end surface 1a and then is easily incident on the side surface 1c. A scintillation light incident on the end surface 1b is reflected by the end surface 1b and then is easily incident on the side surface 1c.

Figure 12:
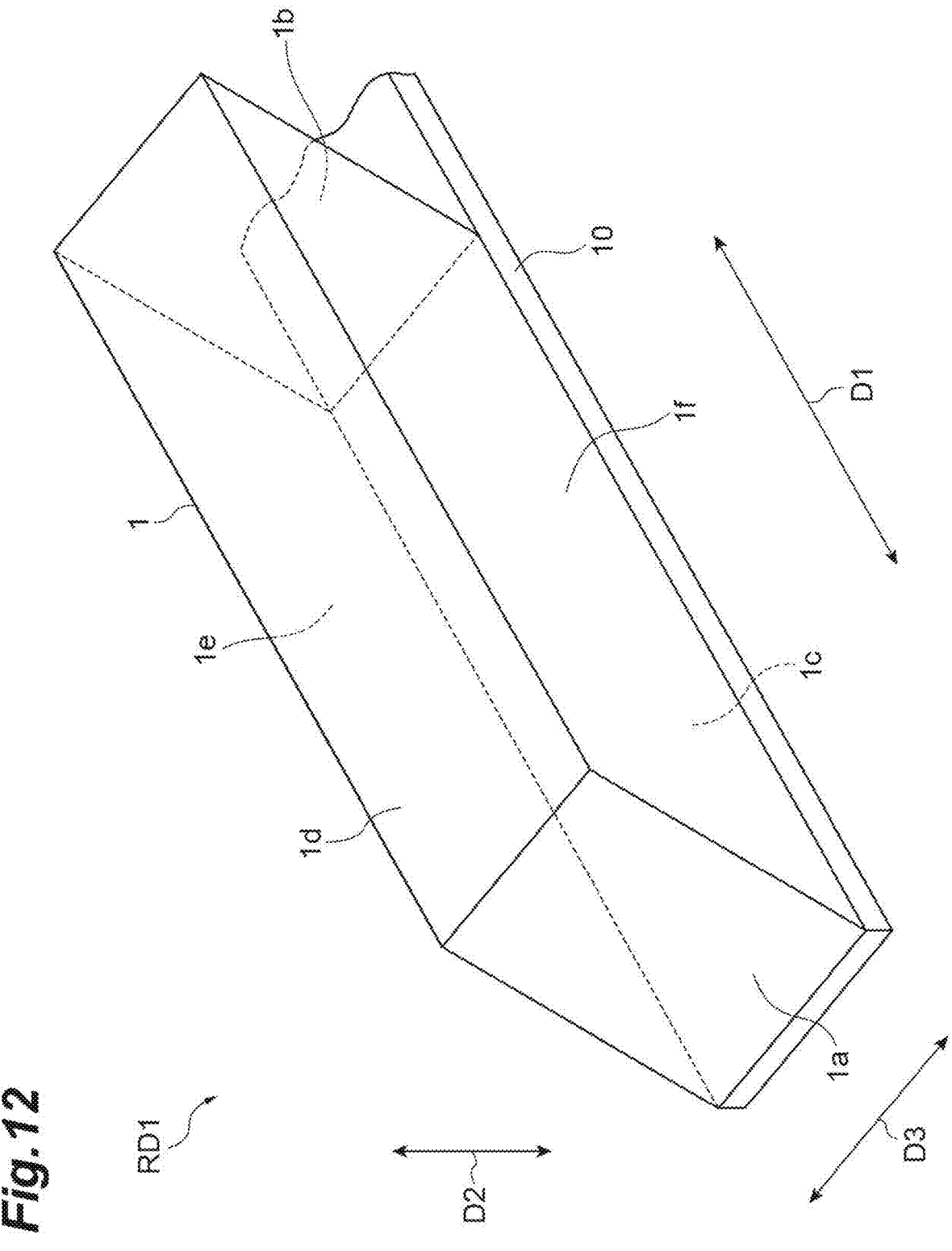
FIG. 12 is a perspective view illustrating a radiation detector according to a third modification example of the first embodiment.
Figure 13:
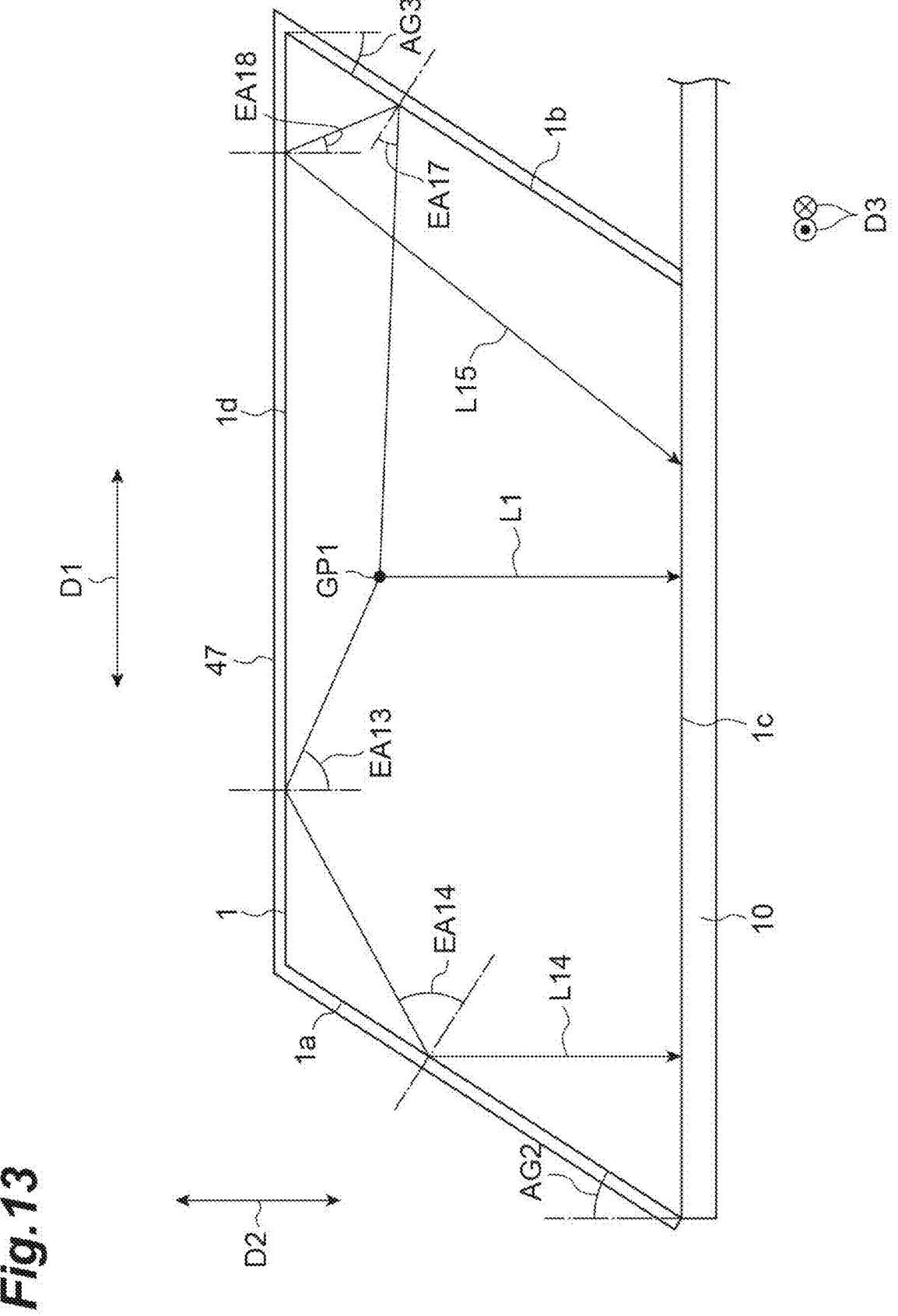
FIG. 13 is a view illustrating paths of some scintillation lights.

A third modification example of the radiation detector RD1 according to the first embodiment will be described with reference to FIGS. 12 and 13. FIG. 12 is a perspective view illustrating a radiation detector RD1 according to the third modification example of the first embodiment. FIG. 13 is a view illustrating paths of some scintillation lights. FIG. 13 illustrates the paths of some scintillation lights when the scintillator 1 is viewed in the third direction D3. The radiation detector RD1 according to the present modification example has the same configuration as the radiation detector RD1 according to the first embodiment except for a configuration of the scintillator 1.

The scintillator 1 according to the present modification example includes a pair of end surfaces 1a and 1b opposing each other in the first direction D1, a pair of side surfaces 1c and 1d opposing each other in the second direction D2, and a pair of side surfaces 1e and 1f opposing each other in the third direction D3. The end surfaces 1a and 1b, the side surfaces 1c and 1d, and the side surfaces 1e and 1f include outer surfaces of the scintillator 1. In the present modification example, unlike the first embodiment, the end surfaces 1a and 1b are inclined relative to the second direction D2. That is, the pair of end surfaces 1a and 1b includes one of the end surfaces 1a and 1b inclined relative to the second direction D2. The end surfaces 1a and 1b are also inclined relative to the first direction D1. When the side surface 1f is viewed in the third direction D3, an angle AG2 formed by the end surface 1a relative to the second direction D2 is, for example, 10 to 80 degrees in a clockwise direction. When the side surface 1f is viewed in the third direction D3, an angle AG3 formed by the end surface 1b relative to the second direction D2 is, for example, 10 to 80 degrees in a clockwise direction. The side surfaces 1e and 1f have, for example, a parallelogrammatic shape when viewed in the third direction D3. A length of the side surface 1d in the first direction D1 is substantially equal to a length of the side surface 1c in the first direction D1. The end surfaces 1a and 1b each have, for example, a rectangular shape when viewed in the direction orthogonal to the end surfaces 1a and 1b. The side surfaces 1c and 1d each have, for example, a rectangular shape when viewed in the direction orthogonal to the side surfaces 1c and 1d. The scintillator 1 has, for example, a parallelogrammatic shape when viewed in the third direction D3. The scintillator 1 has a rectangular shape when viewed in the first direction D1 and the second direction D2. The first direction D1 is a longitudinal direction of the scintillator 1.

In the present modification example, at least one of the side surfaces 1e and 1f and the end surfaces 1a and 1b may include a rough surface. At least one of the side surfaces 1e and 1f may include a rough surface. The end surfaces 1a and 1b may not include a rough surface. The side surfaces 1c and 1d include, for example, mirror surfaces. When viewed in the second direction D2, the photodetection region 23 has an outline shape corresponding to an outline shape of the side surface 1c. In the present modification example, the outline shape of the side surface 1c is a rectangular shape when viewed in the second direction D2. The photodetection region 23 has a rectangular outline shape corresponding to the outline shape of the side surface 1c.

As illustrated in FIG. 13, the scintillation light includes, for example, the light L1 directly incident on the side surface 1c from the generation point GP1. The scintillation light includes a light L14 in addition to light L1. The light L14 is first incident on the side surface 1d at the incidence angle EA13, is totally reflected by the side surface 1d, and then is incident on the end surface 1a at an incidence angle EA14. The end surface 1a of the present modification example has the same inclination as the end surface 1a of the first modification example of the first embodiment (see FIG. 10). The light L14 travels through the same path as the light L12 of the first modification example of the first embodiment. Therefore, the light L14 is easily incident on the side surface 1c. The light L14 is emitted from the side surface 1c and is detected by the semiconductor photodetector 10. The light reflectors 47 are disposed on the end surfaces 1a and 1b and the side surface 1d.

The scintillation light includes, for example, a light L15. The light L15 is first incident on the end surface 1b at an incidence angle EA17. In the present modification example, the end surface 1b is inclined relative to the second direction D2. The light L15 is totally reflected by the end surface 1b. The light L15 reflected by the end surface 1b is incident on the side surface 1d at an incidence angle EA18. The light L15 is totally reflected by the side surface 1d and is incident on the side surface 1c. The end surface 1b is inclined relative to the second direction D2 so that the light L15 is easily incident on the side surface 1c. The light L15 is emitted from the side surface 1c and is detected by the semiconductor photodetector 10.

Figure 14:
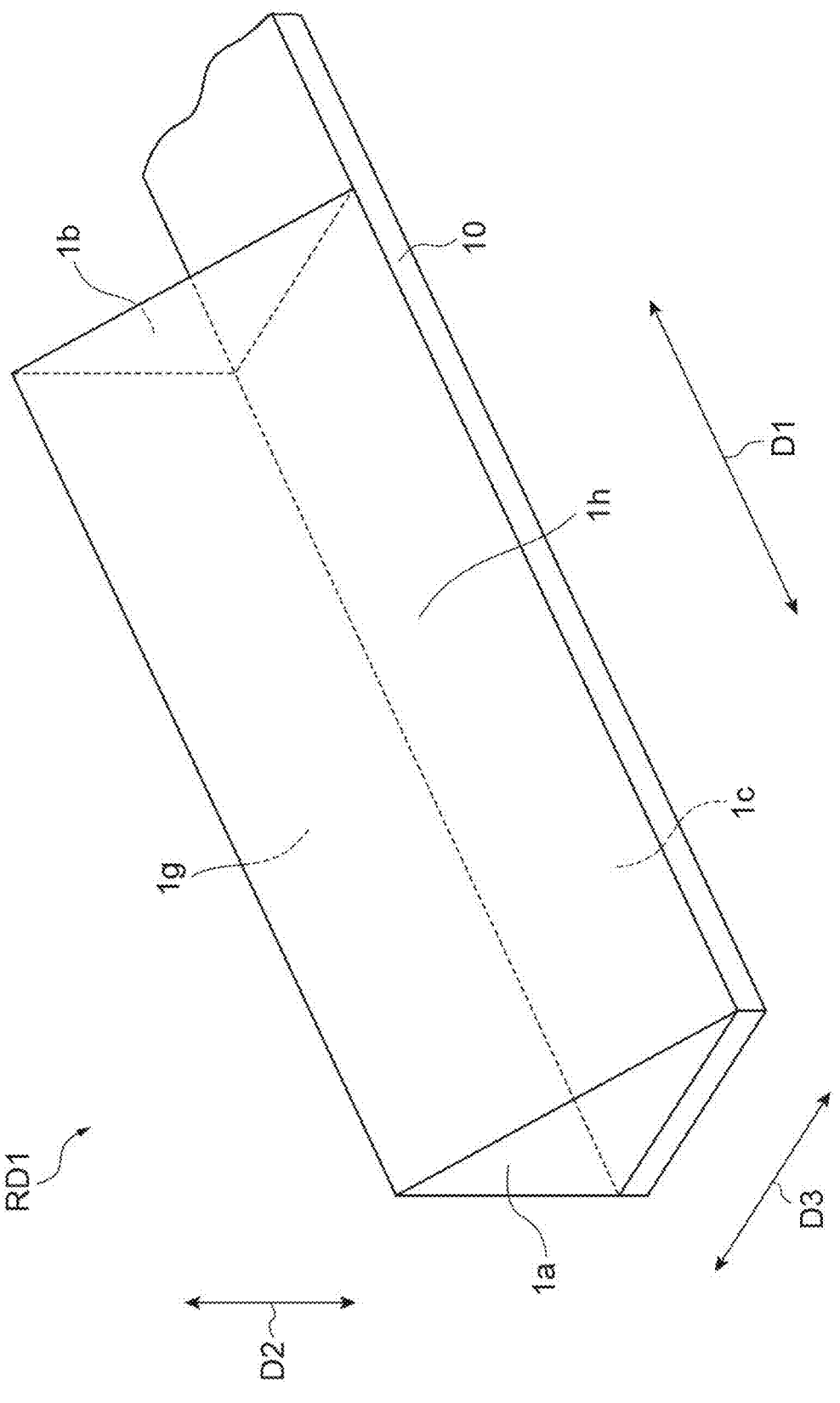
FIG. 14 is a perspective view illustrating a radiation detector according to a fourth modification example of the first embodiment.
Figure 15:
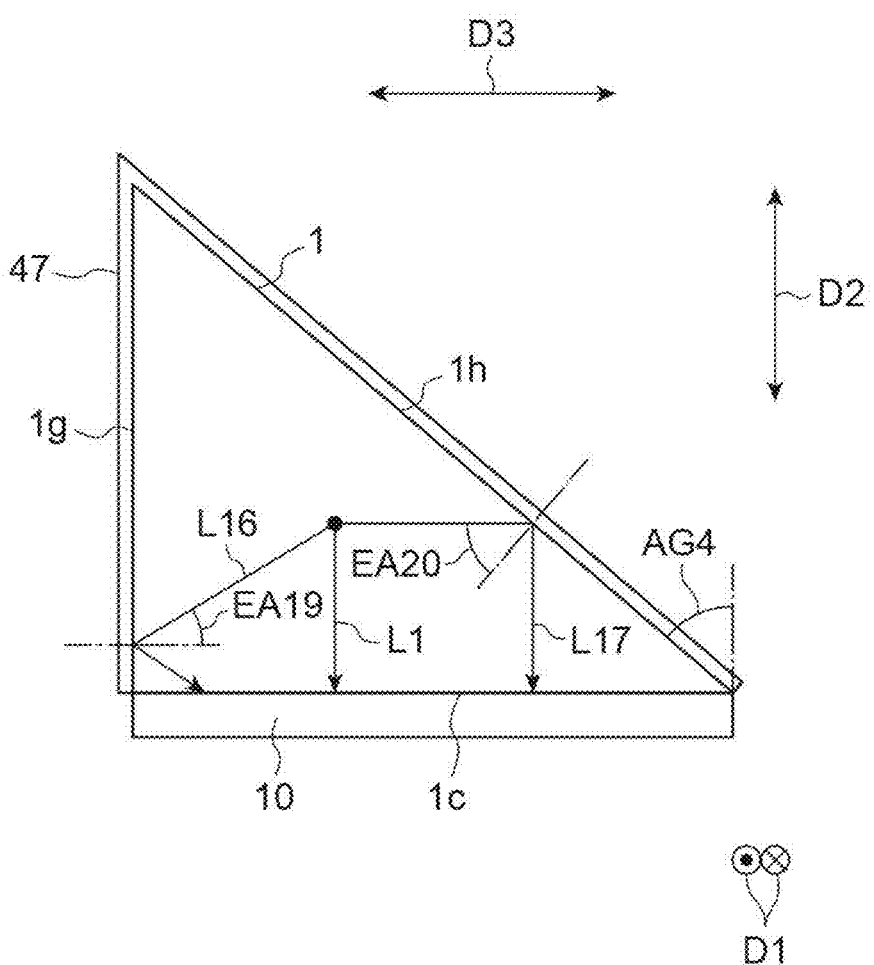
FIG. 15 is a view illustrating paths of some scintillation lights.

A fourth modification example of the radiation detector RD1 according to the first embodiment will be described with reference to FIGS. 14 and 15. FIG. 14 is a perspective view illustrating a radiation detector RD1 according to the fourth modification example of the first embodiment. FIG. 15 is a view illustrating paths of some scintillation lights. FIG. 15 illustrates the paths of some scintillation lights when the scintillator 1 is viewed in the first direction D1. The radiation detector RD1 according to the present modification example has the same configuration as the radiation detector RD1 according to the first embodiment except for a configuration of the scintillator 1.

The scintillator 1 according to the present modification example includes a pair of end surfaces 1a and 1b opposing each other in the first direction D1 and side surfaces 1c, 1g, and 1h extending in the first direction D1 to couple the end surfaces 1a and 1b. The end surfaces 1a and 1b and the side surfaces 1c, 1g, and 1h include outer surfaces of the scintillator 1. The end surfaces 1a and 1b define both end surfaces of the scintillator 1 in the first direction D1. In the present modification example, the end surfaces 1a and 1b extend in the second direction D2 and the third direction D3. The side surfaces 1c and 1g are adjacent to each other. The side surfaces 1c and 1h are adjacent to each other. The side surfaces 1g and 1h are adjacent to each other. The first direction D1 is a longitudinal direction of the scintillator 1. In the present modification example, a direction perpendicular to the side surface 1c coincides with the second direction D2, and a direction parallel to the side surface 1c coincides with the third direction D3. In the present embodiment and the modification example according to the present embodiment, for example, when the side surface 1c includes one side surface, the side surfaces 1g and 1h include other side surfaces.

When viewed in the first direction D1, the side surface 1g extends, for example, in the second direction D2. When viewed in the first direction D1, the side surface 1h is inclined relative to the third direction D3, for example. When the end surface 1a is viewed in the first direction D1, an angle AG4 formed by the side surface 1h relative to the second direction D2 is, for example, 10 to 80 degrees in a counterclockwise direction. The end surfaces 1a and 1b have, for example, a triangular shape when viewed in the first direction D1. The side surfaces 1c, 1g, and 1h each have, for example, a rectangular shape when viewed in the direction orthogonal to the side surfaces 1c, 1g, and 1h. The scintillator 1 has, for example, a triangular shape when viewed in the first direction D1. The scintillator 1 has, for example, a rectangular shape when viewed in the second direction D2 and the third direction D3.

In the present modification example, at least one of the side surfaces 1g and 1h and the end surfaces 1a and 1b may include a rough surface. At least one of the side surface 1g and the end surfaces 1a and 1b may include a rough surface. The side surface 1h may not include a rough surface. At least one of the end surfaces 1a and 1b may include a rough surface. All of the side surface 1g and the end surfaces 1a and 1b may include rough surfaces. The side surface 1c includes, for example, a mirror surface. The side surface 1h is inclined relative to the second direction D2 so that a scintillation light tends not to be totally reflected toward the side surface 1c. Of scintillation lights, a light incident on the side surface 1h and reflected by the side surface 1h tends not to be incident on the side surface 1c, for example. When viewed in the second direction D2, the photodetection region 23 has an outline shape corresponding to an outline shape of the side surface 1c. In the present modification example, the outline shape of the side surface 1c is, for example, a rectangular shape when viewed in the second direction D2. The photodetection region 23 has a rectangular outline shape corresponding to the outline shape of the side surface 1c.

A length of the scintillator 1 in the first direction D1 is longer than a length of the scintillator 1 in the second direction D2. A length of the side surface 1c in the first direction D1 is longer than a width of the side surface 1c in the third direction D3. The length of the scintillator 1 in the first direction D1 is, for example, about 20 mm. The length of the scintillator 1 in the second direction D2 is, for example, about 4 mm. A length of the scintillator 1 in the third direction D3 is, for example, about 4 mm.

As illustrated in FIG. 15, the scintillation light includes, for example, the light L1 directly incident on the side surface 1c from the generation point GP1. The scintillation lights include a light L16 in addition to the light L1. The light L16 is first incident on the side surface 1g at the incidence angle EA19, is totally reflected by the side surface 1g, and then is incident on the side surface 1c. The light L16 is emitted from the side surface 1c and is detected by the semiconductor photodetector 10.

The scintillation light includes, for example, a light L17. The light L17 is first incident on the side surface 1h at an incidence angle EA20, is reflected by the side surface 1h, and then is incident on the side surface 1c. The side surface 1h is inclined relative to the second direction D2. Therefore, the light L17 is totally reflected by the side surface 1h and is incident on the side surface 1c. The side surface 1h is inclined relative to the second direction D2 so that the light L17 tends not to be totally reflected toward the side surface 1c. The light L17 is emitted from the side surface 1c and is detected by the semiconductor photodetector 10.

Figure 16:
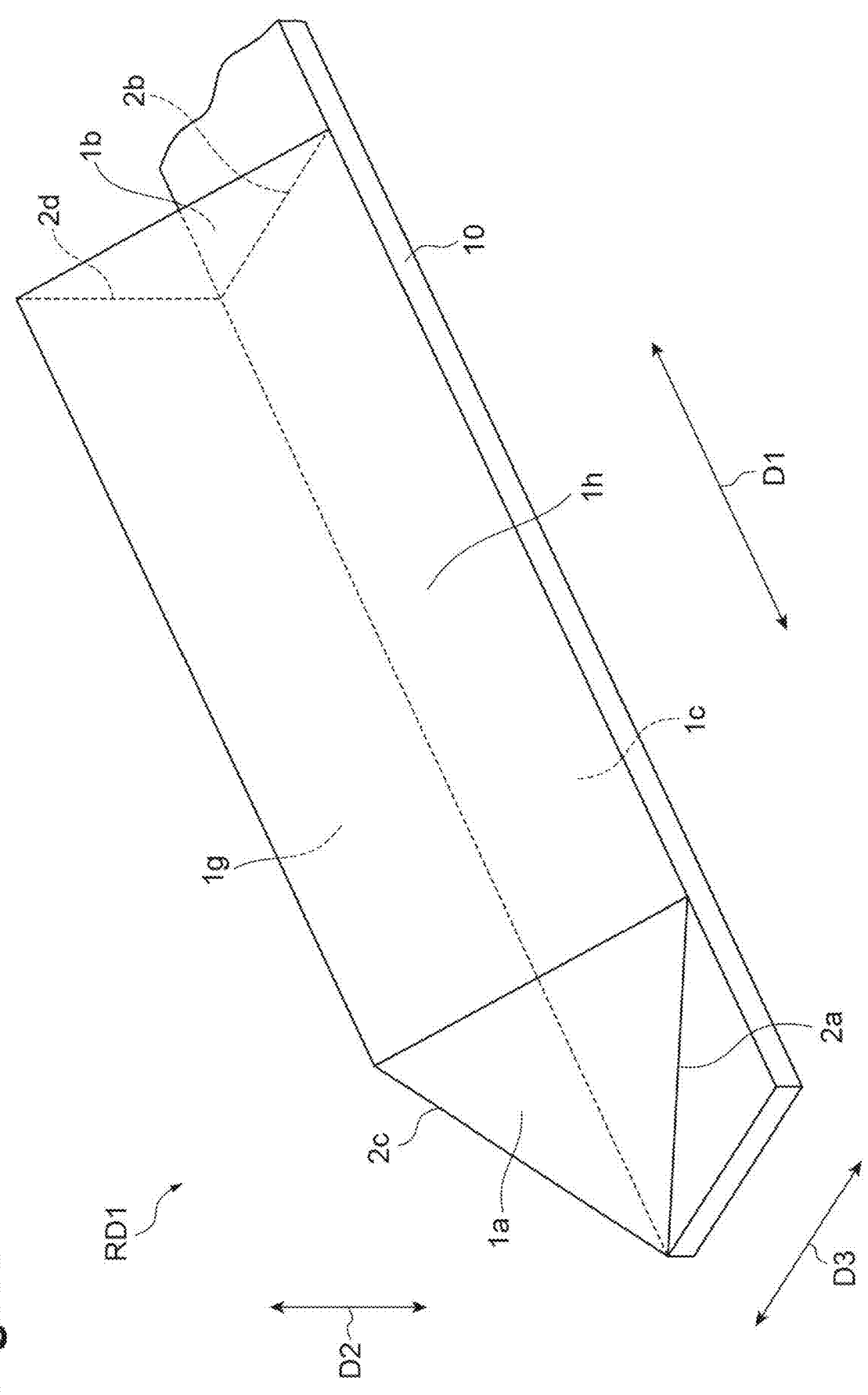
FIG. 16 is a perspective view illustrating a radiation detector according to a fifth modification example of the first embodiment.
Figure 17:
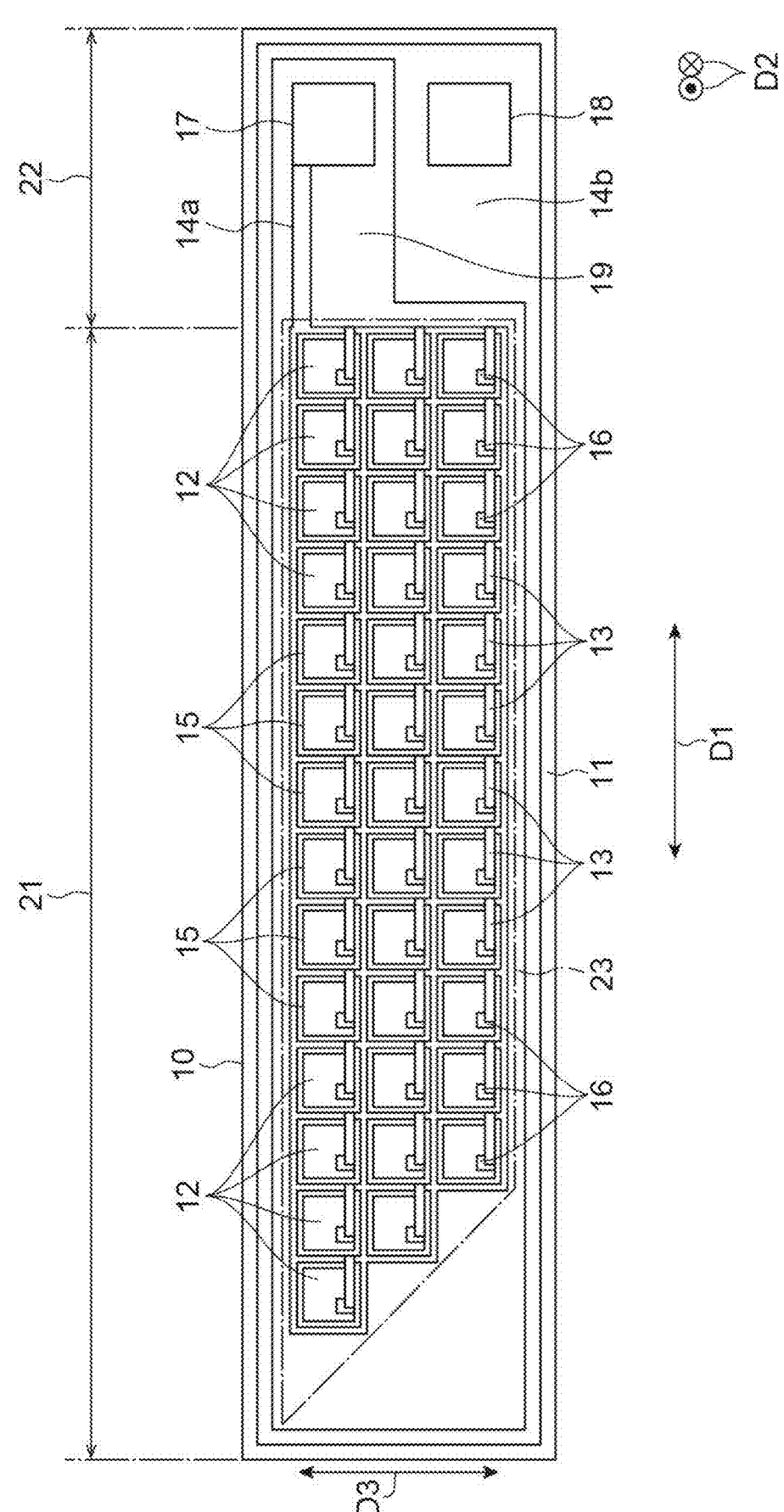
FIG. 17 is a plan view illustrating a semiconductor photodetector.

A fifth modification example of the radiation detector RD1 according to the first embodiment will be described with reference to FIGS. 16 and 17. FIG. 16 is a perspective view illustrating a radiation detector RD1 according to the fifth modification example of the first embodiment. FIG. 17 is a plan view illustrating a semiconductor photodetector. The radiation detector RD1 according to the present modification example has the same configuration as the radiation detector RD1 according to the first embodiment except for configurations of the scintillator 1 and the photodetection region 23.

As illustrated in FIG. 16, the scintillator 1 according to the present modification example includes a pair of end surfaces 1a and 1b opposing each other in the first direction D1 and side surfaces 1c, 1g, and 1h extending in the first direction D1 to couple the end surfaces 1a and 1b. The end surfaces 1a and 1b and the side surfaces 1c, 1g, and 1h include outer surfaces of the scintillator 1. The end surfaces 1a and 1b define both end surfaces of the scintillator 1 in the first direction D1. In the present modification example, unlike the fourth modification example of the first embodiment, the end surface 1a is inclined relative to the second direction D2. That is, the pair of end surfaces 1a and 1b includes one end surface 1a inclined relative to the second direction D2. The end surface 1a is also inclined relative to the first direction D1. The end surface 1b extends in the second direction D2. The side surfaces 1c and 1g are adjacent to each other. The side surfaces 1c and 1h are adjacent to each other. The side surfaces 1g and 1h are adjacent to each other. The first direction D1 is a longitudinal direction of the scintillator 1. In the present modification example, a direction perpendicular to the side surface 1c coincides with the second direction D2, and a direction parallel to the side surface 1c coincides with the third direction D3.

When viewed in the first direction D1, the side surface 1g extends, for example, in the second direction D2. When the end surface 1a is viewed in the first direction D1, the side surface 1h forms, for example, an angle of 10 to 80 degrees in a counterclockwise direction relative to the second direction D2. The end surfaces 1a and 1b have, for example, a triangular shape when viewed in the first direction D1. The side surfaces 1c and 1h each have, for example, a rectangular shape when viewed in the direction orthogonal to the side surfaces 1c and 1h. The scintillator 1 has, for example, a triangular shape when viewed in the first direction D1.

Of a pair of edges 2a and 2b of the side surface 1c in the first direction D1, the edge 2a on the end surface 1a side forms, for example, an angle of 10 to 80 degrees in a counterclockwise direction relative to the third direction D3, when viewed in the second direction D2. When viewed in the second direction D2, the edge 2b on the end surface 1b side extends, for example, in the third direction D3.

Of a pair of edges 2c and 2d of the side surface 1g in the first direction D1, the edge 2d on the end surface 1b side extends in the second direction D2, when viewed in the third direction D3. When the side surface 1g is viewed in the third direction D3, the edge 2c on the end surface 1a side forms, for example, an angle of 10 to 80 degrees in a counterclockwise direction relative to the second direction D2.

A length of the scintillator 1 in the first direction D1 is longer than a length of the scintillator 1 in the second direction D2. A length of the side surface 1c in the first direction D1 is longer than a width of the side surface 1c in the third direction D3. At least one of the side surfaces 1g and 1h and the end surfaces 1a and 1b may include a rough surface. At least one of the side surface 1g and the end surface 1b may include a rough surface. The side surface 1h and the end surface 1b may not include a rough surface. The side surface 1c includes, for example, a mirror surface.

As illustrated in FIG. 17, when viewed in the second direction D2, the photodetection region 23 has an outline shape corresponding to an outline shape of the side surface 1c. The photodetection sections 15 are all disposed such that the photodetection region 23 has the outline shape corresponding to the outline shape of the side surface 1c when viewed in the second direction D2.

In the present modification example, the end surface 1a is inclined relative to both the second direction D2 and the first direction D1 so that a scintillation light tends not to be totally reflected toward the side surface 1c. Of scintillation lights, a light incident on the end surface 1a and reflected by the end surface 1*a* tends to be incident on the side surface 1*c*. The side surface 1*h* is inclined relative to the second direction D2 so that a scintillation light tends to be totally reflected toward the side surface 1*c*. Of scintillation lights, a light incident on the side surface 1*h* and reflected by the side surface 1*h* tends to be incident on the side surface 1*c*.

Figure 18:
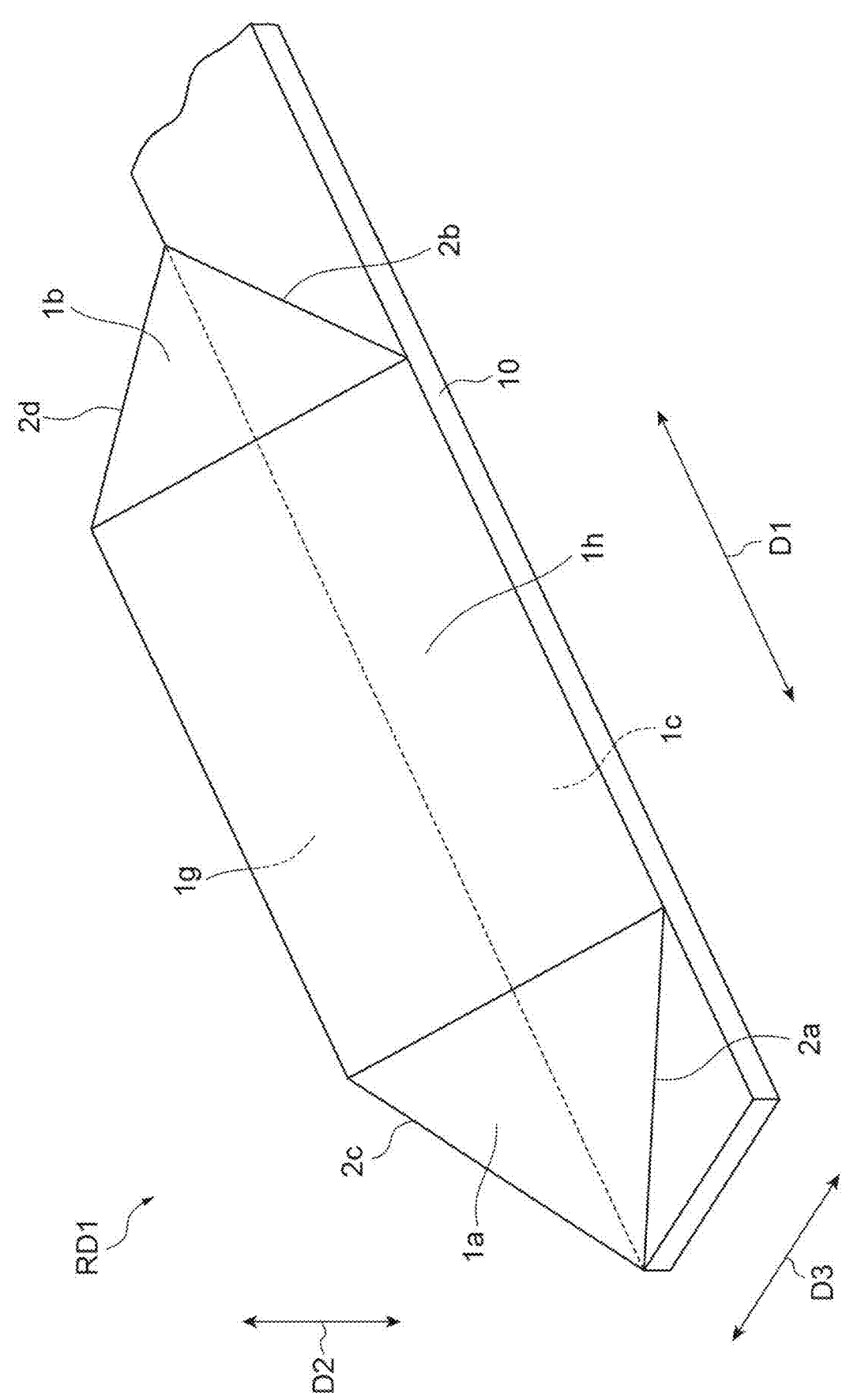
FIG. 18 is a perspective view illustrating a radiation detector according to a sixth modification example of the first embodiment.
Figure 19:
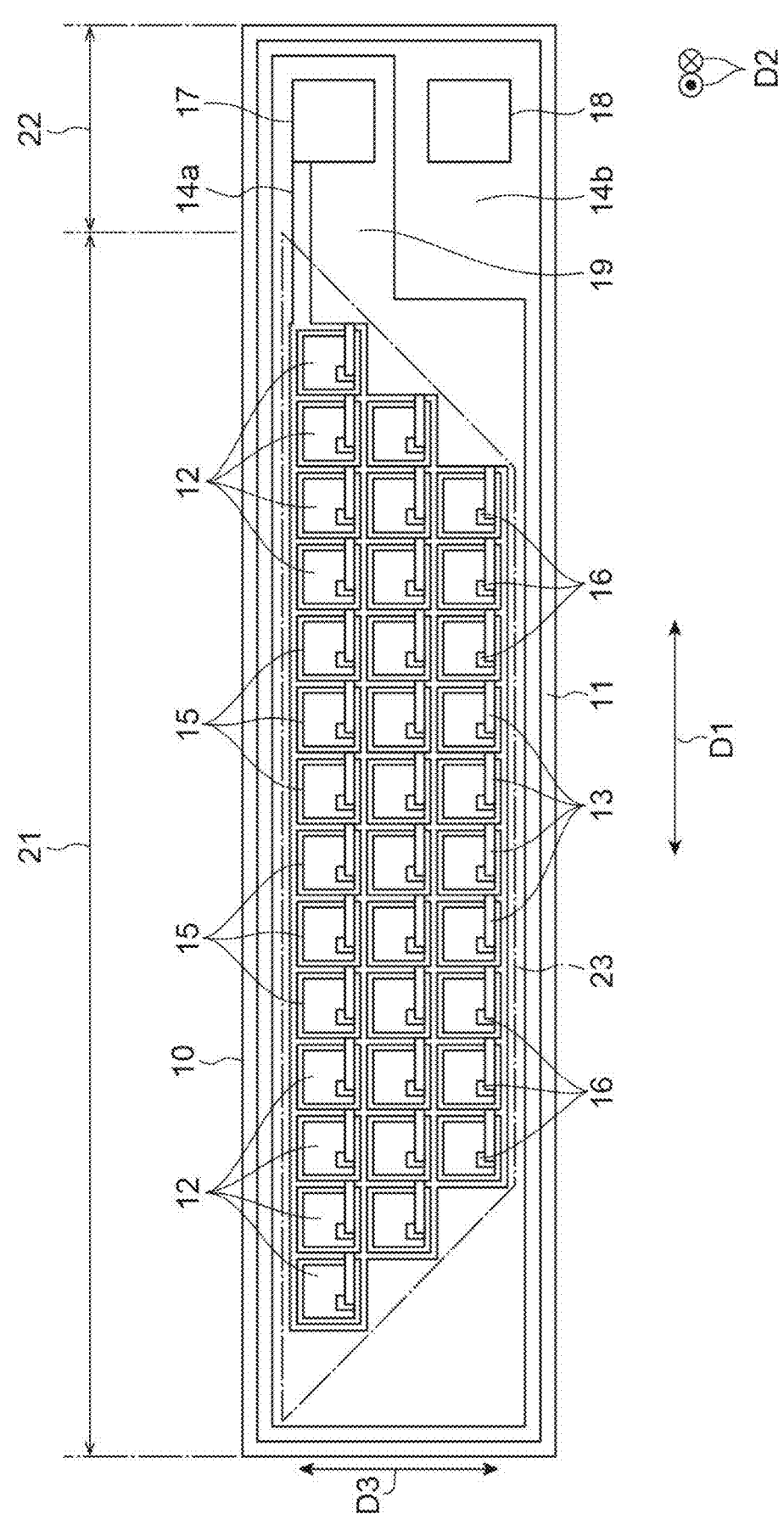
FIG. 19 is a plan view illustrating a semiconductor photodetector.

A sixth modification example of the radiation detector RD1 according to the first embodiment will be described with reference to FIGS. 18 and 19. FIG. 18 is a perspective view illustrating a radiation detector RD1 according to the sixth modification example of the first embodiment. FIG. 19 is a plan view illustrating a semiconductor photodetector. The radiation detector RD1 according to the present modification example has the same configuration as the radiation detector RD1 according to the first embodiment except for configurations of the scintillator 1 and the photodetection region 23.

The scintillator 1 according to the present modification example includes a pair of end surfaces 1*a* and 1*b* opposing each other in the first direction D1 and side surfaces 1*c*, 1*g*, and 1*h* extending in the first direction D1 to couple the end surfaces 1*a* and 1*b*. The end surfaces 1*a* and 1*b* and the side surfaces 1*c*, 1*g*, and 1*h* include outer surfaces of the scintillator 1. The end surfaces 1*a* and 1*b* define both end surfaces of the scintillator 1 in the first direction D1. In the present modification example, the end surfaces 1*a* and 1*b* are inclined relative to the second direction D2. That is, the pair of end surfaces 1*a* and 1*b* includes one of the end surfaces 1*a* and 1*b* inclined relative to the second direction D2. The side surfaces 1*c* and 1*g* are adjacent to each other. The side surfaces 1*c* and 1*h* are adjacent to each other. The side surfaces 1*g* and 1*h* are adjacent to each other. The first direction D1 is a longitudinal direction of the scintillator 1. In the present modification example, a direction perpendicular to the side surface 1*c* coincides with the second direction D2, and a direction parallel to the side surface 1*c* coincides with the third direction D3.

When viewed in the first direction D1, the side surface 1*g* extends, for example, in the second direction D2. When the end surface 1*a* is viewed in the first direction D1, the side surface 1*h* forms, for example, an angle of 10 to 80 degrees in a counterclockwise direction relative to the second direction D2. The end surfaces 1*a* and 1*b* each have, for example, a triangular shape when viewed in the direction orthogonal to the end surfaces 1*a* and 1*b*. The side surface 1*h* has, for example, a rectangular shape when viewed in a direction orthogonal to this surface. The scintillator 1 has, for example, a triangular shape when viewed in the first direction D1.

Of a pair of edges 2*a* and 2*b* of the side surface 1*c* in the first direction D1, the edge 2*a* on the end surface 1*a* side forms, for example, an angle of 10 to 80 degrees in a counterclockwise direction relative to the third direction D3, when viewed in the second direction D2. When viewed in the second direction D2, the edge 2*b* on the end surface 1*b* side forms, for example, an angle of 10 to 80 degrees in a clockwise direction relative to the third direction D3.

When the side surface 1*g* is viewed in the third direction D3, of the pair of edges 2*c* and 2*d* of the side surface 1*g* in the first direction D1, the edge 2*c* on the end surface 1*a* side forms, for example, an angle of 10 to 80 degrees in a counterclockwise direction relative to the second direction D2. When the side surface 1*g* is viewed in the third direction D3, the edge 2*d* on the end surface 1*b* side forms, for example, an angle of 10 to 80 degrees in a clockwise direction relative to the second direction D2. When viewed in the third direction D3, the side surface 1*g* has, for example, a trapezoidal shape, and a distance between the edge 2*c* and the edge 2*d* decreases as a distance from the side surface 1*c* increases. The side surface 1*h* has, for example, a rectangular shape when viewed in the third direction D3.

A length of the scintillator 1 in the first direction D1 is longer than a length of the scintillator 1 in the second direction D2. In the present modification example, a length of the side surface 1*c* in the first direction D1 is longer than a width of the side surface 1*c* in the third direction D3. When viewed in the second direction D2, the side surface 1*c* has, for example, a trapezoidal shape, and a distance between the edge 2*a* and the edge 2*b* decreases as a distance from the side surface 1*g* increases.

As illustrated in FIG. 19, when viewed in the second direction D2, the photodetection region 23 has an outline shape corresponding to an outline shape of the side surface 1*c*. The photodetection sections 15 are all disposed such that the photodetection region 23 has the outline shape corresponding to the outline shape of the side surface 1*c* when viewed in the second direction D2. In the present modification example, the outline shape of the side surface 1*c* is, for example, a trapezoidal shape when viewed in the second direction D2. The photodetection region 23 has a trapezoidal outline shape corresponding to the outline shape of the side surface 1*c*.

In the present modification example, the end surfaces 1*a* and 1*b* are inclined relative to both the second direction D2 and the first direction D1 so that a scintillation light tends to be totally reflected toward the side surface 1*c*. Of scintillation lights, a light incident on the end surface 1*a* and reflected by the end surface 1*a* tends to be incident on the side surface 1*c*. The light incident on the end surface 1*b* and reflected by the end surface 1*b* tends to be incident on the side surface 1*c*. The side surface 1*h* is inclined relative to the second direction D2 so that a scintillation light tends to be totally reflected toward the side surface 1*c*. Of scintillation lights, a light incident on the side surface 1*h* and reflected by the side surface 1*h* tends to be incident on the side surface 1*c*. In the present modification example, at least one of the side surfaces 1*g* and 1*h* and the end surfaces 1*a* and 1*b* may include a rough surface. Only the side surface 1*g* may include a rough surface. The side surface 1*h* and the end surfaces 1*a* and 1*b* may not include rough surfaces. The side surface 1*c* includes, for example, a mirror surface.

Figure 20:
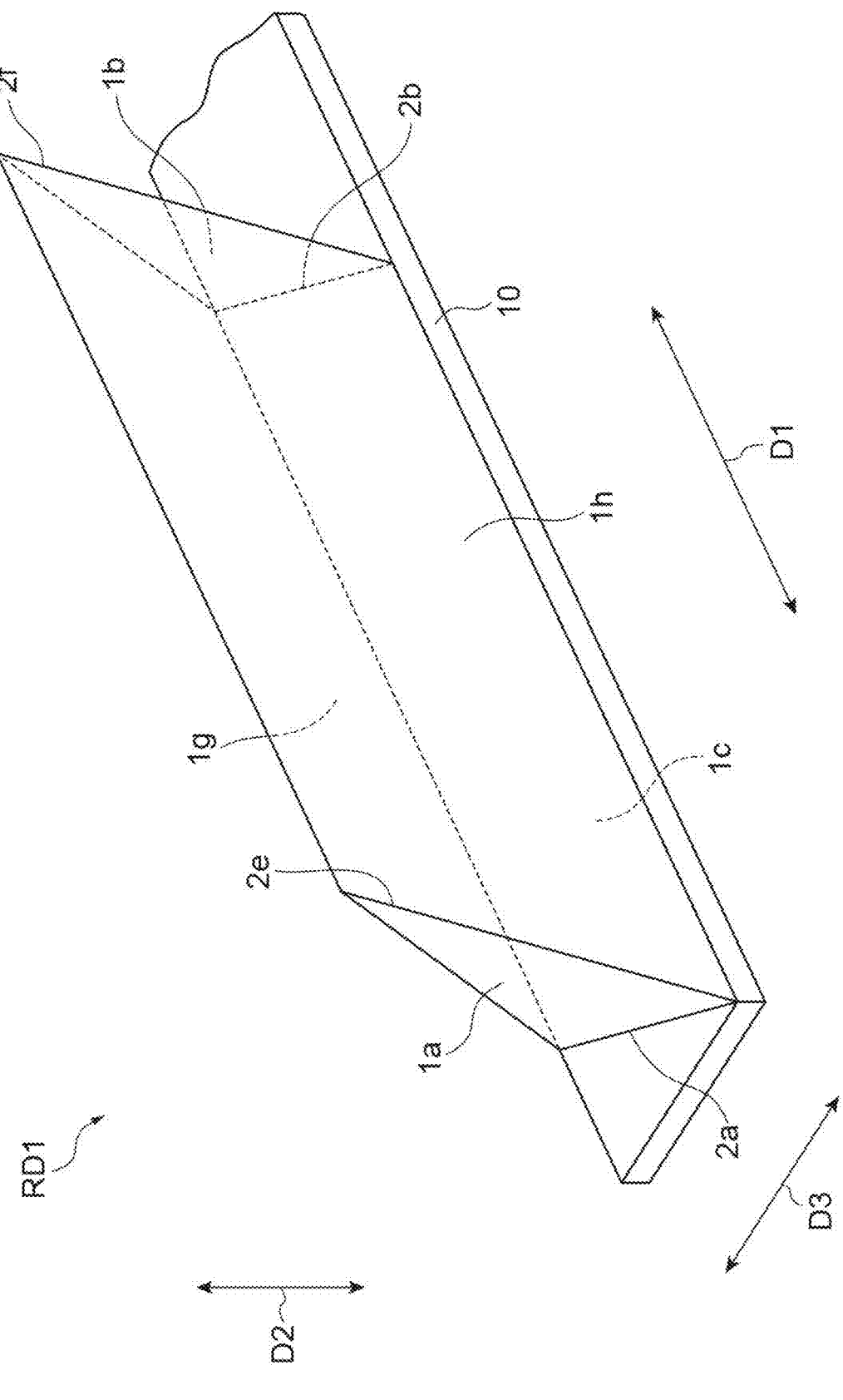
FIG. 20 is a perspective view illustrating a radiation detector according to a seventh modification example of the first embodiment.
Figure 21:
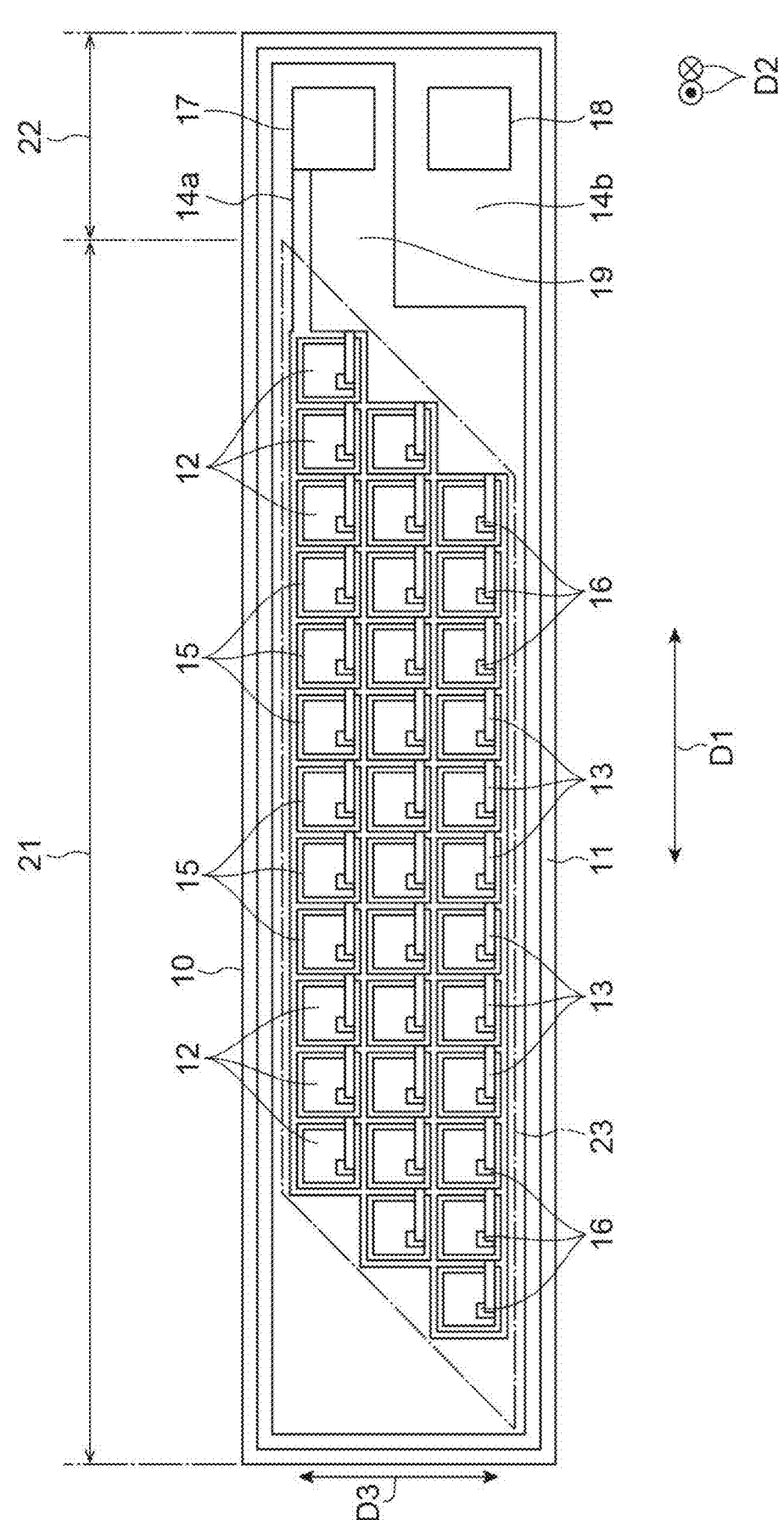
FIG. 21 is a plan view illustrating a semiconductor photodetector.

A seventh modification example of the radiation detector RD1 according to the first embodiment will be described with reference to FIGS. 20 and 21. FIG. 20 is a perspective view illustrating a radiation detector RD1 according to the seventh modification example of the first embodiment. FIG. 21 is a plan view illustrating a semiconductor photodetector. The radiation detector RD1 according to the present modification example has the same configuration as the radiation detector RD1 according to the first embodiment except for configurations of the scintillator 1 and the photodetection region 23.

The scintillator 1 according to the present modification example includes a pair of end surfaces 1*a* and 1*b* opposing each other in the first direction D1 and side surfaces 1*c*, 1*g*, and 1*h* extending in the first direction D1 to couple the end surfaces 1*a* and 1*b*. The end surfaces 1*a* and 1*b* and the side surfaces 1*c*, 1*g*, and 1*h* include outer surfaces of the scintillator 1. The end surfaces 1*a* and 1*b* define both end surfaces of the scintillator 1 in the first direction D1. The end surfaces 1*a* and 1*b* are inclined relative to the second direction D2. The pair of end surfaces 1*a* and 1*b* includes one of the end surfaces 1*a* and 1*b* inclined relative to the second direction D2. The end surfaces 1*a* and 1*b* are also inclined relative to the first direction D1. The side surfaces 1c and 1g are adjacent to each other. The side surfaces 1c and 1h are adjacent to each other. The side surfaces 1g and 1h are adjacent to each other. The first direction D1 is a longitudinal direction of the scintillator 1. In the present modification example, a direction perpendicular to the side surface 1c coincides with the second direction D2, and a direction parallel to the side surface 1c coincides with the third direction D3.

When viewed in the first direction D1, the side surface 1h extends, for example, in the second direction D2. When the end surface 1a is viewed in the first direction D1, the side surface 1g forms, for example, an angle of 10 to 80 degrees in a clockwise direction relative to the second direction D2. The end surfaces 1a and 1b have, for example, a triangular shape when viewed in the first direction D1. The scintillator 1 has, for example, a triangular shape when viewed in the first direction D1.

Of a pair of edges 2a and 2b of the side surface 1c in the first direction D1, the edge 2a on the end surface 1a side forms, for example, an angle of 10 to 80 degrees in a clockwise direction relative to the third direction D3, when viewed in the second direction D2. When viewed in the second direction D2, the edge 2b on the end surface 1b side forms, for example, an angle of 10 to 80 degrees in a clockwise direction relative to the third direction D3.

As illustrated in FIG. 21, when viewed in the second direction D2, the photodetection region 23 has an outline shape corresponding to an outline shape of the side surface 1c. The photodetection sections 15 are all disposed such that the photodetection region 23 has the outline shape corresponding to the outline shape of the side surface 1c when viewed in the second direction D2. In the present modification example, the outline shape of the side surface 1c is, for example, a parallelogrammatic shape when viewed in the second direction D2. The photodetection region 23 has a parallelogrammatic outline shape corresponding to the outline shape of the side surface 1c.

When the side surface 1h is viewed in the third direction D3, of a pair of edges 2e and 2f of the side surface 1h in the first direction D1, the edge 2e on the end surface 1a side forms, for example, an angle of 10 to 80 degrees in a clockwise direction relative to the second direction D2. When the side surface 1h is viewed in the third direction D3, the edge 2f on the end surface 1b side forms, for example, an angle of 10 to 80 degrees in a clockwise direction relative to the second direction D2. The side surface 1h has, for example, a parallelogrammatic shape when viewed in the third direction D3. The side surface 1g has, for example, a rectangular shape when viewed in the third direction D3.

A length of the scintillator 1 in the first direction D1 is longer than a length of the scintillator 1 in the second direction D2. In the present modification example, a length of the side surface 1c in the first direction D1 is longer than a width of the side surface 1c in the third direction D3. In the present modification example, the end surfaces 1a and 1b and the side surface 1g are inclined relative to the second direction D2 so that a scintillation light tends to be totally reflected toward the side surface 1c. At least one of the side surfaces 1g and 1h and the end surfaces 1a and 1b may include a rough surface. Only the side surface 1h may include a rough surface. The side surface 1g and the end surfaces 1a and 1b may not include rough surfaces. The side surface 1c includes, for example, a mirror surface.

As described above, the radiation detector RD1 includes the scintillator 1 including the pair of end surfaces 1a and 1b opposing each other in the first direction D1 and the side surface 1c coupling the pair of end surfaces 1a and 1b, the semiconductor photodetector 10 including the semiconductor substrate 11 disposed to oppose the side surface 1c, and the wiring member 30 electrically connected to the semiconductor photodetector 10. The length of the scintillator 1 in the first direction D1 is longer than the length of the scintillator 1 in the second direction D2 orthogonal to the side surface 1c. The length of the side surface 1c in the first direction D1 is longer than the width of the side surface 1c in the third direction D3 orthogonal to both the first direction D1 and the second direction D2. The semiconductor substrate 11 includes the portion 21 covered with the side surface 1c and the portion 22 exposed from the side surface 1c. The portion 21 and the portion 22 are disposed in the first direction D1. The semiconductor photodetector 10 includes the photodetection region 23 disposed in the portion 21, and the electrode 17 and the electrode 18 disposed in the portion 22. The photodetection region 23 includes the plurality of avalanche photodiodes 12 arranged to operate in Geiger mode and the plurality of quenching resistors 13 electrically connected in series with one of the anode or the cathode of the corresponding avalanche photodiode 12 of the plurality of avalanche photodiodes 12. The plurality of quenching resistors 13 are connected in parallel with the electrode 17. The other of the anode or the cathode of each of the plurality of avalanche photodiodes 12 is electrically connected in parallel with the electrode 18. The wiring member 30 includes the conductor electrically connected to the electrode 17 and the conductor connected to the electrode 18.

The radiation detector RD1 includes the scintillator 1 that is longer in the first direction D1 and includes the semiconductor photodetector 10 disposed on the side surface 1c of the scintillator 1. The semiconductor photodetector 10 detects the light from the scintillator 1 that is directly incident on the side surface 1c on which the semiconductor photodetector 10 is disposed. The semiconductor photodetector 10 detects, for example, the scintillation light incident on the side surface 1c after being reflected by the side surface 1d opposing the side surface 1c on which the semiconductor photodetector 10 is disposed. In the radiation detector RD1, the length of the scintillator 1 in the second direction D2 is shorter than the length of the scintillator 1 in the first direction D1. Therefore, the semiconductor photodetector 10 detects, with a small time difference, the scintillation light directly incident on the side surface 1c and the scintillation light incident on the side surface 1c after being reflected by the side surface 1d. As a result, the radiation detector RD1 achieves high time resolution.

The length of the side surface 1c in the first direction D1 is longer than the length of the end surface 1b in the second direction D2, for example. Therefore, for example, as compared with the radiation detector having the configuration in which the semiconductor photodetector 10 is disposed on the end surface 1b, the radiation detector RD1 can receive the scintillation light incident on the side surface 1c at the larger incidence angle EA1.

In the radiation detector RD1, the scintillator 1 has the rectangular shape or the triangular shape when viewed in the first direction D1.

In this configuration, the scintillation light is more reliably incident on the side surface 1c on which the scintillator 1 is disposed. Therefore, the radiation detector RD1 more reliably increases the amount of light detected by the semiconductor photodetector 10.

In the radiation detector RD1, the pair of end surfaces 1a and 1b includes the end surfaces 1a and 1b inclined relative to the second direction D2.

In this configuration, the scintillation light is more reliably incident on the side surface 1c. The number of times of reflection of the scintillation lights by the end surfaces 1a and 1b or the side surfaces 1d, 1e, 1f, 1g, and 1h decreases, and the reflection attenuation of the scintillation lights decreases. Therefore, the radiation detector RD1 more reliably increases the amount of light detected by the semiconductor photodetector 10.

In the radiation detector RD1, the pair of end surfaces 1a and 1b includes the end surfaces 1a and 1b extending in the second direction D2, and the end surfaces 1a and 1b have the triangular wave shape in the cross section.

In this configuration, the scintillation light is still more reliably incident on the side surface 1c. The number of times of reflection of the scintillation lights by the end surfaces 1a and 1b or the side surfaces 1d, 1e, 1f, 1g, and 1h decreases, and the reflection attenuation of the scintillation lights decreases. Therefore, the radiation detector RD1 still more reliably increases the amount of light detected by the semiconductor photodetector 10.

In the configuration in which the end surfaces 1a and 1b have the triangular wave shape in the cross section, the amount of light detected by the semiconductor photodetector 10 is more reliably increased even if the end surfaces 1a and 1b are not inclined relative to the second direction D2. The configuration in which the end surfaces 1a and 1b extend in the second direction D2 decreases the amount of use of the scintillator 1 when the radiation detector RD1 is produced, as compared with the configuration in which the end surfaces 1a and 1b are inclined relative to the second direction D2.

In the radiation detector RD1, the pair of end surfaces 1a and 1b includes the end surfaces 1a and 1b extending in the second direction D2, and the end surfaces 1a and 1b include rough surfaces.

In this configuration, the scintillation light is still more reliably incident on the side surface 1c. The number of times of reflection of the scintillation lights by the end surfaces 1a and 1b or the side surfaces 1d, 1e, 1f, 1g, and 1h decreases, and the reflection attenuation of the scintillation lights decreases. Therefore, the radiation detector RD1 still more reliably increases the amount of light detected by the semiconductor photodetector 10.

In the radiation detector RD1, the scintillator 1 includes the side surfaces 1e, 1f, 1g, and 1h having the triangular wave shape in the cross section, and the side surfaces 1e, 1f, 1g, and 1h couple the pair of end surfaces 1a and 1b and are adjacent to the side surface 1c.

In this configuration, the scintillation light is still more reliably incident on the side surface 1c. Therefore, the radiation detector RD1 still more reliably increases the amount of light detected by the semiconductor photodetector 10.

In the radiation detector RD1, the scintillator 1 includes the side surfaces 1e, 1f, 1g, and 1h that include rough surfaces, and the side surfaces 1e, 1f, 1g, and 1h couple the pair of end surfaces 1a and 1b and are adjacent to the side surface 1c.

In this configuration, the scintillation light is still more reliably incident on the side surface 1c. Therefore, the radiation detector RD1 still more reliably increases the amount of light detected by the semiconductor photodetector 10.

In the radiation detector RD1, when viewed in the second direction D2, the photodetection region 23 has the outline shape corresponding to the outline shape of the side surface 1c.

In this configuration, the photodetection region 23 tends not to be disposed at the position of the semiconductor substrate 11 where no scintillation lights can be detected. Therefore, the radiation detector RD1 suppresses increase in dark count and capacitance in the photodetection region 23. As a result, the radiation detector RD1 reliably improves the time resolution of the semiconductor photodetector 10.

The radiation detector RD1 includes the base 40, the wire 43, and the wire 44. The base 40 is disposed such that the semiconductor substrate 11 is positioned between the base 40 and the scintillator 1 and includes the portion 51 covered with the semiconductor substrate 11 and the portion 52 exposed from the semiconductor substrate 11. The portion 51 and the portion 52 are disposed in the first direction D1. The portion 52 includes the terminal 41 and the terminal 42. The terminal 41, the terminal 42, and the scintillator 1 are disposed in front of the same surface of the base 40. The terminal 41 is electrically connected to the electrode 17 by the wire 43, and the terminal 42 is electrically connected to the electrode 18 by the wire 44.

This configuration increases the mechanical strength of the radiation detector RD1. Therefore, the configuration in which the base 40 is provided reliably achieves the radiation detector RD1 having high mechanical strength.

The radiation detector RD1 includes the resin 45 covering the wire 43 and the wire 44.

In this configuration, the resin 45 protects the wires 43 and 44. Therefore, the wires 43 and 44 tend not to be damaged. As a result, the radiation detector RD1 decreases deterioration of electrical connection between the terminals 41 and 42 and the electrodes 17 and 18.

The radiation detector RD1 includes the light reflector 47. The light reflector 47 is disposed such that the semiconductor substrate 11 is positioned between the light reflector 47 and the scintillator 1.

For example, in the configuration in which the plurality of radiation detectors RD1 are provided, the following effects can be achieved in the case where one radiation detector RD1 includes the light reflector 47. That is, the configuration in which the light reflector 47 of the one radiation detector RD1 and the side surface 1d of another radiation detector RD1 oppose each other in the second direction D2 improves reflectance of the scintillation lights on the side surface 1d of the other radiation detector RD1 even when the light reflector 47 is not disposed on the side surface 1d of the other radiation detector RD1. Therefore, this configuration tends to achieve high time resolution in the case where the plurality of radiation detectors RD1 are provided.

In the configuration in which the radiation detector RD1 includes the base 40, the light reflector 47 is disposed such that the semiconductor substrate 11 and the base 40 are positioned between the light reflector 47 and the scintillator 1.

In this configuration, when the one radiation detector RD1 is disposed with another radiation detector RD1 having the same configuration as the one radiation detector RD1, in the second direction D2, the light reflector 47 disposed on the base 40 of the other radiation detector RD1 improves reflectance of the scintillation lights on the side surface 1d of the one radiation detector RD1. Even in the configuration in which the one radiation detector RD1 does not include the light reflector 47 on the side surface 1d, the side surface 1d of the one radiation detector RD1 has high reflectance of the scintillation light.

In the radiation detector RD1, the wiring member 30 is disposed on the same side as the scintillator 1 relative to the semiconductor substrate 11.

In this configuration, the radiation detector RD1 does not have to include the substrate for connecting the wiring member 30 to the electrodes 17 and 18 through, for example, die bonding. Therefore, the configuration in which the wiring member 30 is disposed on the same side as the scintillator 1 relative to the semiconductor substrate 11 more reliably simplifies the configuration of the radiation detector RD1. This configuration improves the space efficiency of the radiation detector RD1 as compared with a configuration in which the wiring member 30 is disposed on the opposite side of the scintillator 1 relative to the semiconductor substrate 11.

In the radiation detector RD1, at least a part of the wiring member 30 and the scintillator 1 are disposed in front of the same surface of the semiconductor substrate 11.

In this configuration, the space efficiency of the radiation detector RD1 is improved as compared with a configuration in which at least a part of the wiring member 30 and the scintillator 1 are disposed in front of the other surfaces of the semiconductor substrate 11.

In the radiation detector RD1, at least a part of the wiring member 30 and the scintillator 1 are disposed in front of the same surface of the base 40.

In this configuration, the wiring member 30 is easily connected to the electrodes 17 and 18 through die bonding.

In the radiation detector RD1, the thickness of the light reflector 47 is 0.05 to 100 μm.

In this configuration, the light reflector 47 reliably improves reflectance of the scintillation lights on the side surface 1d. Therefore, the configuration in which the light reflector 47 has the above-described thickness reliably simplifies the configuration of the radiation detector RD1.

In the radiation detector RD1, the wiring member 30 and the semiconductor substrate 11 have flexibility. The flexibility of the wiring member 30 is higher than the flexibility of the semiconductor substrate 11.

In this configuration, the vibration of the wiring member 30 tends not to be transmitted to the semiconductor substrate 11. The force from the wiring member 30 tends not to be applied to the semiconductor substrate 11, and the semiconductor substrate 11 tends not to be physically damaged. Therefore, the configuration in which the flexibility of the wiring member 30 is higher than the flexibility of the semiconductor substrate 11 reliably improves the mechanical strength of the radiation detector RD1.

Second Embodiment

A configuration of a radiation detector RD2 according to a second embodiment will be described with reference to FIGS. 22 and 23. In the explanation of the radiation detector RD2, differences from the above-described radiation detector RD1 will be mainly explained, and overlapped explanation is omitted.

Figure 22:
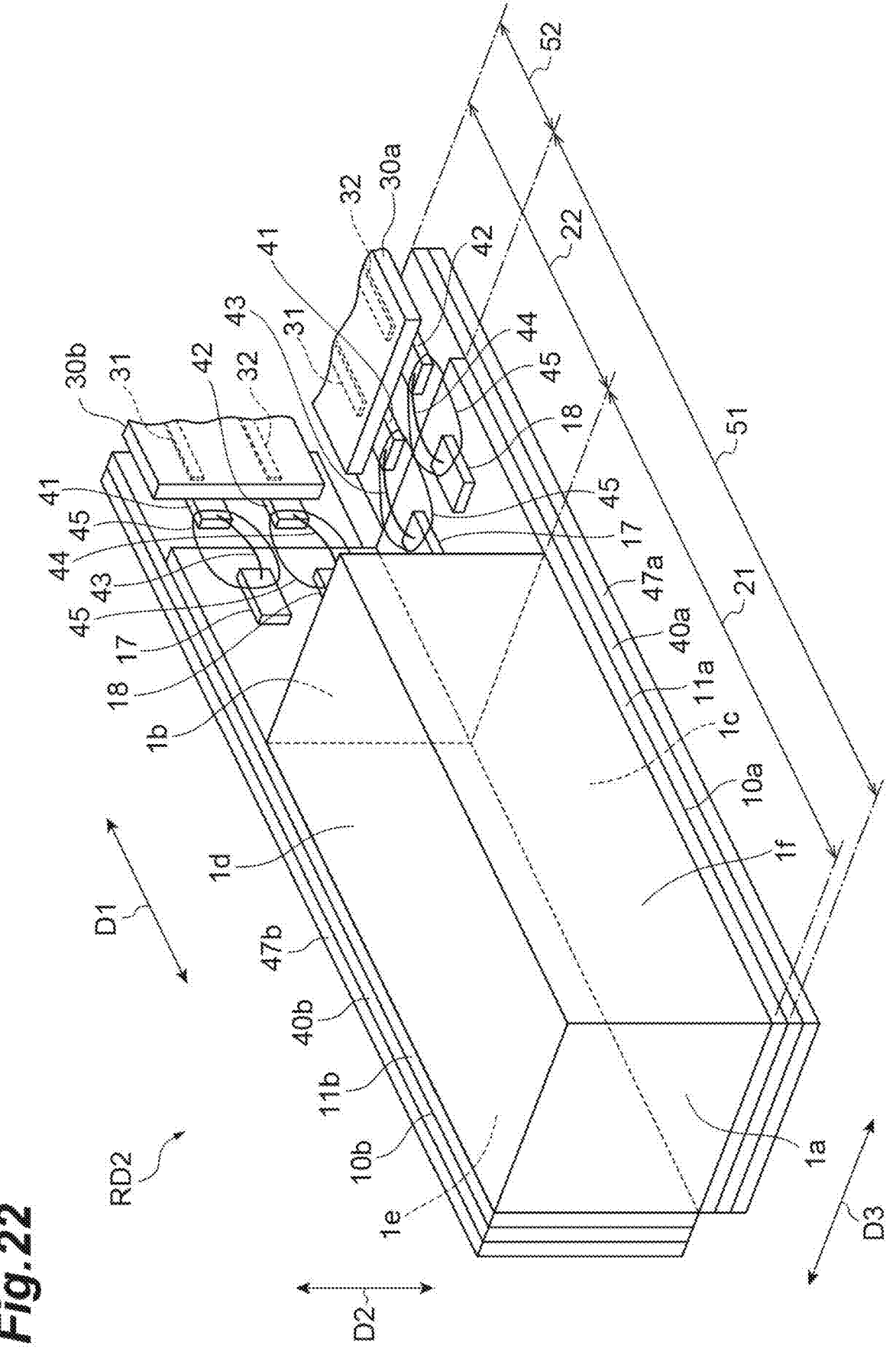
FIG. 22 is a perspective view illustrating a radiation detector according to a second embodiment.

FIG. 22 is a perspective view illustrating the radiation detector RD2 according to the second embodiment. The radiation detector RD2 includes a scintillator 1, a semiconductor photodetector 10a, a semiconductor photodetector 10b, a wiring member 30a, and a wiring member 30b. The semiconductor photodetectors 10a and 10b detect scintillation lights generated in the scintillator 1. The semiconductor photodetector 10a includes a semiconductor substrate 11a and is electrically connected to the wiring member 30a. The semiconductor photodetector 10b includes a semiconductor substrate 11b and is electrically connected to the wiring member 30b. For example, when the semiconductor photodetector 10a includes a first semiconductor photodetector, the semiconductor photodetector 10b includes a second semiconductor photodetector. For example, when the wiring member 30a includes a first wiring member, the wiring member 30b includes a second wiring member. For example, when the semiconductor substrate 11a includes a first semiconductor substrate, the semiconductor substrate 11b includes a second semiconductor substrate.

The scintillator 1 according to the present embodiment includes a pair of end surfaces 1a and 1b opposing each other, a pair of side surfaces 1c and 1d opposing each other, and a pair of side surfaces 1e and 1f opposing each other. The side surface 1d is a surface opposing the side surface 1c, and the side surface 1f is a surface opposing the side surface 1e. In the present embodiment, a length of the side surface 1c in the first direction D1 is longer than a width of the side surface 1c in the third direction D3, and a length of the side surface 1e in the first direction D1 is longer than a width of the side surface 1e in the second direction D2. A length of the scintillator 1 in the first direction D1 is longer than a length of the scintillator 1 in the second direction D2 and a length of the scintillator in the third direction D3. The first direction D1 is a longitudinal direction of the scintillator 1. The second direction D2 is orthogonal to the side surface 1c, and the third direction D3 is orthogonal to the side surface 1e. In the present embodiment and modification examples according to the present embodiment, for example, when the side surface 1c include a first side surface, the side surface 1e includes a second side surface.

The end surfaces 1a and 1b extend in the second direction D2. The end surfaces 1a and 1b also extend in the third direction D3. The end surfaces 1a and 1b each have a rectangular shape when viewed in the direction orthogonal to the end surfaces 1a and 1b. The side surfaces 1c and 1d each have, for example, a rectangular shape when viewed in the direction orthogonal to the side surfaces 1c and 1d. The side surfaces 1e and 1f each have, for example, a rectangular shape when viewed in the direction orthogonal to the side surfaces 1e and 1f. The scintillator 1 has a rectangular shape when viewed in the second direction D2 and the third direction D3. The scintillator 1 has a rectangular shape when viewed in the first direction D1. In the present embodiment, the scintillator 1 has a rectangular parallelepiped shape.

At least one of the end surfaces 1a and 1b includes, for example, a rough surface. Therefore, at least one of the end surfaces 1a and 1b has a triangular wave shape in a cross section. At least one of the end surfaces 1a and includes is, for example, a rough surface. The end surfaces 1a and 1b may include mirror surfaces.

The semiconductor substrate 11a is disposed to oppose the side surface 1c. The semiconductor substrate 11b is disposed to oppose the side surface 1e. The side surface 1e is adjacent to the side surface 1c. The semiconductor substrate 11a has, for example, the same configuration and the same function as the semiconductor substrate 11 according to the first embodiment. The semiconductor substrate 11b has the same configuration and the same function as, for example, the semiconductor substrate 11a disposed on the side surface 1c except that the semiconductor substrate 11b is disposed on the side surface 1e. The semiconductor substrate 11a is disposed on the side surface 1c with an adhesive, for example. The semiconductor substrate 11b is disposed on the side surface 1e with an adhesive, for example.

Each of the semiconductor substrate 11a and the semiconductor substrate 11b includes a portion 21 and a portion 22. In the present embodiment, the portion 21 of the semiconductor substrate 11a is covered with the side surface 1c.

The portion 22 of the semiconductor substrate 11*a* is disposed with the portion 21 of the semiconductor substrate 11*a* in the first direction D1 and is exposed from the side surface 1*c*. The portion 21 of the semiconductor substrate 11*b* is covered with the side surface 1*e*. The portion 22 of the semiconductor substrate 11*b* is disposed with the portion 21 of the semiconductor substrate 11*b* in the first direction D1 and is exposed from the side surface 1*e*.

Each of the semiconductor photodetector 10*a* and the semiconductor photodetector 10*b* includes a photodetection region 23, and the photodetection region 23 is disposed in the portion 21. The photodetection region 23 includes a plurality of avalanche photodiodes 12 and a plurality of quenching resistors 13. One photodetection section 15 is configured to include one avalanche photodiode 12 and one quenching resistor 13 electrically connected in series with the corresponding avalanche photodiode 12. A plurality of photodetection sections 15 are disposed in the portion 21.

In the portion 22, the electrode 17 and the electrode 18 are disposed. That is, each of the semiconductor photodetector 10*a* and the semiconductor photodetector 10*b* includes the electrode 17 and the electrode 18. The plurality of quenching resistors 13 are electrically connected in parallel with the electrode 17 through the conductive wire 14*a*. Each of the plurality of quenching resistors 13 is electrically connected in series with one of an anode or a cathode of the corresponding avalanche photodiode 12 of the plurality of avalanche photodiodes 12. Another of the anode or the cathode of each of the plurality of avalanche photodiodes 12 is electrically connected in parallel with the electrode 18 through the conductive wire 14*b*.

The wiring member 30*a* is disposed on the same side as the scintillator 1 relative to the semiconductor substrate 11*a*. The wiring member 30*b* is disposed on the same side as the scintillator 1 relative to the semiconductor substrate 11*b*. That is, at least a part of the wiring member 30*a* and the scintillator 1 are disposed in front of the same surface of the semiconductor substrate 11*a*, for example. That is, at least a part of the wiring member 30*b* and the scintillator 1 are disposed in front of the same surface of the semiconductor substrate 11*b*, for example. The wiring member 30*a* has, for example, the same configuration and the same function as the wiring member 30 according to the first embodiment. The wiring member 30*b* has the same configuration and the same function as, for example, the wiring member 30*a* electrically connected to the semiconductor substrate 11*a* except that the wiring member 30*b* is electrically connected to the semiconductor substrate 11*b*.

The wiring members 30*a* and 30*b* each include a conductor 31 and a conductor 32. The conductor 31 is electrically connected to the electrode 17. The conductor 32 is connected to the electrode 18. The wiring member 30*a*, the wiring member 30*b*, the semiconductor substrate 11*a*, and the semiconductor substrate 11*b* have flexibility. The flexibility of the wiring member 30*a* is higher than the flexibility of the semiconductor substrate 11*a*. The flexibility of the wiring member 30*b* is higher than the flexibility of the semiconductor substrate 11*b*.

When viewed in the second direction D2, the photodetection region 23 has an outline shape corresponding to an outline shape of the side surface 1*c*. In the present embodiment, the outline shape of the side surface 1*c* is a rectangular shape when viewed in the second direction D2. The photodetection region 23 has a rectangular outline shape corresponding to the outline shape of the side surface 1*c*. When viewed in the third direction D3, the photodetection region 23 has an outline shape corresponding to an outline shape of the side surface 1*e*. In the present embodiment, the outline shape of the side surface 1*e* is a rectangular shape when viewed in the third direction D3. The photodetection region 23 has a rectangular outline shape corresponding to the outline shape of the side surface 1*e*.

The radiation detector RD2 includes a base 40*a* and a base 40*b*. The base 40*a* is disposed such that the semiconductor substrate 11 is positioned between the base 40*a* and the scintillator 1. The base 40*b* is disposed such that the semiconductor substrate 11 is positioned between the base 40*b* and the scintillator 1.

In a configuration in which the radiation detector RD2 includes the base 40*a* and the base 40*b*, at least a part of the wiring member 30*a* and the scintillator 1 are disposed in front of the same surface of the base 40*a*, for example. At least a part of the wiring member 30*b* and the scintillator 1 are disposed in front of the same surface of the base 40*b*, for example.

The base 40*a* has, for example, the same configuration and the same function as the base 40 according to the first embodiment. The base 40*b* has, for example, the same configuration and the same function as the base 40*a*. For example, when the base 40*a* includes a first base, the base 40*b* includes a second base.

The base 40*a* and the base 40*b* include a portion 51 and a portion 52. The portion 51 of the base 40*a* is covered with the semiconductor substrate 11*a*. The portion 52 of the base 40*a* is disposed with the portion 51 of the base 40*a* in the first direction D1 and is exposed from the semiconductor substrate 11*a*. The portion 51 of the base 40*b* is covered with the semiconductor substrate 11*b*. The portion 52 of the base 40*b* is disposed with the portion 51 of the base 40*b* in the first direction D1 and is exposed from the semiconductor substrate 11*b*.

The radiation detector RD2 includes, for example, a wire 43 and a wire 44, and the portion 52 of the base 40*a* includes a terminal 41 and a terminal 42. The portion 52 of the base 40*b* includes the terminals 41 and the terminal 42. The terminal 41 and the scintillator 1 are disposed in front of the same surface of the corresponding base 40*a*. The terminal 42 and the scintillator 1 are disposed in front of the same surface of the corresponding base 40*b*. The terminals 41 of the base 40*a* and the base 40*b* are electrically connected to the electrodes 17 by the wires 43, and the terminals 42 of the base 40*a* and the base 40*b* are electrically connected to the electrodes 18 by the wires 44. The radiation detector RD2 may not include any one of the base 40*a* and the base 40*b*. The radiation detector RD2 may not include both the base 40*a* and the base 40*b*.

The radiation detector RD2 includes, for example, resins 45. The wires 43 and the wires 44 are covered with, for example, the resins 45. The resin 45 covers the wire 43 and the wire 44 individually or covers both the wire 43 and the wire 44. In the configuration in which the resins 45 individually cover the wire 43 and the wire 44, the resins may be separated from each other or connected to each other.

The radiation detector RD2 includes, for example, a light reflector 47*a* and a light reflector 47*b*. The light reflector 47*a* is disposed such that the semiconductor substrate 11*a* is positioned between the light reflector 47*a* and the scintillator 1. The light reflector 47*b* is disposed such that the semiconductor substrate 11*b* is positioned between the light reflector 47*b* and the scintillator 1. In the configuration in which the radiation detector RD2 includes the base 40*a*, the light reflector 47*a* is disposed such that the semiconductor substrate 11*a* and the base 40*a* are positioned between the light reflector 47*a* and the scintillator 1. In this configuration, for example, the scintillator 1, the semiconductor substrate 11a, the base 40a, and the light reflector 47a are disposed in this order. In a configuration in which the radiation detector RD2 does not include the base 40a, the scintillator 1, the semiconductor substrate 11a, and the light reflector 47a are disposed in this order. In the configuration in which the radiation detector RD2 includes the base 40b, the light reflector 47b is disposed such that the semiconductor substrate 11b and the base 40b between the light reflector 47b and the scintillator 1. In this configuration, for example, the scintillator 1, the semiconductor substrate 11b, the base 40b, and the light reflector 47b are disposed in this order. In a configuration in which the radiation detector RD2 does not include the base 40b, the scintillator 1, the semiconductor substrate 11b, and the light reflector 47b are disposed in this order. The radiation detector RD2 may not include any one of the light reflector 47a and the light reflector 47b. For example, when the light reflector 47a includes a first light reflector, the light reflector 47b includes a second light reflector.

The light reflectors 47a and 47b are made of, for example, the same material and have the same configuration as the light reflector 47 according to the first embodiment. Thicknesses of the light reflectors 47a and 47b are, for example, 0.05 to 100 µm.

Figure 23:
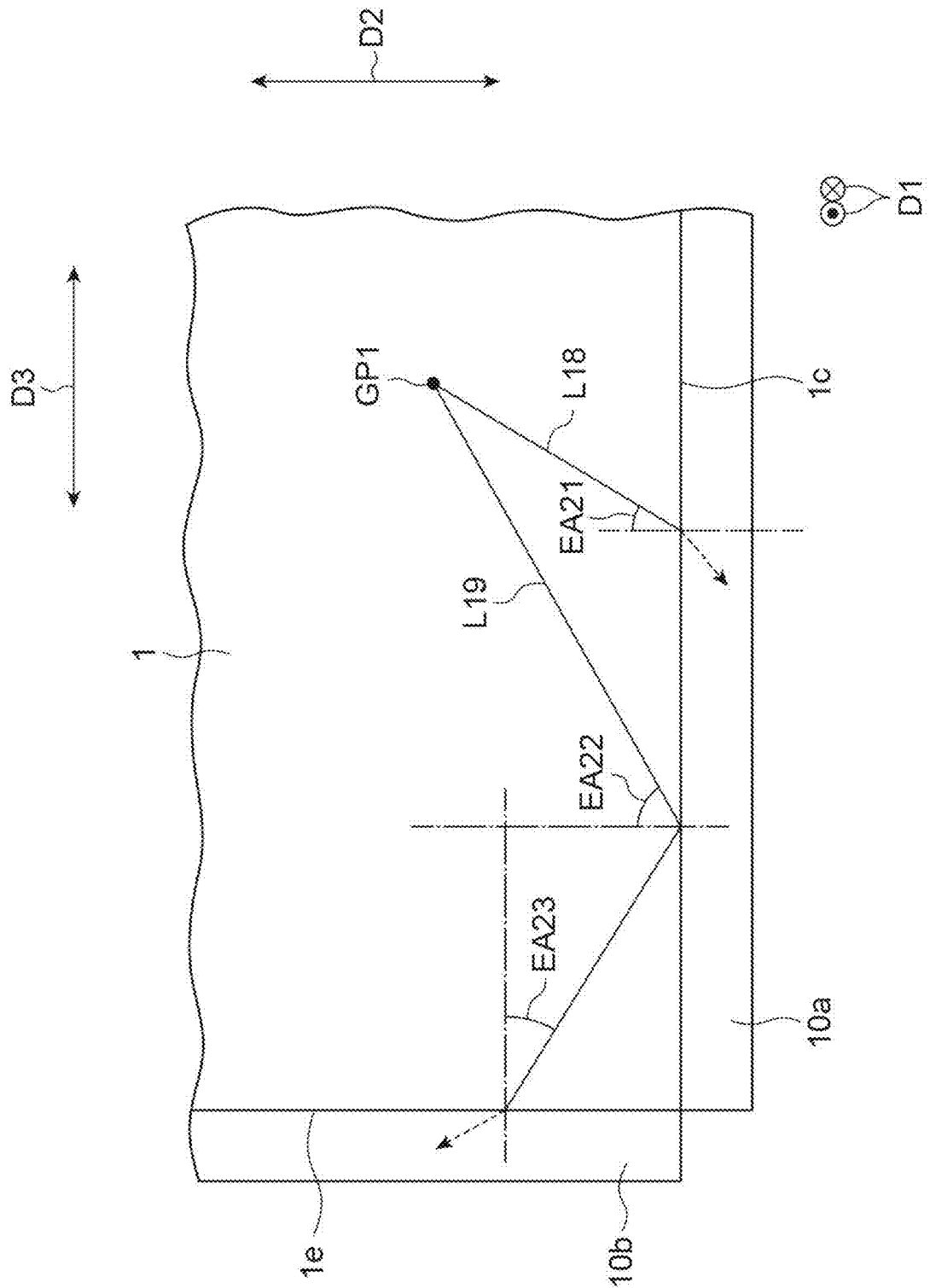
FIG. 23 is a view illustrating paths of some scintillation lights.

FIG. 23 is a view illustrating paths of some scintillation lights. FIG. 23 illustrates the paths of some scintillation lights when the scintillator 1 is viewed in the first direction D1. The scintillation lights include, for example, a light L18 and a light L19 incident on the side surface 1c from the generation point GP1. The light L18 is incident on the side surface 1c at an incidence angle EA21. The light L19 is incident on the side surface 1c at an incidence angle EA22. The incidence angle EA21 is smaller than the critical angle on the side surface 1c. The incidence angle EA22 is larger than the critical angle on the side surface 1c. In the present embodiment, the semiconductor photodetectors 10a and 10b can adhere to the scintillator 1 with adhesives having the same refractive index. In this case, the critical angle on the side surface 1e is equal to the critical angle on the side surface 1c.

As illustrated in FIG. 23, the light L18 is incident on the side surface 1c at the incidence angle EA21 and is emitted from the side surface 1c. The light L18 is detected by the semiconductor photodetector 10a disposed on the side surface 1c. The light L19 is incident on the side surface 1c at the incidence angle EA22 and is totally reflected by the side surface 1c. The light L19 tends not to be detected by the semiconductor photodetector 10a disposed on the side surface 1c. However, the light L19 is totally reflected by the side surface 1c and then is incident on the side surface 1e, for example. An incidence angle EA23 of the light L19 incident on the side surface 1e may be smaller than the critical angle on the side surface 1e. In this case, the light L19 is incident on the side surface 1e and is detected by the semiconductor photodetector 10b disposed on the side surface 1e. That is, even when the incidence angle of the light on the side surface 1c exceeds the critical angle, and the light is not detected by the semiconductor photodetector 10a disposed on the side surface 1c, the scintillation light is detected by the semiconductor photodetector 10b disposed on the side surface 1e adjacent to the side surface 1c.

As an example, the incidence angle EA23 is 90 degrees—the incidence angle EA22. For example, when the incidence angle EA22 is 60 degrees or larger, the incidence angle EA23 is 30 degrees or smaller. As described above, when a refractive index of the scintillator 1 is 1.8, and a refractive index of the adhesive for causing the semiconductor photodetectors 10a and 10b to adhere to the side surfaces 1c and 1e is 1.5, respectively, the critical angles on the side surfaces 1c and 1e are about 56.4 degrees. In this case, a scintillation light having the incidence angle EA22 of 60 degrees or larger is totally reflected by the side surface 1c even if the scintillation light is incident on the side surface 1c. However, when the scintillation light is incident on the side surface 1e adjacent to the side surface 1c, the scintillation light is incident on the side surface 1e and is detected by the semiconductor photodetector 10b disposed on the side surface 1e. When the incidence angle EA22 of the scintillation light is, for example, 50 degrees or smaller, the scintillation light is emitted from the side surface 1c and is detected by the semiconductor photodetector 10b disposed on the side surface 1c.

Figure 24:
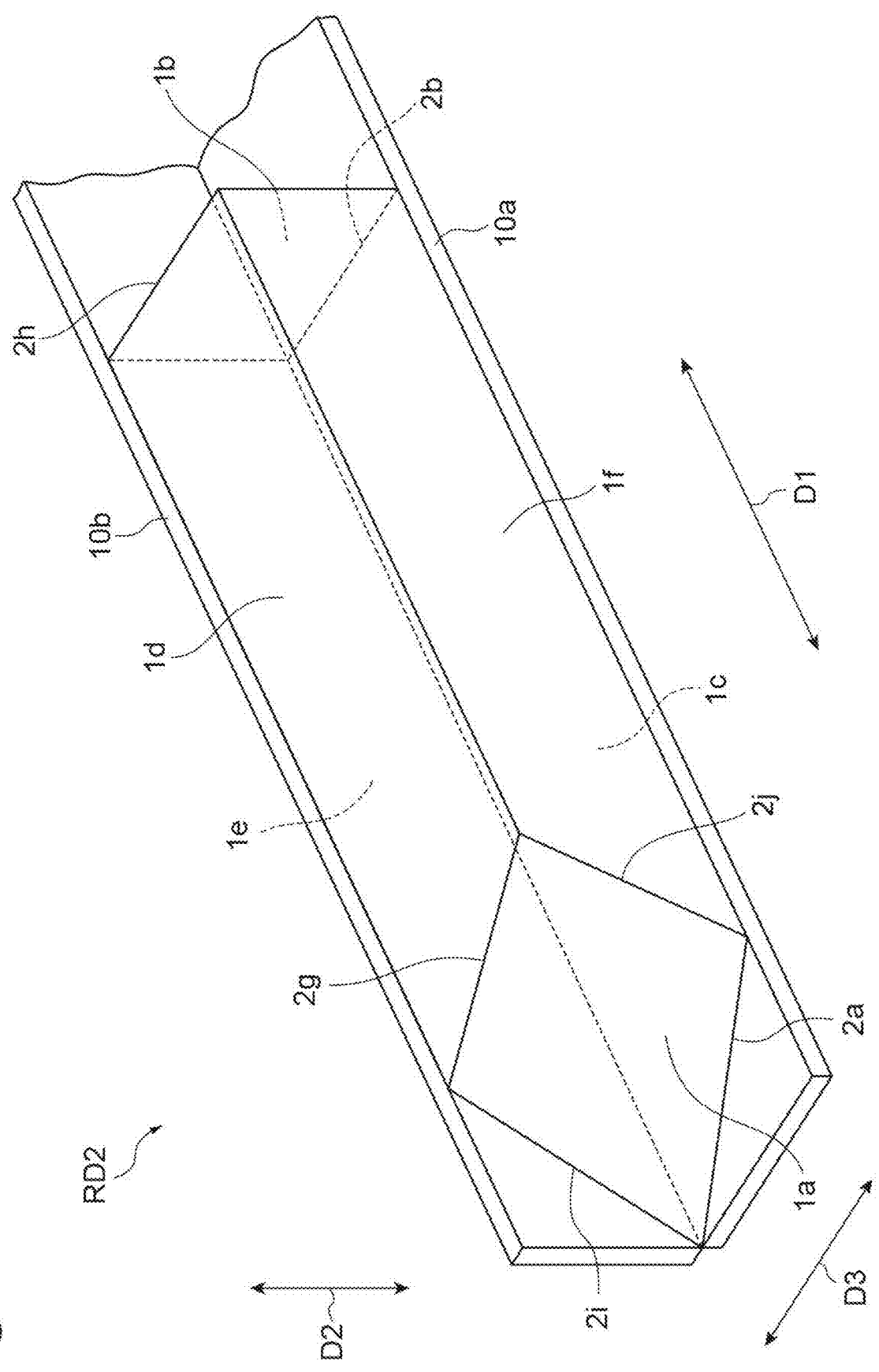
FIG. 24 is a perspective view illustrating a radiation detector according to a first modification example of the second embodiment.

A first modification example of the radiation detector RD2 according to the second embodiment will be described with reference to FIG. 24. FIG. 24 is a perspective view illustrating a radiation detector RD2 according to the first modification example of the second embodiment. The radiation detector RD2 according to the present modification example has the same configuration as the radiation detector RD2 according to the second embodiment except for configurations of the scintillator 1 and the photodetection region 23.

The scintillator 1 according to the present modification example includes a pair of end surfaces 1a and 1b opposing each other in the first direction D1, a pair of side surfaces 1c and 1d opposing each other in the second direction D2, and a pair of side surfaces 1e and 1f opposing each other in the third direction D3. The end surfaces 1a and 1b, the side surfaces 1c and 1d, and the side surfaces 1e and 1f include outer surfaces of the scintillator 1. In the present modification example, unlike the second embodiment, the end surface 1a is inclined relative to the second direction D2. The pair of end surfaces 1a and 1b includes one end surface 1a inclined relative to the second direction D2. The end surface 1a is also inclined relative to the third direction D3. The end surface 1b extends in both the second direction D2 and the third direction D3. In the present modification example, a direction perpendicular to the side surface 1c coincides with the second direction D2, and a direction perpendicular to the side surface 1e coincides with the third direction D3. The first direction D1 is a longitudinal direction of the scintillator 1. The end surfaces 1a and 1b have a rectangular shape when viewed in the first direction D1. The scintillator 1 has, for example, a rectangular shape when viewed in the first direction D1.

When viewed in the second direction D2, an edge 2a of the side surface 1c on the end surface 1a side is inclined relative to the third direction D3. When viewed in the second direction D2, an edge 2g of the side surface 1d on the end surface 1a side is inclined relative to the third direction D3. The edge 2a and the edge 2g extend substantially parallel to each other, for example, when viewed in the second direction D2. When viewed in the second direction D2, the edge 2a and the edge 2g form, for example, an angle of 10 to 80 degrees in a counterclockwise direction relative to the third direction D3. When viewed in the second direction D2, an edge 2b of the side surface 1c on the end surface 1b side and an edge 2h of the side surface 1d on the end surface 1b side extend in the third direction D3, for example.

In the present modification example, when viewed in the second direction D2, the photodetection region 23 has an outline shape corresponding to an outline shape of the side surface 1c. The photodetection sections 15 are all disposed such that the photodetection region 23 has the outline shape corresponding to the outline shape of the side surface 1c when viewed in the second direction D2. When viewed in the third direction D3, the photodetection region 23 has an outline shape corresponding to an outline shape of the side surface 1e. The photodetection sections 15 are all disposed such that the photodetection region 23 has the outline shape corresponding to the outline shape of the side surface 1e when viewed in the third direction D3.

When viewed in the third direction D3, an edge 2i of the side surface 1e on the end surface 1a side is inclined relative to the second direction D2, and an edge 2j of the side surface 1f on the end surface 1a side is inclined relative to the second direction D2. The edge 2i and the edge 2j extend substantially parallel to each other when viewed in the third direction D3. When the side surface 1f is viewed in the third direction D3, the edge 2i and the edge 2j form, for example, an angle of 10 to 80 degrees in a clockwise direction relative to the second direction D2.

In the present modification example, a length of the side surface 1c in the first direction D1 is longer than a width of the side surface 1c in the third direction D3, and a length of the side surface 1e in the first direction D1 is longer than a width of the side surface 1e in the second direction D2. A length of the scintillator 1 in the first direction D1 is longer than a length of the scintillator 1 in the second direction D2 and a length of the scintillator in the third direction D3. At least one of the end surfaces 1a and 1b includes, for example, a rough surface. Only the end surface 1b may include a rough surface, and the end surface 1a may not include a rough surface. The side surfaces 1c and 1e include, for example, mirror surfaces.

In the present modification example, the end surface 1a is inclined relative to both the second direction D2 and the third direction D3 so that a scintillation light tends to be totally reflected toward the side surfaces 1c and 1e. Therefore, of scintillation lights, a light incident on the end surface 1a and reflected by the end surface 1a tends to be incident on the side surfaces 1c and 1e.

Figure 25:
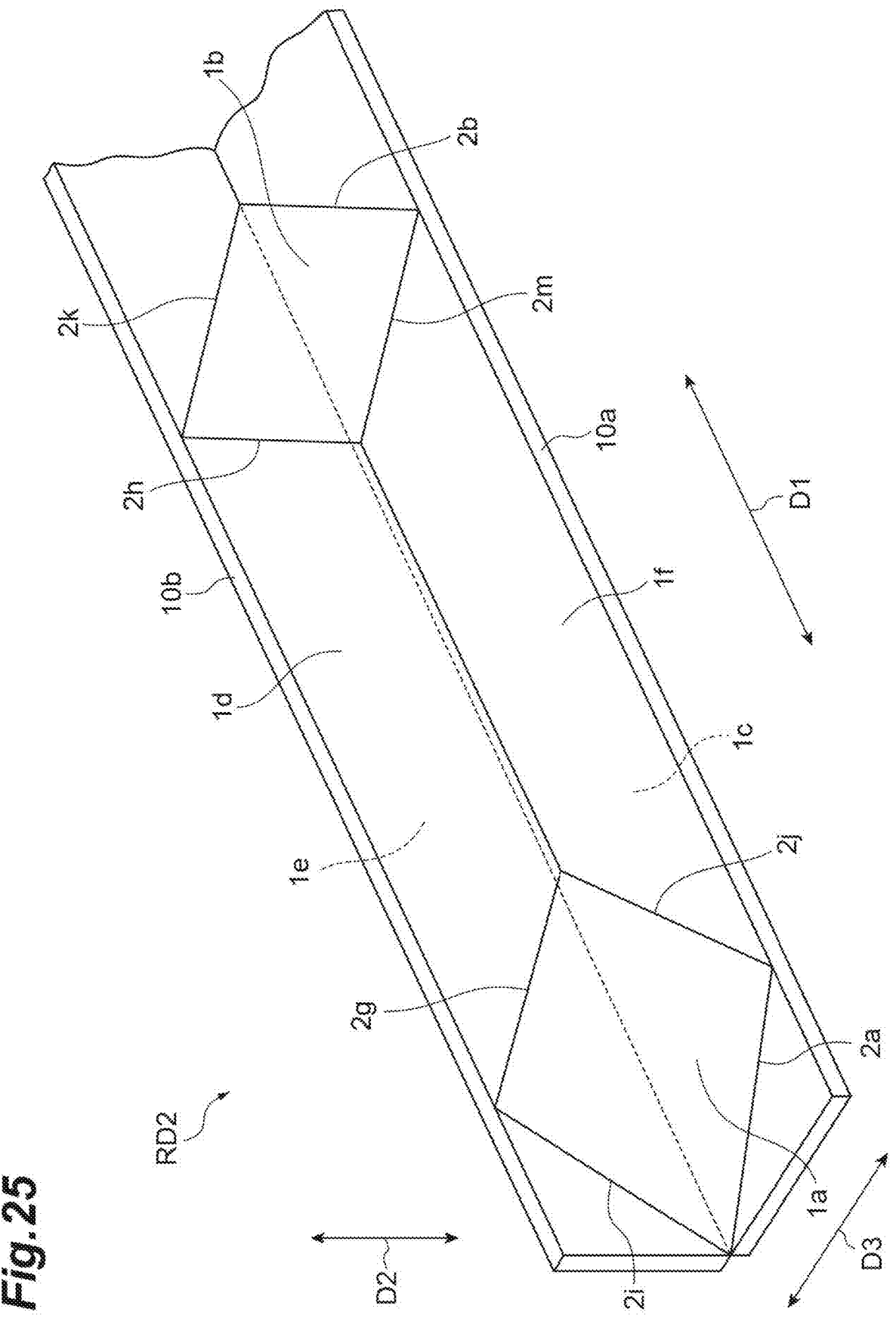
FIG. 25 is a perspective view illustrating a radiation detector according to a second modification example of the second embodiment.

A second modification example of the radiation detector RD2 according to the second embodiment will be described with reference to FIG. 25. FIG. 25 is a perspective view illustrating a radiation detector RD2 according to the second modification example of the second embodiment. The radiation detector RD2 according to the present modification example has the same configuration as the radiation detector RD2 according to the second embodiment except for configurations of the scintillator 1 and the photodetection region 23.

The scintillator 1 according to the present modification example includes a pair of end surfaces 1a and 1b opposing each other in the first direction D1, a pair of side surfaces 1c and 1d opposing each other in the second direction D2, and a pair of side surfaces 1e and 1f opposing each other in the third direction D3. The end surfaces 1a and 1b, the side surfaces 1c and 1d, and the side surfaces 1e and 1f include outer surfaces of the scintillator 1. In the present modification example, unlike the second embodiment, the end surfaces 1a and 1b are inclined relative to the second direction D2. The pair of end surfaces 1a and 1b includes one of the end surfaces 1a and 1b inclined relative to the second direction D2. The end surfaces 1a and 1b are also inclined relative to the third direction D3. In the present modification example, a direction perpendicular to the side surface 1c coincides with the second direction D2, and a direction perpendicular to the side surface 1e coincides with the third direction D3. The first direction D1 is a longitudinal direction of the scintillator 1. The end surfaces 1a and 1b have a rectangular shape when viewed in the first direction D1. The scintillator 1 has, for example, a rectangular shape when viewed in the first direction D1.

When viewed in the second direction D2, an edge 2a of the side surface 1c on the end surface 1a side is inclined relative to the third direction D3. When viewed in the second direction D2, an edge 2g of the side surface 1d on the end surface 1a side is inclined relative to the third direction D3. The edge 2a and the edge 2g extend substantially parallel to each other, for example, when viewed in the second direction D2. When viewed in the second direction D2, the edge 2a and the edge 2g form, for example, an angle of 10 to 80 degrees in a counterclockwise direction relative to the third direction D3.

When viewed in the second direction D2, an edge 2b of the side surface 1c on the end surface 1b side is inclined relative to the third direction D3. When viewed in the second direction D2, an edge 2h of the side surface 1d on the end surface 1b side is inclined relative to the third direction D3. The edge 2b and the edge 2h extend substantially parallel to each other, for example, when viewed in the second direction D2. When viewed in the second direction D2, the edge 2b and the edge 2h form, for example, an angle of 10 to 80 degrees in a clockwise direction relative to the third direction D3. The side surfaces 1c and 1d have, for example, a trapezoidal shape when viewed in the second direction D2.

When viewed in the second direction D2, the photodetection region 23 has an outline shape corresponding to an outline shape of the side surface 1c. In the present modification example, the outline shape of the side surface 1c is a trapezoidal shape when viewed in the second direction D2. The photodetection region 23 has a trapezoidal outline shape corresponding to the outline shape of the side surface 1c.

When viewed in the third direction D3, an edge 2i of the side surface 1e on the end surface 1a side is inclined relative to the second direction D2. When viewed in the third direction D3, an edge 2j of the side surface 1f on the end surface 1a side is inclined relative to the second direction D2. For example, the edge 2i and the edge 2j extend substantially parallel to each other when viewed in the third direction D3. When the side surface 1f is viewed in the third direction D3, the edge 2i and the edge 2j form, for example, an angle of 10 to 80 degrees in a clockwise direction relative to the second direction D2.

When viewed in the third direction D3, an edge 2k of the side surface 1e on the end surface 1b side is inclined relative to the second direction D2. When viewed in the third direction D3, an edge 2m of the side surface 1f on the end surface 1b side is inclined relative to the second direction D2. For example, the edge 2k and the edge 2m extend substantially parallel to each other when viewed in the third direction D3. When the side surface 1f is viewed in the third direction D3, the edge 2k and the edge 2m form, for example, an angle of 10 to 80 degrees in a counterclockwise direction relative to the second direction D2. The side surfaces 1e and 1f have, for example, a trapezoidal shape when viewed in the third direction D3.

When viewed in the third direction D3, the photodetection region 23 has an outline shape corresponding to an outline shape of the side surface 1e. In the present modification example, the outline shape of the side surface 1e is a trapezoidal shape when viewed in the third direction D3. The photodetection region 23 has a trapezoidal outline shape corresponding to the outline shape of the side surface 1e.

In the present modification example, a length of the side surface 1c in the first direction D1 is longer than a width of the side surface 1c in the third direction D3, and a length of the side surface 1e in the first direction D1 is longer than a width of the side surface 1e in the second direction D2. A length of the scintillator 1 in the first direction D1 is longer than a length of the scintillator 1 in the second direction D2 and a length of the scintillator in the third direction D3.

At least one of the end surfaces 1a and 1b includes, for example, a rough surface. Therefore, at least one of the end surfaces 1a and 1b has a triangular wave shape in a cross section. At least one of the end surfaces 1a and 1b includes, for example, a rough surface. The end surfaces 1a and 1b may include mirror surfaces. The side surfaces 1c and 1e include, for example, mirror surfaces.

In the present modification example, the end surfaces 1a and 1b are inclined relative to both the second direction D2 and the third direction D3 so that a scintillation light tends to be totally reflected toward the side surfaces 1c and 1e. Therefore, of scintillation lights, a light incident on the end surface 1a and reflected by the end surface 1a tends to be incident on the side surfaces 1c and 1e. The light incident on the end surface 1b and reflected by the end surface 1b tends to be incident on the side surfaces 1c and 1e.

Figure 26:
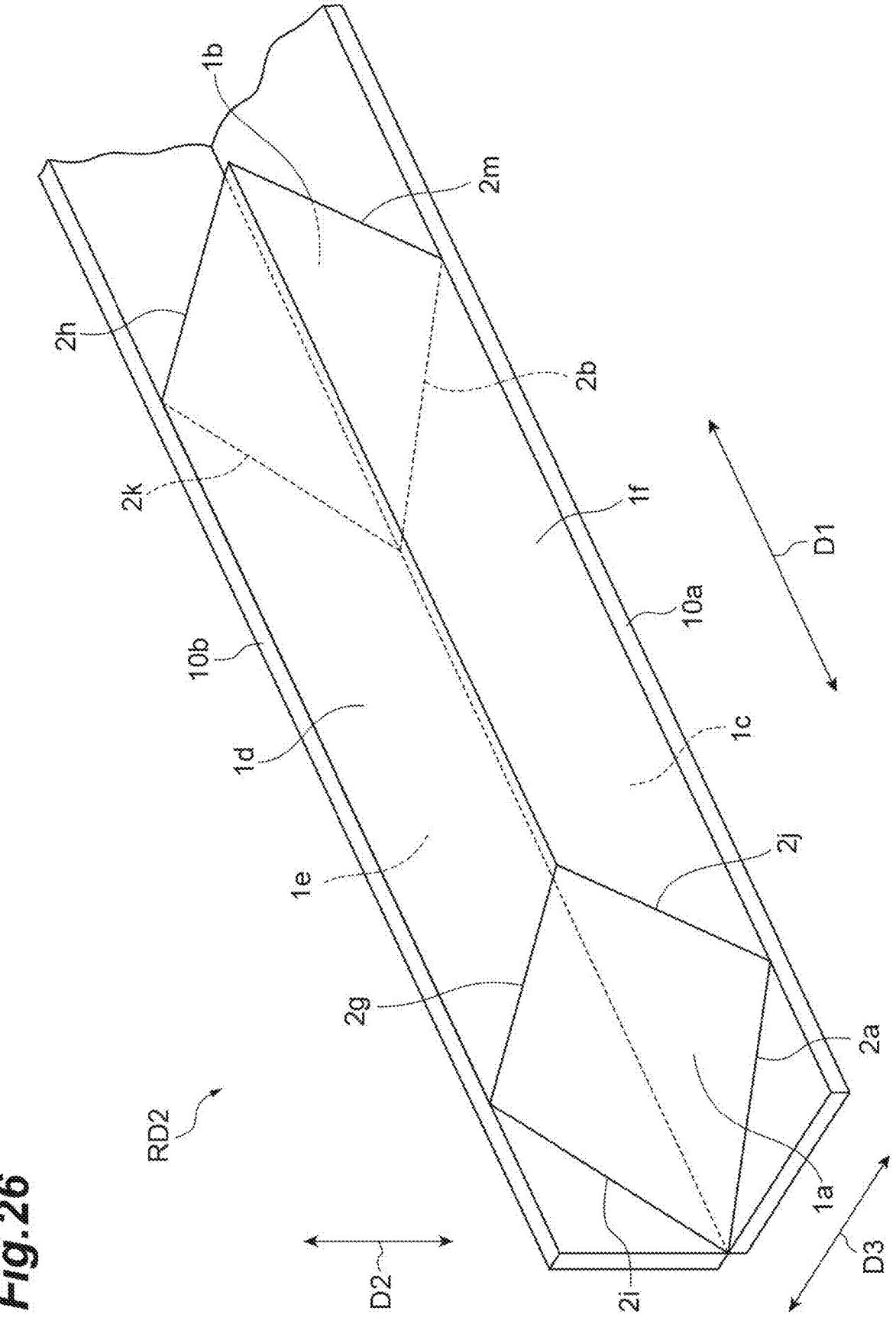
FIG. 26 is a perspective view illustrating a radiation detector according to a third modification example of the second embodiment.

A third modification example of the radiation detector RD2 according to the second embodiment will be described with reference to FIG. 26. FIG. 26 is a perspective view illustrating a radiation detector RD2 according to the third modification example of the second embodiment. The radiation detector RD2 according to the present modification example has the same configuration as the radiation detector RD2 according to the second embodiment except for configurations of the scintillator 1 and the photodetection region 23.

The scintillator 1 according to the present modification example includes a pair of end surfaces 1a and 1b opposing each other in the first direction D1, a pair of side surfaces 1c and 1d opposing each other in the second direction D2, and a pair of side surfaces 1e and 1f opposing each other in the third direction D3. The end surfaces 1a and 1b, the side surfaces 1c and 1d, and the side surfaces 1e and 1f include outer surfaces of the scintillator 1. In the present modification example, unlike the second embodiment, the end surfaces 1a and 1b are inclined relative to the second direction D2. The pair of end surfaces 1a and 1b includes one of the end surfaces 1a and 1b inclined relative to the second direction D2. The end surfaces 1a and 1b are also inclined relative to the third direction D3. In the present modification example, a direction perpendicular to the side surface 1c coincides with the second direction D2, and a direction perpendicular to the side surface 1e coincides with the third direction D3. The first direction D1 is a longitudinal direction of the scintillator 1. The end surfaces 1a and 1b have a rectangular shape when viewed in the first direction D1. The scintillator 1 has, for example, a rectangular shape when viewed in the first direction D1.

When viewed in the second direction D2, an edge 2a of the side surface 1c on the end surface 1a side is inclined relative to the third direction D3. When viewed in the second direction D2, an edge 2g of the side surface 1d on the end surface 1a side is inclined relative to the third direction D3. The edge 2a and the edge 2g extend substantially parallel to each other, for example, when viewed in the second direction D2. When viewed in the second direction D2, the edge 2a and the edge 2g form, for example, an angle of 10 to 80 degrees in a counterclockwise direction relative to the third direction D3.

When viewed in the second direction D2, an edge 2b of the side surface 1c on the end surface 1b side is inclined relative to the third direction D3. When viewed in the second direction D2, an edge 2h of the side surface 1d on the end surface 1b side is inclined relative to the third direction D3. The edge 2b and the edge 2h extend substantially parallel to each other, for example, when viewed in the second direction D2. When viewed in the second direction D2, the edge 2b and the edge 2h form, for example, an angle of 10 to 80 degrees in a counterclockwise direction relative to the third direction D3.

When viewed in the second direction D2, the photodetection region 23 has an outline shape corresponding to an outline shape of the side surface 1c. In the present modification example, an outline shape of the side surface 1c is a parallelogrammatic shape when viewed in the second direction D2. The photodetection region 23 has a parallelogrammatic outline shape corresponding to the outline shape of the side surface 1c.

When viewed in the third direction D3, an edge 2i of the side surface 1e on the end surface 1a side is inclined relative to the second direction D2, and an edge 2j of the side surface 1f on the end surface 1a side is inclined relative to the second direction D2. The edge 2i and the edge 2j extend substantially parallel to each other when viewed in the third direction D3. When the side surface 1f is viewed in the third direction D3, the edge 2i and the edge 2j form, for example, an angle of 10 to 80 degrees in a clockwise direction relative to the second direction D2.

When viewed in the third direction D3, an edge 2k of the side surface 1e on the end surface 1b side is inclined relative to the second direction D2, and an edge 2m of the side surface 1f on the end surface 1b side is inclined relative to the second direction D2. The edge 2k and the edge 2m extend substantially parallel to each other when viewed in the third direction D3. When the side surface 1f is viewed in the third direction D3, the edge 2k and the edge 2m form, for example, an angle of 10 to 80 degrees in a clockwise direction relative to the second direction D2. The side surfaces 1e and 1f have, for example, a parallelogrammatic shape when viewed in the third direction D3.

When viewed in the third direction D3, the photodetection region 23 has an outline shape corresponding to an outline shape of the side surface 1e. In the present modification example, an outline shape of the side surface 1e is a parallelogrammatic shape when viewed in the third direction D3. The photodetection region 23 has a parallelogrammatic outline shape corresponding to the outline shape of the side surface 1e.

In the present modification example, a length of the side surface 1c in the first direction D1 is longer than a width of the side surface 1c in the third direction D3, and a length of the side surface 1e in the first direction D1 is longer than a width of the side surface 1e in the second direction D2. A length of the scintillator 1 in the first direction D1 is longer than a length of the scintillator 1 in the second direction D2 and a length of the scintillator in the third direction D3. The end surfaces 1a and 1b may not include a rough surface. The side surfaces 1c and 1e include, for example, mirror surfaces.

In the present modification example, the end surfaces 1a and 1b are inclined relative to both the second direction D2 and the third direction D3 so that a scintillation light tends to be totally reflected toward the side surfaces 1c and 1e. Therefore, of scintillation lights, a light incident on the end surface 1a and reflected by the end surface 1a tends to be incident on the side surfaces 1c and 1e. The light incident on the end surface 1b and reflected by the end surface 1b tends to be incident on the side surfaces 1c and 1e.

As described above, the radiation detector RD2 includes the scintillator including the pair of end surfaces 1a and 1b opposing each other in the first direction D1, the side surface 1c coupling the pair of end surfaces 1a and 1b, and the side surface 1e coupling the pair of end surfaces 1a and 1b and being adjacent to the side surface 1c, the semiconductor photodetector 10a including the semiconductor substrate 11a disposed to oppose the side surface 1c, the semiconductor photodetector 10b including the semiconductor substrate 11b disposed to oppose the side surface 1e, the wiring member 30a electrically connected to the semiconductor photodetector 10a, and the wiring member 30b electrically connected to the semiconductor photodetector 10b. The scintillator 1 has the rectangular shape when viewed in the first direction D1. The length of the scintillator 1 in the first direction D1 is longer than both of the length of the scintillator in the second direction D2 orthogonal to the side surface 1c and the length of the scintillator in the third direction D3 orthogonal to the side surface 1e. The length of the side surface 1c in the first direction D1 is longer than the width of the side surface 1c in the third direction D3, and the length of the side surface 1e in the first direction D1 is longer than the width of the side surface 1e in the second direction D2. Each of the semiconductor substrate 11a and the semiconductor substrate 11b includes the portion 21 covered with the corresponding side surface 1c or 1e of the side surface 1c and the side surface 1e, and the portion 22 exposed from the corresponding side surface. The portion 21 and the portion 22 are disposed in the first direction D1. Each of the semiconductor photodetector 10a and the semiconductor photodetector 10b includes the photodetection region disposed in the portion 21, and the electrode 17 and the electrode 18 disposed in the portion 22. The photodetection region 23 includes the plurality of avalanche photodiodes 12 arranged to operate in Geiger mode and the plurality of quenching resistors 13 electrically connected in series with one of the anode or the cathode of the corresponding avalanche photodiode 12 of the plurality of avalanche photodiodes 12. The plurality of quenching resistors 13 are connected in parallel with the electrode 17. Another of the anode or the cathode of each of the plurality of avalanche photodiodes 12 is electrically connected in parallel with the electrode 18. The wiring member 30a and the wiring member 30b each include the conductor 31 electrically connected to the electrode 17 and the conductor 32 connected to the electrode 18.

In the present embodiment, the radiation detector RD2 includes the scintillator 1 that is longer in the first direction D1 and includes the semiconductor photodetectors 10a and 10b disposed on the side surfaces 1c and 1e of the scintillator 1, respectively. The semiconductor photodetectors 10a and 10b detect scintillation lights directly incident on the side surfaces 1c and 1e on which the semiconductor photodetectors 10a and 10b are disposed, respectively. The semiconductor photodetectors 10a and 10b detect, for example, the scintillation lights incident on the side surfaces 1c and 1e after being reflected by the side surfaces 1d and 1f opposing the side surfaces 1c and 1e on which the semiconductor photodetectors 10a and 10b are disposed, respectively. In the present embodiment, the length of the scintillator 1 in the second direction D2 is shorter than the length of the scintillator 1 in the first direction D1. Therefore, the semiconductor photodetectors 10a and 10b detect, with a small time difference, the scintillation lights directly incident on the side surfaces 1c and 1e and the scintillation lights incident on the side surfaces 1c and 1e after being reflected by the side surfaces 1d and 1f. As a result, the radiation detector RD2 achieves high time resolution.

In the present embodiment, when the incidence angle of the scintillation light on the side surface 1c exceeds the critical angle on the side surface 1c, the scintillation light may not be detected by the semiconductor photodetector 10a disposed on the side surface 1c. In the radiation detector RD2, the scintillation light can be detected by the semiconductor photodetector 10b disposed on the side surface 1e adjacent to the side surface 1c. Therefore, the radiation detector RD2 achieves the radiation detector having high time resolution and reliably increases the amount of scintillation lights detected by the semiconductor photodetectors 10a and 10b.

In the radiation detector RD2, the pair of end surfaces 1a and 1b includes one of the end surfaces 1a and 1b inclined relative to the second direction D2.

In this configuration, the scintillation lights are more reliably incident on the side surface 1c and the side surface 1e. The number of times of reflection of the scintillation lights on the end surfaces 1a and 1b or the side surfaces 1d and 1f is reduced, and reflection attenuation of the scintillation lights is reduced. Therefore, the radiation detector RD2 more reliably increases the amount of light detected by the semiconductor photodetectors 10a and 10b.

In the radiation detector RD2, the pair of end surfaces 1a and 1b includes one of the end surfaces 1a and 1b extending in the second direction D2, and one of the end surfaces 1a and 1b has the triangular wave shape in the cross section.

In this configuration, the scintillation light is still more reliably incident on the side surface 1c and the side surface 1e. The number of times of reflection of the scintillation lights on the end surfaces 1a and 1b or the side surfaces is reduced, and reflection attenuation of the scintillation lights occurs. Therefore, the radiation detector RD2 still more reliably increases the amount of light detected by the semiconductor photodetectors 10a and 10b.

In the configuration in which the end surfaces 1a and 1b have the triangular wave shape in the cross section, the amount of light detected by the semiconductor photodetectors 10a and 10b is more reliably increased even if the end surfaces 1a and 1b are not inclined relative to the second direction D2. The configuration in which the end surfaces 1a and 1b extend in the second direction D2 decreases the amount of use of the scintillator 1 when the radiation detector RD2 is produced, as compared with the configuration in which the end surfaces 1a and 1b are inclined relative to the second direction D2.

In the radiation detector RD2, the pair of end surfaces 1a and 1b includes one of the end surfaces 1a and 1b extending in the second direction D2, and one end surface includes the rough surface.

In this configuration, the scintillation light is still more reliably incident on the side surface 1c and the side surface 1e. The number of times of reflection of the scintillation lights on the end surfaces 1a and 1b or the side surfaces 1d and 1f is reduced, and reflection attenuation of the scintillation lights is reduced. Therefore, the radiation detector RD2 still more reliably increases the amount of light detected by the semiconductor photodetectors 10a and 10b.

In a configuration in which the end surfaces 1a and 1b include rough surfaces in the cross section, the amount of light detected by the semiconductor photodetectors 10a and 10b is more reliably increased even if the end surfaces 1a and 1b are not inclined relative to the second direction D2. The configuration in which the end surfaces 1a and 1b extend in the second direction D2 decreases the amount of use of the scintillator 1 when the radiation detector RD2 is produced, as compared with the configuration in which the end surfaces 1*a* and 1*b* are inclined relative to the second direction D2.

In the radiation detector RD2, when viewed in the second direction D2, the photodetection region 23 has the outline shape corresponding to the outline shape of the side surface 1*c*. The photodetection sections 15 are all disposed such that the photodetection region 23 has the outline shape corresponding to the outline shape of the side surface 1*c* when viewed in the second direction D2. When viewed in the third direction D3, the photodetection region 23 has the outline shape corresponding to the outline shape of the side surface 1*e*. The photodetection sections 15 are all disposed such that the photodetection region 23 has the outline shape corresponding to the outline shape of the side surface 1*e* when viewed in the third direction D3.

In this configuration, the photodetection region 23 tends not to be disposed at the position of the semiconductor substrates 11*a* or 11*b* where no scintillation lights can be detected. Therefore, the radiation detector RD2 suppresses increase in dark count and capacitance in the photodetection region 23. As a result, the radiation detector RD2 reliably improves the time resolution of the semiconductor photodetectors 10*a* and 10*b*.

The radiation detector RD2 includes the base 40*a*, the base 40*b*, the wire 43, and the wire 44. The base 40*a* is disposed such that the semiconductor substrate 11*a* is positioned between the base 40*a* and the scintillator 1. The base 40*b* is disposed such that the semiconductor substrate 11*b* is positioned between the base 40*b* and the scintillator 1. The first base 40*a* includes the portion 51 covered with the semiconductor substrate 11*a* and the portion 52 exposed from the semiconductor substrate 11*a*. The base 40*b* includes the portion 51 covered with the semiconductor substrate 11*b* and the portion 52 exposed from the semiconductor substrate 11*b*. The portion 51 and the portion 52 are disposed in the first direction D1. The portion 52 includes the terminal 41 and the terminal 42. The first terminal 41 and the scintillator 1 are disposed in front of the same surface of the first base 40*a*. The second terminal 42 and the scintillator 1 are disposed in front of the same surface of the second base 40*b*. The terminal 41 is electrically connected to the electrode 17 by the wire 43, and the terminal 42 is electrically connected to the electrode 18 by the wire 44.

A configuration in which the bases 40*a* and 40*b* are provided increases the mechanical strength of the radiation detector RD2. Therefore, this configuration reliably achieves the radiation detector RD2 having high mechanical strength.

The radiation detector RD2 includes the resin 45 covering the wire 43 and the wire 44.

In this configuration, the resin 45 protects the wires 43 and 44. Therefore, the wires 43 and 44 tend not to be damaged. As a result, the radiation detector RD2 decreases deterioration of electrical connection between the terminals 41 and 42 and the electrodes 17 and 18.

The radiation detector RD2 includes, for example, the light reflector 47*a* and the light reflector 47*b*. The light reflector 47*a* is disposed such that the semiconductor substrate 11*a* is positioned between the light reflector 47*a* and the scintillator 1. The light reflector 47*b* is disposed such that the semiconductor substrate 11*b* is positioned between the light reflector 47*b* and the scintillator 1.

For example, in a configuration in which the plurality of radiation detectors RD2 are provided, the following effects can be achieved in the case where one radiation detector RD2 includes the light reflector 47*a*. That is, the configuration in which the light reflector 47*a* of the one radiation detector RD2 and the side surface 1*d* of another radiation detector RD2 oppose each other in the second direction D2 improves reflectance of the scintillation lights on the side surface 1*d* of the other radiation detector RD2 even when the light reflector 47*a* is not disposed on the side surface 1*d* of the other radiation detector RD2.

For example, in the configuration in which the plurality of radiation detectors RD2 are provided, the following effects can be achieved in the case where one radiation detector RD2 includes the light reflector 47*b*. That is, the configuration in which the light reflector 47*b* of the one radiation detector RD2 and the side surface 1*f* of the other radiation detector RD2 oppose each other in the third direction D3 improves reflectance of the scintillation lights on the side surface 1*f* of the other radiation detector RD2 even when the light reflector 47*b* is not disposed on the side surface 1*f* of the other radiation detector RD2.

Therefore, this configuration tends to achieve high time resolution in the case where the plurality of radiation detectors RD2 are provided.

In the configuration in which the radiation detector RD2 includes the base 40*a*, the light reflector 47*a* is disposed such that the semiconductor substrate 11*a* and the base 40*a* are positioned between the light reflector 47*a* and the scintillator 1. In the configuration in which the radiation detector RD2 includes the base 40*b*, the light reflector 47*b* is disposed such that the semiconductor substrate 11*b* and the base 40*b* are positioned between the light reflector 47*b* and the scintillator 1.

In the radiation detector RD2, the wiring member 30*a* is disposed on the same side as the scintillator 1 relative to the semiconductor substrate 11*a*. The wiring member 30*b* is disposed on the same side as the scintillator 1 relative to the semiconductor substrate 11*b*.

In this configuration, the radiation detector RD2 does not have to include the substrate for connecting the wiring members 30*a* and 30*b* to the electrodes 17 and 18 through, for example, die bonding. Therefore, the configuration in which the wiring members 30*a* and 30*b* are disposed on the same side as the scintillator 1 relative to the semiconductor substrates 11*a* and 11*b*, respectively, more reliably simplifies the configuration of the radiation detector RD2. This configuration improves the space efficiency of the radiation detector RD2 as compared with a configuration in which the wiring members 30*a* and 30*b* are disposed on the opposite side of the scintillator 1 relative to the semiconductor substrates 11*a* and 11*b*.

In the radiation detector RD2, at least the part of the wiring member 30*a* and the scintillator 1 are disposed in front of the same surface of the semiconductor substrate 11*a*. That is, at least the part of the wiring member 30*b* and the scintillator 1 are disposed in front of the same surface of the semiconductor substrate 11*b*, for example.

In this configuration, for example, the space efficiency of the radiation detector RD2 is improved as compared with a configuration in which at least the part of each of the wiring members 30*a* and 30*b* and the scintillator 1 are disposed in front of the other surface of each of the semiconductor substrates 11*a* and 11*b*.

In the radiation detector RD2, at least the part of the wiring member 30*a* and the scintillator 1 are disposed in front of the same surface of the base 40*a*. At least the part of the wiring member 30*b* and the scintillator 1 are disposed in front of the same surface of the base 40*b*, for example.

In this configuration, for example, the wiring members 30a and 30b are easily connected to the electrodes 17 and 18 through die bonding.

In the radiation detector RD2, the thickness of each of the light reflector 47a and the light reflector 47b is 0.05 to 100 μm.

In this configuration, the configuration in which the light reflectors 47a and 47b have the above-described thickness reliably improves reflectance of the scintillation lights on the side surfaces 1d and 1f. Therefore, this configuration reliably simplifies the configuration of the radiation detector RD2.

In the radiation detector RD2, the wiring members 30a and 30b, the semiconductor substrate 11a, and the semiconductor substrate 11b have flexibility. The flexibility of the wiring member 30a is higher than the flexibility of the semiconductor substrate 11a. The flexibility of the wiring member 30b is higher than the flexibility of the semiconductor substrate 11b.

In this configuration, the vibration of the wiring members 30a and 30b tends not to be transmitted to the semiconductor substrates 11a and 11b. Forces from the wiring members 30a and 30b tend not to be applied to the semiconductor substrates 11a and 11b, and the semiconductor substrates 11a and 11b tend not to be physically damaged. Therefore, the configuration in which the flexibility of the wiring members 30a and 30b is higher than the flexibility of the semiconductor substrates 11a and 11b reliably improves the mechanical strength of the radiation detector RD2.

Third Embodiment

Figure 27:
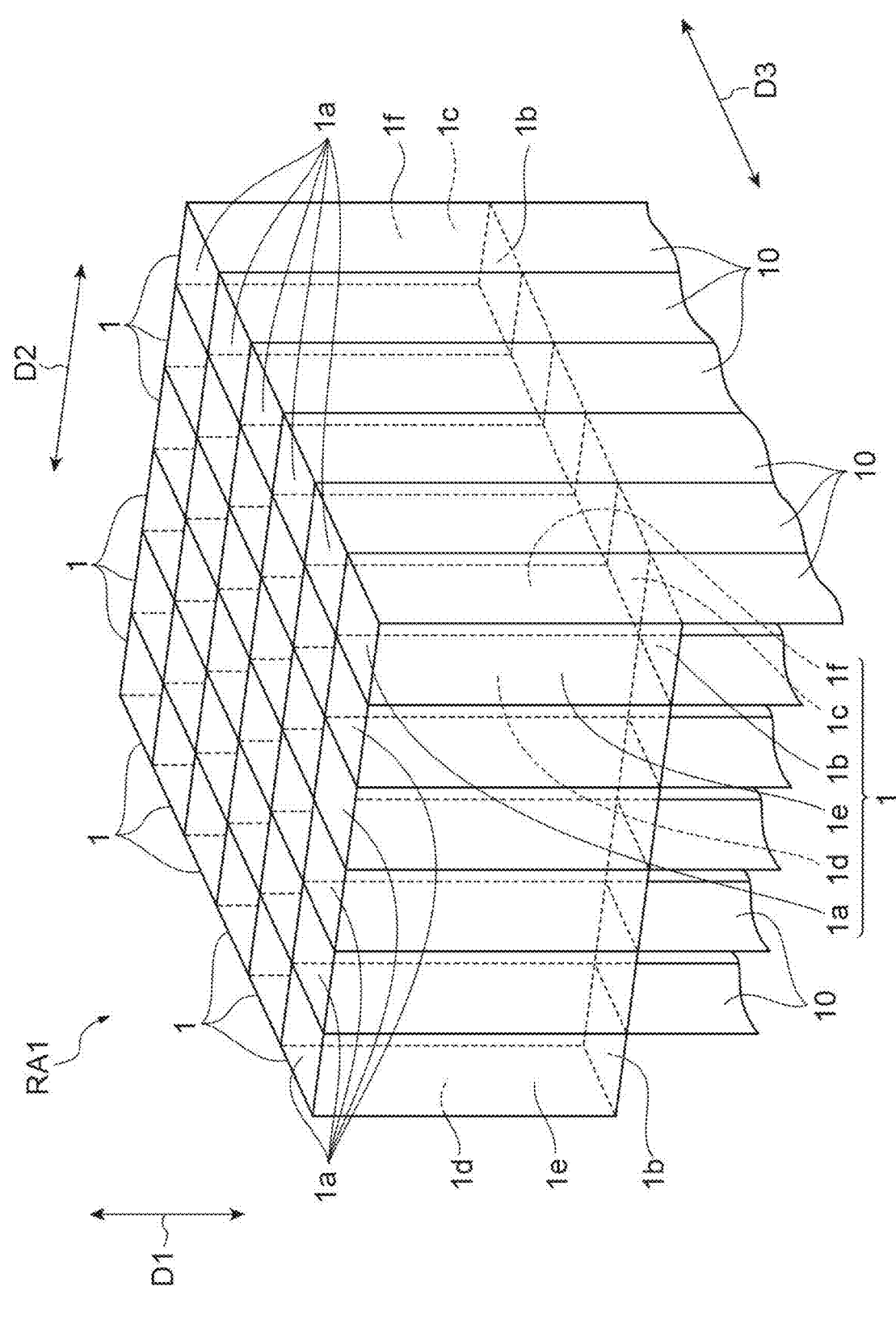
FIG. 27 is a perspective view illustrating a radiation detector array according to a third embodiment.

A configuration of a radiation detector array RA1 according to a third embodiment will be described with reference to FIG. 27. FIG. 27 is a perspective view illustrating the radiation detector array RA1 according to the third embodiment. In the radiation detector array RA1, a plurality of radiation detectors RD1 according to the first embodiment are two-dimensionally disposed in a matrix.

The plurality of radiation detectors RD1 are individually disposed, for example, in the second direction D2 and are further disposed in the third direction D3. In the example illustrated in FIG. 27, six radiation detectors RD1 according to the first embodiment are disposed in the second direction D2, and six radiation detectors RD1 are also disposed in the third direction D3. The radiation detector array RA1 includes, for example, a total of 36 radiation detectors RD1.

The end surface 1a of one radiation detector RD1 is, for example, flush with the end surface 1a of another radiation detector RD1 adjacent thereto in the second direction D2 or the third direction D3. The semiconductor photodetector 10 of the one radiation detector RD1 is disposed with the semiconductor photodetector 10 of the other radiation detector RD1 adjacent thereto in the third direction D3. The semiconductor photodetectors 10 adjacent to each other in the third direction D3 are, for example, integrally formed with each other. The semiconductor photodetectors 10 adjacent to each other in the third direction D3 may not be integrally formed with each other.

The radiation detector array RA1 may be configured to include the radiation detectors RD1 according to any one of the first to seventh modification examples of the first embodiment, in addition to the radiation detectors RD1 according to the first embodiment. Also in this case, the semiconductor photodetector 10 of the one radiation detector RD1 is disposed with the semiconductor photodetector 10 of the other radiation detector RD1 adjacent thereto in the third direction D3. The semiconductor photodetectors 10 adjacent to each other in the third direction D3 are, for example, integrally formed with each other. The semiconductor photodetectors 10 adjacent to each other in the third direction D3 may not be integrally formed with each other.

As described above, the radiation detector array RA1 includes the plurality of radiation detectors RD1 two-dimensionally disposed a matrix when viewed in the first direction D1. Each of the plurality of radiation detectors RD1 is the radiation detector RD1. The semiconductor photodetector 10 of the one radiation detector RD1 is disposed with the semiconductor photodetector 10 of the other radiation detector RD1 adjacent thereto in the direction parallel to the side surface 1c. In the present embodiment, the direction parallel to the side surface 1c is the third direction D3.

In the present embodiment, the radiation detector array RA1 in which the radiation detectors RD1 having high time resolution are two-dimensionally disposed in the matrix is achieved.

The radiation detector array RA1 has, for example, a configuration in which the light reflector 47 of one radiation detector RD1 and the side surface 1d of another radiation detector RD1 oppose each other in the second direction D2. This configuration improves reflectance of the scintillation lights from the side surface 1d of the other radiation detector RD1, even when the light reflector 47 is not disposed on the side surface 1d of the other radiation detector RD1. The configuration in which the light reflector 47 is not disposed on the side surface 1d of the other radiation detector RD1 decreases the gap between the radiation detectors RD1 in the second direction D2 in the radiation detector array RA1.

In the radiation detector array RA1, the semiconductor photodetectors 10 adjacent to each other in the direction parallel to the side surface 1c, that is, in the third direction D3, are integrally formed with each other.

In this configuration, when the radiation detector array RA1 in which the plurality of radiation detectors RD1 are two-dimensionally disposed in the matrix is produced, forming the semiconductor photodetectors 10 is simplified.

Fourth Embodiment

Figure 28:
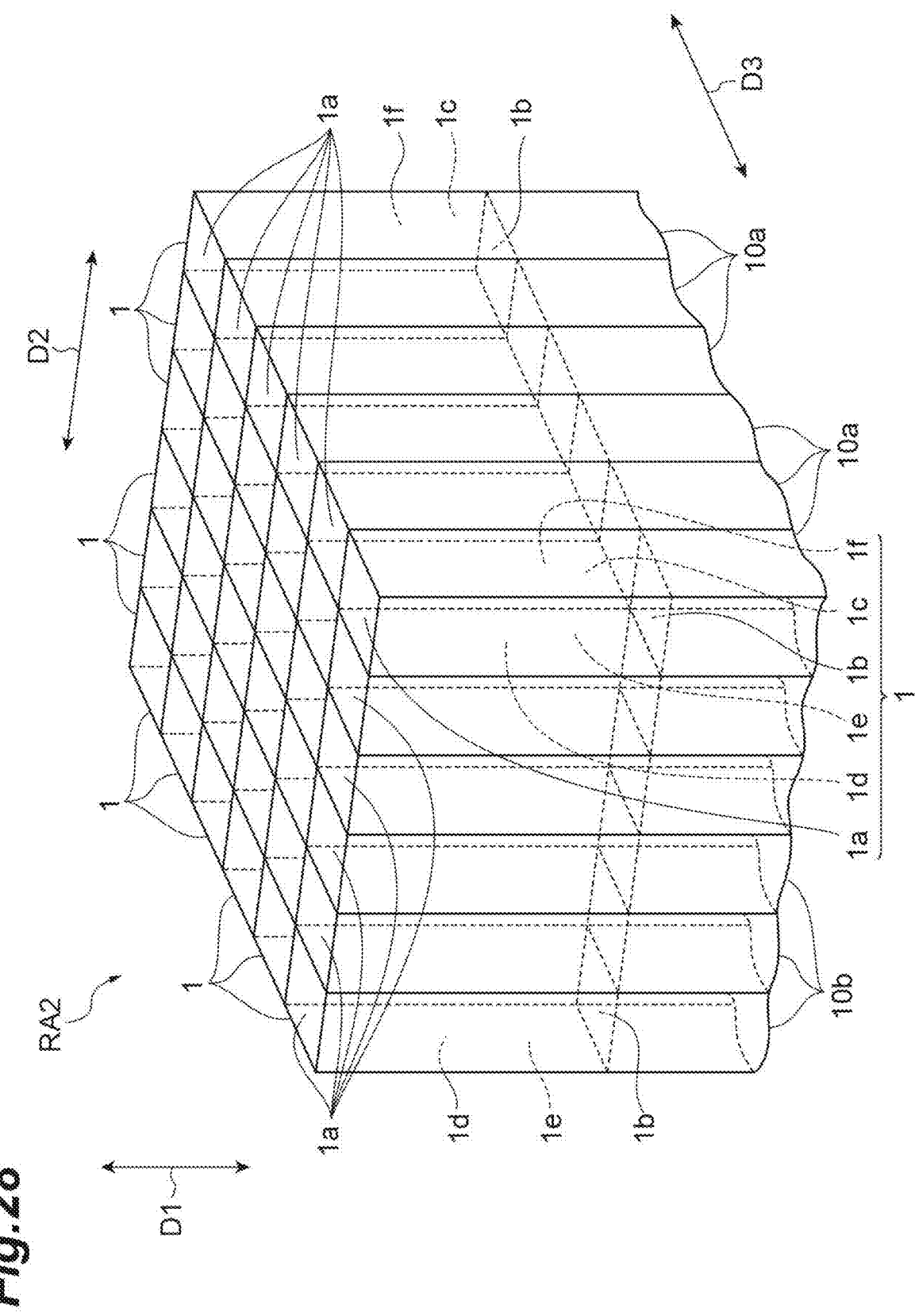
FIG. 28 is a perspective view illustrating a radiation detector array according to a fourth embodiment.

A configuration of a radiation detector array RA2 according to a fourth embodiment will be described with reference to FIG. 28. FIG. 28 is a perspective view illustrating the radiation detector array RA2 according to the fourth embodiment. In the radiation detector array RA2, the plurality of radiation detectors RD2 according to the second embodiment are two-dimensionally disposed in a matrix.

The plurality of radiation detectors RD2 are individually disposed, for example, in the second direction D2 and are further disposed in the third direction D3. In the example illustrated in FIG. 28, six radiation detectors RD2 according to the second embodiment are disposed in the second direction D2, and six radiation detectors RD2 are also disposed in the third direction D3. The radiation detector array RA2 includes, for example, a total of 36 radiation detectors RD2.

The end surface 1a of one radiation detector RD2 is, for example, flush with the end surface 1a of another radiation detector RD2 adjacent thereto in the second direction D2 or the third direction D3. The semiconductor photodetector 10a of the one radiation detector RD2 is disposed with the semiconductor photodetector 10a of the other radiation detector RD2 adjacent thereto in the third direction D3. The semiconductor photodetector 10b of the one radiation detector RD2 is disposed with the semiconductor photodetector 10b of the other radiation detector RD2 adjacent thereto in the second direction D2. The semiconductor photodetectors 10a adjacent to each other in the third direction D3 are, for example, integrally formed with each other. The semiconductor photodetectors 10b adjacent to each other in the second direction D2 are, for example, integrally formed with each other. The semiconductor photodetectors 10a adjacent to each other in the third direction D3 may not be integrally formed with each other. The semiconductor photodetectors 10b adjacent to each other in the second direction D2 may not be integrally formed with each other.

The radiation detector array RA2 may be configured to include the radiation detectors RD2 according to any one of the first to third modification examples of the second embodiment, in addition to the radiation detectors RD2 according to the second embodiment. Also in this case, the semiconductor photodetector 10a of one radiation detector RD2 is disposed with the semiconductor photodetector 10a of another radiation detector RD2 adjacent thereto in the third direction D3. The semiconductor photodetector 10b of the one radiation detector RD2 is disposed with the semiconductor photodetector 10b of the other radiation detector RD2 adjacent thereto in the second direction D2. The semiconductor photodetectors 10a adjacent to each other in the third direction D3 are, for example, integrally formed with each other. The semiconductor photodetectors 10b adjacent to each other in the second direction D2 are, for example, integrally formed with each other. The semiconductor photodetectors 10a adjacent to each other in the third direction D3 may not be integrally formed with each other. The semiconductor photodetectors 10b adjacent to each other in the second direction D2 may not be integrally formed with each other.

As described above, the radiation detector array RA2 includes the plurality of radiation detectors RD2 two-dimensionally disposed in the matrix when viewed in first direction D1. Each of the plurality of radiation detectors RD2 is the radiation detector RD2. The semiconductor photodetector 10a of one radiation detector RD2 is disposed with the semiconductor photodetector 10a of another radiation detector RD2 adjacent thereto in the third direction D3. The semiconductor photodetector 10b of one radiation detector RD2 is disposed with the semiconductor photodetector 10b of another radiation detector RD2 adjacent thereto in the second direction D2.

In the present embodiment, the radiation detector array RA2 in which the radiation detectors RD2 having high time resolution are two-dimensionally disposed in the matrix is achieved.

The radiation detector array RA2 has, for example, a configuration in which the light reflector 47a of one radiation detector RD2 and the side surface 1d of another radiation detector RD2 oppose each other in the second direction D2. This configuration improves reflectance of the scintillation lights from the side surface 1d of the other radiation detector RD2, even in the case where the light reflector 47a is not disposed on the side surface 1d of the other radiation detector RD2. The configuration in which the light reflector 47a is not disposed on the side surface 1d of the other radiation detector RD2 decreases the gap between the radiation detectors RD2 in the second direction D2 in the radiation detector array RA2.

The radiation detector array RA2 has, for example, a configuration in which the light reflector 47b of one radiation detector RD2 and the side surface 1f of another radiation detector RD2 oppose each other in the third direction D3. This configuration improves reflectance of the scintillation lights from the side surface 1f of the other radiation detector RD2, even in the case where the light reflector 47b is not disposed on the side surface 1f of the other radiation detector RD2. The configuration in which the light reflector 47b is not disposed on the side surface 1f of the other radiation detector RD2 decreases the gap between the radiation detectors RD2 in the third direction D3 in the radiation detector array RA2.

In the radiation detector array RA2, the semiconductor photodetectors 10a adjacent to each other in the third direction D3 are integrally formed with each other.

In this configuration, when the radiation detector array RA2 in which the plurality of radiation detectors RD2 are two-dimensionally disposed in the matrix is produced, forming the semiconductor photodetectors 10a is simplified.

In the radiation detector array RA2, the semiconductor photodetectors 10b adjacent to each other in the second direction D2 are integrally formed with each other.

In this configuration, when the radiation detector array RA2 in which the plurality of radiation detectors RD2 are two-dimensionally disposed in the matrix is produced, forming the semiconductor photodetectors 10b is simplified.

The embodiments and modification examples of the present invention have been described; however, the present invention is not absolutely limited to the above-described embodiments and modification examples and can be variously modified without departing from the gist of the present invention.

In the radiation detectors RD1 and RD2, when viewed in the second direction D2, the photodetection region 23 may have the outline shape corresponding to the outline shape of the side surface 1c or 1e. In the configuration in which the photodetection region 23 has the outline shape corresponding to the outline shape of the side surface 1c or 1e, as described above, the photodetection region 23 tends not to be disposed at the position of the semiconductor substrate 11, 11a, or 11b where no scintillation lights can be detected. Therefore, this configuration suppresses increase in dark count and capacitance in the photodetection region 23. As a result, this configuration reliably improves the time resolution of the radiation detectors RD1 and RD2.

The radiation detectors RD1 and RD2 may not include the base 40, 40a, or 40b. The configuration in which the radiation detectors RD1 and RD2 include the base 40, 40a, or 40b increases the mechanical strength of the semiconductor substrate 11, 11a, or 11b as described above. Therefore, the radiation detectors RD1 and RD2 reliably achieve the semiconductor photodetector 10, 10a, or 10b having the high mechanical strength.

The radiation detectors RD1 and RD2 may not include the resin 45. The configuration in which the radiation detectors RD1 and RD2 include the resin 45 protects the wires 43 and 44 from damage as described above. Therefore, the radiation detectors RD1 and RD2 reliably achieve the semiconductor photodetector 10, 10a, or 10b having higher mechanical strength.

The radiation detectors RD1 and RD2 may not include the light reflector 47, 47a, or 47b.

In the configuration in which the radiation detectors RD1 include the light reflectors 47, respectively, as described above, the radiation detector array RA1 has, for example, the configuration in which the light reflector 47 of one radiation detector RD1 and the side surface 1d of another radiation detector RD1 oppose each other in the second direction D2. This configuration improves reflectance of the scintillation lights from the side surface 1d of the other radiation detector RD1, even when the light reflector 47 is not disposed on the side surface 1d of the other radiation detector RD1. The configuration in which the light reflector 47 is not disposed on the side surface 1*d* of the other radiation detector RD1 decreases the gap between the radiation detectors RD1 in the second direction D2 in the radiation detector array RA1.

In the configuration in which the radiation detectors RD2 include the light reflectors 47*a*, respectively, as described above, the radiation detector array RA2 has, for example, the configuration in which the light reflector 47*a* of one radiation detector RD2 and the side surface 1*d* of another radiation detector RD2 oppose each other in the second direction D2. This configuration improves reflectance of the scintillation lights from the side surface 1*d* of the other radiation detector RD2, even in the case where the light reflector 47*a* is not disposed on the side surface 1*d* of the other radiation detector RD2. The configuration in which the light reflector 47*a* is not disposed on the side surface 1*d* of the other radiation detector RD2 decreases the gap between the radiation detectors RD2 in the second direction D2 in the radiation detector array RA2.

In the configuration in which the radiation detectors RD2 include the light reflectors 47*b*, respectively, as described above, the radiation detector array RA2 has, for example, the configuration in which the light reflector 47*b* of one radiation detector RD2 and the side surface 1*f* of another radiation detector RD2 oppose each other in the third direction D3. This configuration improves reflectance of the scintillation lights from the side surface 1*f* of the other radiation detector RD2, even in the case where the light reflector 47*b* is not disposed on the side surface 1*f* of the other radiation detector RD2. The configuration in which the light reflector 47*b* is not disposed on the side surface 1*f* of the other radiation detector RD2 decreases the gap between the radiation detectors RD2 in the third direction D3 in the radiation detector array RA2.

The wiring member 30, 30*a*, or 30*b* may not be disposed on the same side as the scintillator 1 relative to the semiconductor substrate 11, 11*a*, or 11*b*. In the configuration in which the wiring member 30, 30*a*, or 30*b* is disposed on the same side as the scintillator 1 relative to the semiconductor substrate 11, 11*a*, or 11*b*, as described above, the substrate for connecting the wiring member 30, 30*a*, or 30*b* to the electrodes 17 and 18 through, for example, die bonding does not need to be provided. Therefore, this configuration more reliably simplifies the configurations of the radiation detectors RD1 and RD2.

The flexibility of the wiring members 30, 30*a*, and 30*b* may not be higher than the flexibility of the semiconductor substrates 11, 11*a*, and 11*b*. In the configuration in which the flexibility of the wiring members 30, 30*a*, and 30*b* is higher than the flexibility of the semiconductor substrates 11, 11*a*, and 11*b*, as described above, the vibration of the wiring members 30, 30*a*, and 30*b* tends not to be transmitted to the semiconductor substrates 11, 11*a*, and 11*b*. Therefore, this configuration reliably improves the mechanical strength of the radiation detectors RD1 and RD2.

REFERENCE SIGNS LIST 1 scintillator
1*a*, 1*b* end surface
1*c* side surface
10, 10*a*, 10*b* semiconductor photodetector
11, 11*a*, 11*b* semiconductor substrate
12 avalanche photodiode
13 quenching resistor
14*a*, 14*b* conductive wire
17, 18 electrode 21, 22 portion
23 photodetection region
30, 30*a*, 30*b* wiring member
41, 42 terminal
43, 44 wire
45 resin
47, 47*a*, 47*b* light reflector
51, 52 portion
D1 first direction
D2 second direction
D3 third direction
RA1, RA2 radiation detector array
RD1, RD2 radiation detector.

The invention claimed is:

1. A radiation detector comprising:
a scintillator including a pair of end surfaces opposing each other in a first direction and one side surface coupling the pair of end surfaces;
a semiconductor photodetector including a semiconductor substrate disposed to oppose the one side surface; and
a wiring member electrically connected to the semiconductor photodetector, wherein
a length of the scintillator in the first direction is longer than a length of the scintillator in a second direction orthogonal to the one side surface,
a length of the one side surface in the first direction is longer than a width of the one side surface in a third direction orthogonal to the first direction and the second direction,
the semiconductor substrate includes a first portion covered with the one side surface and a second portion exposed from the one side surface,
the first portion and the second portion are disposed in the first direction,
the semiconductor photodetector includes a photodetection region disposed in the first portion, and a first electrode and a second electrode disposed in the second portion,
the photodetection region includes a plurality of avalanche photodiodes arranged to operate in Geiger mode and a plurality of quenching resistors electrically connected in series with one of an anode or a cathode of a corresponding avalanche photodiode of the plurality of avalanche photodiodes,
the plurality of quenching resistors are connected in parallel with the first electrode,
another of the anode or the cathode of each of the plurality of avalanche photodiodes is connected in parallel with the second electrode, and
the wiring member includes a conductor electrically connected to the first electrode and a conductor connected to the second electrode.

2. The radiation detector according to claim 1, wherein the scintillator has a rectangular shape or a triangular shape when viewed in the first direction.

3. The radiation detector according to claim 1, wherein the pair of end surfaces includes one end surface inclined relative to the second direction.

4. The radiation detector according to claim 1, wherein the pair of end surfaces includes one end surface extending in the second direction, and the one end surface has a triangular wave shape in a cross section.

5. The radiation detector according to claim 1, wherein the pair of end surfaces includes one end surface extending in the second direction, and the one end surface includes a rough surface.

6. The radiation detector according to claim 1, wherein
the scintillator includes another side surface having a triangular wave shape in a cross section, and
the other side surface couples the pair of end surfaces and is adjacent to the one side surface.

7. The radiation detector according to claim 1, wherein
the scintillator includes another side surface that includes a rough surface, and
the other side surface couples the pair of end surfaces and is adjacent to the one side surface.

8. The radiation detector according to claim 1, wherein
when viewed in the second direction, the photodetection region has an outline shape corresponding to an outline shape of the one side surface.

9. The radiation detector according to claim 1, further comprising:
a base; and a first wire and a second wire, wherein
the base is disposed such that the semiconductor substrate is positioned between the base and the scintillator and includes a third portion covered with the semiconductor substrate and a fourth portion exposed from the semiconductor substrate,
the third portion and the fourth portion are disposed in the first direction,
the fourth portion includes a first terminal and a second terminal,
the first terminal and the second terminal and the scintillator are disposed in front of the same surface of the base, and
the first terminal is electrically connected to the first electrode by the first wire, and the second terminal is electrically connected to the second electrode by the second wire.

10. The radiation detector according to claim 9, further comprising
a resin covering the first wire and the second wire.

11. The radiation detector according to claim 9, further comprising
a light reflector, wherein
the light reflector is disposed such that the semiconductor substrate and base are positioned between the light reflector and the scintillator.

12. The radiation detector according to claim 9, wherein
at least a part of the wiring member and the scintillator are disposed in front of the same surface of the base.

13. The radiation detector according to claim 1, further comprising
a light reflector, wherein
the light reflector is disposed such that the semiconductor substrate is positioned between the light reflector and the scintillator.

14. The radiation detector according to claim 13, wherein
the light reflector has a thickness of 0.05 to 100 μm.

15. The radiation detector according to claim 1, wherein
the wiring member is disposed on the same side surface as the scintillator relative to the semiconductor substrate.

16. The radiation detector according to claim 1, wherein
at least a part of the wiring member and the scintillator are disposed in front of the same surface of the semiconductor substrate.

17. The radiation detector according to claim 1, wherein
the wiring member and the semiconductor substrate have flexibility, and
the flexibility of the wiring member is higher than the flexibility of the semiconductor substrate.

18. A radiation detector array comprising
a plurality of radiation detectors two-dimensionally disposed in a matrix when viewed in a first direction, wherein
each of the plurality of radiation detectors is the radiation detector according to claim 1, and
the semiconductor photodetector of one of the radiation detectors is disposed with the semiconductor photodetector of another one of the radiation detectors adjacent to the one of the radiation detectors in a direction parallel to the one side surface.

19. The radiation detector array according to claim 18, wherein
the semiconductor photodetectors adjacent to each other in the direction parallel to the one side surface are integrally formed with each other.

20. A radiation detector comprising:
a scintillator including a pair of end surfaces opposing each other in a first direction, a first side surface coupling the pair of end surfaces, and a second side surface coupling the pair of end surfaces and being adjacent to the first side surface;
a first semiconductor photodetector including a first semiconductor substrate disposed to oppose the first side surface;
a second semiconductor photodetector including a second semiconductor substrate disposed to oppose the second side surface;
a first wiring member electrically connected to the first semiconductor photodetector; and
a second wiring member electrically connected to the second semiconductor photodetector, wherein
the scintillator has a rectangular shape when viewed in the first direction,
a length of the scintillator in the first direction is longer than both of a length of the scintillator in a second direction orthogonal to the first side surface and a length of the scintillator in a third direction orthogonal to the second side surface,
a length of the first side surface in the first direction is longer than a width of the first side surface in the third direction,
a length of the second side surface in the first direction is longer than a width of the second side surface in the second direction,
each of the first semiconductor substrate and the second semiconductor substrate includes a first portion covered with a corresponding side surface of the first side surface and the second side surface and a second portion exposed from the corresponding side surface,
the first portion and the second portion are disposed in the first direction,
each of the first semiconductor photodetector and the second semiconductor photodetector includes a photodetection region disposed in the first portion, and a first electrode and a second electrode disposed in the second portion,
each of the photodetection regions includes a plurality of avalanche photodiodes arranged to operate in Geiger mode and a plurality of quenching resistors electrically connected in series with one of an anode or a cathode of a corresponding avalanche photodiode of the plurality of avalanche photodiodes,
the plurality of quenching resistors are connected in parallel with the first electrode,
another of the anode or the cathode of each of the plurality of avalanche photodiodes is electrically connected in parallel with the second electrode, and each of the first wiring member and the second wiring member includes a conductor electrically connected to the first electrode and a conductor connected to the second electrode.

21. The radiation detector according to claim 20, wherein the pair of end surfaces includes one end surface inclined relative to the second direction.

22. The radiation detector according to claim 20, wherein the pair of end surfaces includes one end surface extending in the second direction, and the one end surface has a triangular wave shape in a cross section.

23. The radiation detector according to claim 20, wherein the pair of end surfaces includes one end surface extending in the second direction, and the one end surface includes a rough surface.

24. The radiation detector according to claim 20, wherein when viewed in the second direction, the photodetection region of the first semiconductor substrate has an outline shape corresponding to an outline shape of the first side surface, and when viewed in the third direction, the photodetection region of the second semiconductor substrate has an outline shape corresponding to an outline shape of the second side surface.

25. The radiation detector according to claim 20, further comprising:

a first base and a second base; and a first wire and a second wire, wherein the first base is disposed such that the first semiconductor substrate is positioned between the first base and the scintillator, the second base is disposed such that the second semiconductor substrate is positioned between the second base and the scintillator, the first base includes a third portion covered with the first semiconductor substrate and a fourth portion exposed from the first semiconductor substrate, and the second base includes a third portion covered with the second semiconductor substrate and a fourth portion exposed from the second semiconductor substrate, the third portion and the fourth portion are disposed in the first direction, each of the fourth portions includes a first terminal and a second terminal, the first terminal and the scintillator are disposed in front of the same surface of the first base, and the second terminal and the scintillator are disposed in front of the same surface of the second base, and the first terminal is electrically connected to the first electrode by the first wire, and the second terminal is electrically connected to the second electrode by the second wire.

26. The radiation detector according to claim 25, further comprising a resin covering the first wire and the second wire.

27. The radiation detector according to claim 25, further comprising:

a first light reflector; and a second light reflector, wherein the first light reflector is disposed such that the first semiconductor substrate and the first base are positioned between the first light reflector and the scintillator, and the second light reflector is disposed such that the second semiconductor substrate and the second base are positioned between the second light reflector and the scintillator.

28. The radiation detector according to claim 25, wherein at least a part of the first wiring member and the scintillator are disposed in front of the same surface of the first base, and at least a part of the second wiring member and the scintillator are disposed in front of the same surface of the second base.

29. The radiation detector according to claim 20, further comprising:

a first light reflector; and a second light reflector, wherein the first light reflector is disposed such that the first semiconductor substrate is positioned between the first light reflector and the scintillator, and the second light reflector is disposed such that the second semiconductor substrate is positioned between the second light reflector and the scintillator.

30. The radiation detector according to claim 29, wherein the first light reflector and the second light reflector have a thickness of 0.05 to 100 μm.

31. The radiation detector according to claim 20, wherein the first wiring member is disposed on the same side surface as the scintillator relative to the first semiconductor substrate, and the second wiring member is disposed on the same side surface as the scintillator relative to the second semiconductor substrate.

32. The radiation detector according to claim 20, wherein at least a part of the first wiring member and the scintillator are disposed in front of the same surface of the first semiconductor substrate, and at least a part of the second wiring member and the scintillator are disposed in front of the same surface of the second semiconductor substrate.

33. The radiation detector according to claim 20, wherein the first wiring member, the second wiring member, the first semiconductor substrate, and the second semiconductor substrate have flexibility, the flexibility of the first wiring member is higher than the flexibility of the first semiconductor substrate, and the flexibility of the second wiring member is higher than the flexibility of the second semiconductor substrate.

34. A radiation detector array comprising a plurality of radiation detectors two-dimensionally disposed in a matrix when viewed in a first direction, wherein each of the plurality of radiation detectors is the radiation detector according to claim 20, the first semiconductor photodetector of one of the radiation detectors is disposed with the first semiconductor photodetector of another one of the radiation detectors adjacent in the third direction, and the second semiconductor photodetector of the one radiation detector is disposed with the second semiconductor photodetector of the other one of the radiation detectors adjacent in the second direction.

35. The radiation detector array according to claim 34, wherein the first semiconductor photodetectors adjacent to each other in the third direction are integrally formed with each other.

36. The radiation detector array according to claim 34, wherein the second semiconductor photodetectors adjacent to each other in the second direction are integrally formed with each other.

* * * * *